United States Patent
Duong et al.

(10) Patent No.: US 9,086,211 B2
(45) Date of Patent: *Jul. 21, 2015

(54) SYSTEM AND METHOD FOR COLOR MIXING LENS ARRAY

(71) Applicant: Illumitex, Inc., Austin, TX (US)

(72) Inventors: Dung T. Duong, Bee Cave, TX (US); Hyunchul Ko, Austin, TX (US); Randall E. Johnson, Austin, TX (US); Paul N. Winberg, Hot Springs Village, AR (US); Emil Radkov, Kyle, TX (US)

(73) Assignee: Illumitex, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/057,768

(22) Filed: Oct. 18, 2013

(65) Prior Publication Data

US 2014/0104832 A1  Apr. 17, 2014

Related U.S. Application Data

(63) Continuation of application No. 13/077,594, filed on Mar. 31, 2011, now Pat. No. 8,585,253, which is a continuation-in-part of application No. 12/646,570, filed on Dec. 23, 2009, now Pat. No. 8,449,128.

(60) Provisional application No. 61/319,739, filed on Mar. 31, 2010, provisional application No. 61/235,491, filed on Aug. 20, 2009.

(51) Int. Cl.
*F21V 23/04* (2006.01)
*F21V 13/04* (2006.01)
(Continued)

(52) U.S. Cl.
CPC ............... *F21V 13/04* (2013.01); *A01G 7/045* (2013.01); *C09K 11/0883* (2013.01);
(Continued)

(58) Field of Classification Search
USPC .................. 362/311.02, 237, 244, 249.02
See application file for complete search history.

(56) References Cited

U.S. PATENT DOCUMENTS

| 1,670,837 A | 5/1828 | Blackmore |
| 3,981,023 A | 9/1976 | King |

(Continued)

FOREIGN PATENT DOCUMENTS

| EP | 0534843 A1 | 3/1993 |
| EP | 1380469 A2 | 1/2004 |

(Continued)

OTHER PUBLICATIONS

Office Action (with English translation) for Taiwanese Patent Application No. 098104084, dated Jan. 8, 2014, Intellectual Property Office, 12 pgs.

(Continued)

*Primary Examiner* — Laura Tso
(74) *Attorney, Agent, or Firm* — Sprinkle IP Law Group

(57) ABSTRACT

Embodiments described herein provide optical systems that can mix colors to produce illumination patterns having a large area with uniform color. One embodiment of an optical system can include a set of optical units that each produces an illumination pattern with uniform color and intensity. The optical units are spaced so that the individual illumination patterns overlap to create an overall illumination pattern with an overlap area. In the overlap area, the colors emitted by the individual optical units mix to create a desired color. Embodiments of optical systems can provide beam control so that the optical units emit a high percentage of light in beam.

17 Claims, 26 Drawing Sheets

(51) Int. Cl.
  *A01G 7/04* (2006.01)
  *C09K 11/08* (2006.01)
  *C09K 11/77* (2006.01)
  *F21K 99/00* (2010.01)
  *F21V 5/00* (2015.01)
  *F21V 5/04* (2006.01)
  *F21V 7/00* (2006.01)
  *G02B 3/00* (2006.01)
  *F21V 13/02* (2006.01)
  *F21Y 101/02* (2006.01)
  *F21Y 105/00* (2006.01)
  *F21Y 113/00* (2006.01)
  *H01L 33/58* (2010.01)

(52) U.S. Cl.
  CPC ........ *C09K 11/7734* (2013.01); *C09K 11/7774* (2013.01); *F21K 9/56* (2013.01); *F21V 5/007* (2013.01); *F21V 5/04* (2013.01); *F21V 7/0091* (2013.01); *F21V 13/02* (2013.01); *G02B 3/0056* (2013.01); *F21Y 2101/02* (2013.01); *F21Y 2105/003* (2013.01); *F21Y 2113/005* (2013.01); *H01L 33/58* (2013.01)

(56) References Cited

U.S. PATENT DOCUMENTS

| | | |
|---|---|---|
| 3,988,633 A | 10/1976 | Shurgan et al. |
| 4,125,890 A | 11/1978 | Nixon, Jr. |
| 4,180,755 A | 12/1979 | Nixon, Jr. |
| 4,239,369 A | 12/1980 | English et al. |
| 4,304,479 A | 12/1981 | Van Allen |
| 4,388,633 A | 6/1983 | Vasudev |
| 4,439,910 A | 4/1984 | Vasudev |
| 4,486,364 A | 12/1984 | Takahashi |
| 4,501,637 A | 2/1985 | Mitchell et al. |
| 4,716,507 A | 12/1987 | Ames |
| 4,728,999 A | 3/1988 | Dannatt et al. |
| 4,740,259 A | 4/1988 | Heinen |
| 4,799,136 A | 1/1989 | Molnar |
| 4,841,344 A | 6/1989 | Heinen |
| 4,966,862 A | 10/1990 | Edmond |
| 5,036,339 A | 7/1991 | Hediger |
| 5,087,949 A | 2/1992 | Haitz |
| 5,114,513 A | 5/1992 | Hosokawa |
| 5,126,929 A | 6/1992 | Cheselske |
| 5,151,718 A | 9/1992 | Nelson |
| 5,174,649 A | 12/1992 | Alston |
| 5,218,216 A | 6/1993 | Manabe et al. |
| 5,233,204 A | 8/1993 | Fletcher et al. |
| 5,251,117 A | 10/1993 | Nagai |
| 5,272,108 A | 12/1993 | Kozawa et al. |
| 5,278,433 A | 1/1994 | Manabe et al. |
| 5,281,830 A | 1/1994 | Kotaki et al. |
| 5,315,490 A | 5/1994 | Bastable |
| 5,369,289 A | 11/1994 | Tamaki et al. |
| 5,523,591 A | 6/1996 | Fleming et al. |
| 5,528,720 A | 6/1996 | Winston |
| 5,563,422 A | 10/1996 | Nakamura et al. |
| 5,578,156 A | 11/1996 | Kamakura et al. |
| 5,587,593 A | 12/1996 | Koide et al. |
| 5,620,557 A | 4/1997 | Manabe et al. |
| 5,652,438 A | 7/1997 | Sassa et al. |
| 5,654,831 A | 8/1997 | Byren et al. |
| 5,667,297 A | 9/1997 | Maassen |
| 5,700,713 A | 12/1997 | Yamazaki et al. |
| 5,739,554 A | 4/1998 | Edmond et al. |
| 5,780,867 A | 7/1998 | Fritz et al. |
| 5,813,753 A | 9/1998 | Vriens et al. |
| 5,839,424 A | 11/1998 | Hauser |
| 5,846,844 A | 12/1998 | Akasaki et al. |
| 5,862,167 A | 1/1999 | Sassa et al. |
| 5,912,477 A | 6/1999 | Negley |
| 5,945,689 A | 8/1999 | Koike et al. |
| 5,953,469 A | 9/1999 | Zhou |
| 5,959,401 A | 9/1999 | Asami et al. |
| 5,998,925 A | 12/1999 | Shimizu et al. |
| 6,005,722 A | 12/1999 | Butterworth et al. |
| 6,008,539 A | 12/1999 | Shibata et al. |
| 6,023,076 A | 2/2000 | Shibata |
| 6,066,861 A | 5/2000 | Hohn et al. |
| 6,078,064 A | 6/2000 | Ming-Jiunn et al. |
| 6,093,941 A | 7/2000 | Russell |
| 6,118,908 A | 9/2000 | Bischel |
| 6,133,589 A | 10/2000 | Krames |
| 6,144,536 A | 11/2000 | Zimmerman |
| 6,169,294 B1 | 1/2001 | Biing-Jye et al. |
| 6,177,761 B1 | 1/2001 | Pelka et al. |
| 6,185,051 B1 | 2/2001 | Chen et al. |
| 6,194,742 B1 | 2/2001 | Kern et al. |
| 6,201,262 B1 | 3/2001 | Edmond et al. |
| 6,221,683 B1 | 4/2001 | Nirsche et al. |
| 6,222,207 B1 | 4/2001 | Carter-Coman et al. |
| 6,229,160 B1 | 5/2001 | Krames |
| 6,229,782 B1 | 5/2001 | Wang et al. |
| 6,257,737 B1 | 7/2001 | Marshall et al. |
| 6,258,618 B1 | 7/2001 | Lester |
| 6,271,622 B1 | 8/2001 | Coushaine et al. |
| 6,274,924 B1 | 8/2001 | Carey et al. |
| 6,287,947 B1 | 9/2001 | Ludowise et al. |
| 6,307,218 B1 | 10/2001 | Steigerwald et al. |
| 6,310,364 B1 | 10/2001 | Uemura |
| 6,323,063 B2 | 11/2001 | Krames |
| 6,331,450 B1 | 12/2001 | Uemura |
| 6,335,999 B1 | 1/2002 | Winston |
| 6,337,493 B1 | 1/2002 | Tanizawa et al. |
| D453,745 S | 2/2002 | Suenaga |
| 6,350,041 B1 | 2/2002 | Tarsa et al. |
| 6,351,069 B1 | 2/2002 | Lowery et al. |
| 6,356,700 B1 | 3/2002 | Strobl |
| 6,361,192 B1 | 3/2002 | Fussell et al. |
| 6,364,487 B1 | 4/2002 | Weber et al. |
| 6,377,535 B1 | 4/2002 | Chen et al. |
| 6,410,942 B1 | 6/2002 | Thibeault |
| 6,417,019 B1 | 7/2002 | Mueller et al. |
| 6,443,594 B1 | 9/2002 | Marshall et al. |
| 6,445,011 B1 | 9/2002 | Hirano et al. |
| 6,452,214 B2 | 9/2002 | Kaneyama et al. |
| 6,459,100 B1 | 10/2002 | Doverspike et al. |
| 6,478,453 B2 | 11/2002 | Lammers et al. |
| 6,486,499 B1 | 11/2002 | Krames et al. |
| 6,489,636 B1 | 12/2002 | Goetz et al. |
| 6,501,102 B2 | 12/2002 | Mueller-Mach et al. |
| 6,502,956 B1 | 1/2003 | Wu |
| 6,504,171 B1 | 1/2003 | Grillot et al. |
| 6,504,179 B1 | 1/2003 | Ellens et al. |
| 6,514,782 B1 | 2/2003 | Wierer, Jr. et al. |
| 6,515,313 B1 | 2/2003 | Ibbetson et al. |
| 6,526,082 B1 | 2/2003 | Corzine et al. |
| 6,526,201 B1 | 2/2003 | Mrakovich et al. |
| 6,527,411 B1 | 3/2003 | Sayers |
| 6,534,797 B1 | 3/2003 | Edmond et al. |
| 6,541,800 B2 | 4/2003 | Barnett et al. |
| 6,547,416 B2 | 4/2003 | Pashley et al. |
| 6,547,423 B2 | 4/2003 | Marshall |
| 6,563,142 B2 | 5/2003 | Shen et al. |
| 6,570,190 B2 | 5/2003 | Krames |
| 6,573,537 B1 | 6/2003 | Steigerwald et al. |
| 6,576,488 B2 | 6/2003 | Collins, III et al. |
| 6,576,932 B2 | 6/2003 | Khare et al. |
| D477,579 S | 7/2003 | Suenaga |
| D477,580 S | 7/2003 | Kamada |
| 6,598,998 B2 | 7/2003 | West |
| D478,877 S | 8/2003 | Hoshiba |
| 6,603,243 B2 | 8/2003 | Parkyn et al. |
| 6,603,258 B1 | 8/2003 | Mueller-Mach et al. |
| 6,608,330 B1 | 8/2003 | Yamada |
| 6,610,598 B2 | 8/2003 | Chen |
| 6,620,643 B1 | 9/2003 | Koike et al. |
| 6,623,142 B1 | 9/2003 | Lippmann et al. |
| 6,630,689 B2 | 10/2003 | Bhat et al. |
| 6,630,691 B1 | 10/2003 | Mueller-Mach et al. |
| 6,630,692 B2 | 10/2003 | Goetz et al. |

(56) References Cited

U.S. PATENT DOCUMENTS

| | | |
|---|---|---|
| 6,635,503 B2 | 10/2003 | Andrews et al. |
| 6,635,904 B2 | 10/2003 | Goetz et al. |
| 6,637,921 B2 | 10/2003 | Coushaine |
| 6,639,733 B2 | 10/2003 | Minano |
| D482,337 S | 11/2003 | Kamada |
| D482,666 S | 11/2003 | Kamada |
| 6,642,618 B2 | 11/2003 | Yagi et al. |
| 6,642,652 B2 | 11/2003 | Collins, III et al. |
| 6,649,440 B1 | 11/2003 | Krames et al. |
| 6,649,943 B2 | 11/2003 | Shibata et al. |
| 6,649,946 B2 | 11/2003 | Bogner et al. |
| 6,650,044 B1 | 11/2003 | Lowery |
| 6,657,236 B1 | 12/2003 | Thibeault |
| 6,657,300 B2 | 12/2003 | Goetz et al. |
| 6,664,560 B2 | 12/2003 | Emerson et al. |
| 6,671,452 B2 | 12/2003 | Winston |
| 6,679,621 B2 | 1/2004 | West et al. |
| 6,680,490 B2 | 1/2004 | Yasukawa et al. |
| 6,680,569 B2 | 1/2004 | Mueller-Mach et al. |
| 6,682,207 B2 | 1/2004 | Weber et al. |
| 6,682,331 B1 | 1/2004 | Peh |
| 6,683,327 B2 | 1/2004 | Krames et al. |
| 6,686,691 B1 | 2/2004 | Mueller et al. |
| 6,696,703 B2 | 2/2004 | Mueller-Mach et al. |
| 6,711,200 B1 | 3/2004 | Scherer |
| 6,717,353 B1 | 4/2004 | Mueller et al. |
| 6,717,355 B2 | 4/2004 | Takahashi et al. |
| D489,690 S | 5/2004 | Ishida |
| D490,387 S | 5/2004 | Yagi |
| 6,730,939 B2 | 5/2004 | Eisert et al. |
| 6,730,940 B1 | 5/2004 | Steranka |
| 6,734,467 B2 | 5/2004 | Schlereth et al. |
| 6,737,681 B2 | 5/2004 | Koda |
| 6,738,175 B2 | 5/2004 | Morita et al. |
| 6,740,906 B2 | 5/2004 | Slater, Jr. et al. |
| D490,782 S | 6/2004 | Suenaga |
| D490,784 S | 6/2004 | Ishida |
| D491,538 S | 6/2004 | Ishida |
| D491,899 S | 6/2004 | Yagi |
| 6,744,071 B2 | 6/2004 | Sano et al. |
| 6,744,077 B2 | 6/2004 | Trottier et al. |
| 6,746,124 B2 | 6/2004 | Fischer et al. |
| 6,746,295 B2 | 6/2004 | Sorg |
| 6,747,298 B2 | 6/2004 | Slater, Jr. et al. |
| 6,759,803 B2 | 7/2004 | Sorg |
| 6,764,932 B2 | 7/2004 | Kong et al. |
| 6,768,136 B2 | 7/2004 | Eisert et al. |
| 6,768,525 B2 | 7/2004 | Paolini |
| 6,774,405 B2 | 8/2004 | Yasukawa et al. |
| 6,777,871 B2 | 8/2004 | Duggal |
| 6,784,027 B2 | 8/2004 | Struebel et al. |
| D495,822 S | 9/2004 | Yoneda |
| D496,007 S | 9/2004 | Hoshiba |
| 6,791,103 B2 | 9/2004 | Nakamura et al. |
| 6,791,116 B2 | 9/2004 | Takahashi et al. |
| 6,791,119 B2 | 9/2004 | Slater |
| 6,794,211 B2 | 9/2004 | Oh |
| 6,794,684 B2 | 9/2004 | Slater, Jr. et al. |
| 6,794,690 B2 | 9/2004 | Uemura |
| D497,349 S | 10/2004 | Hoshiba |
| 6,800,500 B2 | 10/2004 | Coman |
| 6,800,876 B2 | 10/2004 | Edmond et al. |
| 6,806,571 B2 | 10/2004 | Shibata et al. |
| 6,812,053 B1 | 11/2004 | Kong et al. |
| 6,812,500 B2 | 11/2004 | Reeh et al. |
| 6,814,470 B2 | 11/2004 | Rizkin et al. |
| 6,819,505 B1 | 11/2004 | Cassarly |
| 6,819,506 B1 | 11/2004 | Taylor |
| 6,821,804 B2 | 11/2004 | Thibeault |
| 6,825,501 B2 | 11/2004 | Edmond et al. |
| D499,384 S | 12/2004 | Kamada |
| D499,385 S | 12/2004 | Ishida |
| 6,828,596 B2 | 12/2004 | Steigerwald et al. |
| 6,828,599 B2 | 12/2004 | Kim |
| 6,831,302 B2 | 12/2004 | Erchak |
| 6,831,305 B2 | 12/2004 | Yasukawa et al. |
| 6,833,564 B2 | 12/2004 | Shen et al. |
| 6,835,957 B2 | 12/2004 | Stockman |
| 6,838,705 B1 | 1/2005 | Tanizawa et al. |
| 6,841,931 B2 | 1/2005 | Takahashi et al. |
| 6,844,565 B2 | 1/2005 | Lell et al. |
| 6,844,903 B2 | 1/2005 | Mueller-Mach et al. |
| 6,846,101 B2 | 1/2005 | Coushaine |
| 6,847,057 B1 | 1/2005 | Gardner et al. |
| 6,850,002 B2 | 2/2005 | Danielson et al. |
| 6,853,010 B2 | 2/2005 | Slater |
| D502,449 S | 3/2005 | Ishida |
| D503,388 S | 3/2005 | Ishida |
| 6,870,191 B2 | 3/2005 | Niki et al. |
| 6,870,311 B2 | 3/2005 | Mueller et al. |
| 6,871,982 B2 | 3/2005 | Holman |
| 6,872,986 B2 | 3/2005 | Fukuda et al. |
| 6,876,008 B2 | 4/2005 | Bhat et al. |
| 6,876,009 B2 | 4/2005 | Narukawa et al. |
| 6,877,558 B2 | 4/2005 | Connell et al. |
| 6,878,973 B2 | 4/2005 | Lowery et al. |
| 6,885,033 B2 | 4/2005 | Andrews |
| 6,885,036 B2 | 4/2005 | Tarsa |
| 6,888,997 B2 | 5/2005 | Duong |
| 6,890,085 B2 | 5/2005 | Hacker |
| 6,891,199 B2 | 5/2005 | Baur et al. |
| 6,896,381 B2 | 5/2005 | Benitez |
| 6,897,488 B2 | 5/2005 | Baur et al. |
| 6,897,490 B2 | 5/2005 | Brunner et al. |
| 6,900,472 B2 | 5/2005 | Kondoh et al. |
| 6,900,474 B2 | 5/2005 | Misra et al. |
| D506,449 S | 6/2005 | Hoshiba |
| 6,903,376 B2 | 6/2005 | Shen et al. |
| 6,906,352 B2 | 6/2005 | Edmond et al. |
| 6,911,676 B2 | 6/2005 | Yoo |
| 6,916,748 B2 | 7/2005 | Huang |
| 6,917,059 B2 | 7/2005 | Uemura |
| 6,921,928 B2 | 7/2005 | Sonobe |
| 6,924,514 B2 | 8/2005 | Suenaga |
| 6,924,596 B2 | 8/2005 | Sato et al. |
| 6,925,100 B2 | 8/2005 | Senda et al. |
| 6,936,859 B1 | 8/2005 | Uemura et al. |
| 6,936,860 B2 | 8/2005 | Sung et al. |
| 6,943,128 B2 | 9/2005 | Chiyo et al. |
| 6,943,380 B2 | 9/2005 | Ota et al. |
| 6,943,381 B2 | 9/2005 | Gardner et al. |
| 6,943,433 B2 | 9/2005 | Kamada |
| 6,946,682 B2 | 9/2005 | Slater, Jr. et al. |
| 6,946,685 B1 | 9/2005 | Steigerwald et al. |
| D510,913 S | 10/2005 | Sumitani |
| 6,952,024 B2 | 10/2005 | Edmond et al. |
| 6,953,952 B2 | 10/2005 | Asakawa |
| 6,955,933 B2 | 10/2005 | Bour et al. |
| 6,956,245 B2 | 10/2005 | Senda et al. |
| 6,956,247 B1 | 10/2005 | Stockman |
| 6,958,497 B2 | 10/2005 | Emerson et al. |
| 6,960,878 B2 | 11/2005 | Sakano et al. |
| 6,967,116 B2 | 11/2005 | Negley |
| 6,969,946 B2 | 11/2005 | Steranka |
| 6,972,438 B2 | 12/2005 | Li |
| 6,977,396 B2 | 12/2005 | Shen et al. |
| 6,987,281 B2 | 1/2006 | Edmond et al. |
| 6,987,287 B2 | 1/2006 | Liu et al. |
| 6,987,613 B2 | 1/2006 | Pocius |
| 6,989,555 B2 | 1/2006 | Goetz et al. |
| 6,992,334 B1 | 1/2006 | Wierer, Jr. et al. |
| 6,993,242 B2 | 1/2006 | Winston |
| 6,995,032 B2 | 2/2006 | Bruhns et al. |
| 6,998,771 B2 | 2/2006 | Debray et al. |
| 7,001,058 B2 | 2/2006 | Inditsky |
| 7,002,291 B2 | 2/2006 | Ellens et al. |
| 7,005,679 B2 | 2/2006 | Tarsa et al. |
| 7,005,681 B2 | 2/2006 | Bader et al. |
| 7,005,684 B2 | 2/2006 | Uemura et al. |
| 7,009,008 B1 | 3/2006 | Hohn et al. |
| 7,009,199 B2 | 3/2006 | Hall |
| 7,009,213 B2 | 3/2006 | Camras |
| 7,009,218 B2 | 3/2006 | Sugimoto et al. |
| 7,012,279 B2 | 3/2006 | Wierer Jr. et al. |

(56) References Cited

U.S. PATENT DOCUMENTS

| | | |
|---|---|---|
| 7,012,281 B2 | 3/2006 | Tsai et al. |
| 7,015,054 B2 | 3/2006 | Steigerwald et al. |
| 7,015,513 B2 | 3/2006 | Hsieh |
| 7,015,516 B2 | 3/2006 | Eliashevich |
| 7,018,915 B2 | 3/2006 | Shibata et al. |
| 7,021,797 B2 | 4/2006 | Minano |
| 7,026,653 B2 | 4/2006 | Sun |
| 7,029,935 B2 | 4/2006 | Negley et al. |
| 7,029,939 B2 | 4/2006 | Chiyo et al. |
| 7,030,423 B2 | 4/2006 | Chang et al. |
| 7,037,741 B2 | 5/2006 | Tasi et al. |
| 7,038,246 B2 | 5/2006 | Uemura |
| 7,038,370 B2 | 5/2006 | Mueller-Mach et al. |
| 7,040,774 B2 | 5/2006 | Beeson |
| 7,042,012 B2 | 5/2006 | Senda et al. |
| 7,042,153 B2 | 5/2006 | Uemura |
| 7,045,956 B2 | 5/2006 | Braune et al. |
| 7,053,417 B2 | 5/2006 | Kim |
| 7,053,419 B1 | 5/2006 | Camras |
| 7,063,807 B2 | 6/2006 | Kummer et al. |
| 7,064,353 B2 | 6/2006 | Bhat |
| 7,064,355 B2 | 6/2006 | Camras |
| 7,064,480 B2 | 6/2006 | Bokor et al. |
| 7,070,300 B2 | 7/2006 | Harbers et al. |
| 7,071,494 B2 | 7/2006 | Steigerwald |
| 7,071,495 B2 | 7/2006 | Uemura |
| 7,072,096 B2 | 7/2006 | Holman |
| 7,074,631 B2 | 7/2006 | Erchak |
| 7,075,610 B2 | 7/2006 | Scalora |
| 7,078,254 B2 | 7/2006 | Loh |
| 7,078,732 B1 | 7/2006 | Reeh et al. |
| 7,078,738 B2 | 7/2006 | Nawashiro et al. |
| 7,080,932 B2 | 7/2006 | Keuper |
| 7,083,993 B2 | 8/2006 | Erchak |
| 7,087,738 B2 | 8/2006 | Botstein et al. |
| 7,087,931 B2 | 8/2006 | Wu et al. |
| 7,087,936 B2 | 8/2006 | Negley |
| 7,091,656 B2 | 8/2006 | Murazaki et al. |
| 7,095,765 B2 | 8/2006 | Liu et al. |
| 7,098,588 B2 | 8/2006 | Jager et al. |
| 7,105,857 B2 | 9/2006 | Nagahama et al. |
| 7,106,090 B2 | 9/2006 | Harle et al. |
| 7,108,386 B2 | 9/2006 | Jacobson |
| 7,109,521 B2 | 9/2006 | Hallin |
| 7,109,529 B2 | 9/2006 | Uemura et al. |
| 7,111,964 B2 | 9/2006 | Suehiro et al. |
| 7,112,636 B2 | 9/2006 | Okada |
| 7,122,839 B2 | 10/2006 | Shen et al. |
| 7,132,695 B2 | 11/2006 | Ou et al. |
| 7,132,786 B1 | 11/2006 | Debray et al. |
| 7,138,662 B2 | 11/2006 | Uemura |
| 7,153,015 B2 | 12/2006 | Brukilacchio |
| 7,154,121 B2 | 12/2006 | Hsieh et al. |
| 7,154,149 B2 | 12/2006 | Wu et al. |
| D534,505 S | 1/2007 | Kamada |
| 7,157,294 B2 | 1/2007 | Uemura et al. |
| 7,161,187 B2 | 1/2007 | Suehiro et al. |
| 7,161,301 B2 | 1/2007 | Hsieh et al. |
| 7,170,097 B2 | 1/2007 | Edmond et al. |
| D536,672 S | 2/2007 | Asakawa |
| D537,047 S | 2/2007 | Asakawa |
| 7,183,586 B2 | 2/2007 | Ichihara et al. |
| 7,183,632 B2 | 2/2007 | Arndt et al. |
| 7,183,661 B2 | 2/2007 | Bogner et al. |
| 7,192,797 B2 | 3/2007 | Tu et al. |
| 7,193,299 B2 | 3/2007 | Arndt et al. |
| 7,196,359 B2 | 3/2007 | Baur et al. |
| 7,201,495 B2 | 4/2007 | Epstein |
| 7,202,181 B2 | 4/2007 | Negley |
| 7,211,832 B2 | 5/2007 | Hirose |
| 7,211,833 B2 | 5/2007 | Slater, Jr. et al. |
| 7,211,835 B2 | 5/2007 | Ono |
| 7,215,074 B2 | 5/2007 | Shimizu et al. |
| 7,217,583 B2 | 5/2007 | Negley et al. |
| 7,227,190 B2 | 6/2007 | Yasukawa et al. |
| 7,227,191 B2 | 6/2007 | Eberhard et al. |
| D547,736 S | 7/2007 | Kamada |
| 7,244,968 B2 | 7/2007 | Yoo |
| 7,247,257 B2 | 7/2007 | Murazaki et al. |
| 7,247,884 B2 | 7/2007 | Shibata et al. |
| 7,247,940 B2 | 7/2007 | Hofer et al. |
| 7,250,715 B2 | 7/2007 | Mueller et al. |
| 7,253,450 B2 | 8/2007 | Senda et al. |
| 7,253,451 B2 | 8/2007 | Yoo et al. |
| 7,256,428 B2 | 8/2007 | Braune et al. |
| 7,256,468 B2 | 8/2007 | Suenaga |
| 7,256,483 B2 | 8/2007 | Epler et al. |
| 7,258,816 B2 | 8/2007 | Tamaki et al. |
| 7,259,033 B2 | 8/2007 | Slater, Jr. et al. |
| 7,259,402 B2 | 8/2007 | Edmond et al. |
| 7,264,527 B2 | 9/2007 | Bawendi et al. |
| 7,265,392 B2 | 9/2007 | Hahn et al. |
| 7,268,371 B2 | 9/2007 | Krames et al. |
| 7,274,040 B2 | 9/2007 | Sun |
| 7,276,737 B2 | 10/2007 | Camras et al. |
| 7,279,346 B2 | 10/2007 | Andrews et al. |
| 7,279,723 B2 | 10/2007 | Matsumura et al. |
| 7,279,724 B2 | 10/2007 | Collins, III et al. |
| 7,280,288 B2 | 10/2007 | Loh et al. |
| 7,282,744 B2 | 10/2007 | Flynn et al. |
| 7,288,797 B2 | 10/2007 | Deguchi et al. |
| 7,291,529 B2 | 11/2007 | Slater, Jr. et al. |
| 7,291,865 B2 | 11/2007 | Kojima et al. |
| 7,294,866 B2 | 11/2007 | Liu |
| D557,224 S | 12/2007 | Kamada |
| 7,319,247 B2 | 1/2008 | Bader et al. |
| 7,319,289 B2 | 1/2008 | Suehiro et al. |
| 7,326,583 B2 | 2/2008 | Andrews et al. |
| 7,326,967 B2 | 2/2008 | Hsieh et al. |
| 7,329,587 B2 | 2/2008 | Bruederl et al. |
| 7,329,905 B2 | 2/2008 | Ibbetson et al. |
| 7,332,365 B2 | 2/2008 | Nakamura et al. |
| 7,335,522 B2 | 2/2008 | Wang et al. |
| 7,335,920 B2 | 2/2008 | Denbaars et al. |
| 7,338,822 B2 | 3/2008 | Wu et al. |
| 7,341,878 B2 | 3/2008 | Krames et al. |
| 7,344,902 B2 | 3/2008 | Basin et al. |
| 7,345,297 B2 | 3/2008 | Yamazoe et al. |
| 7,345,313 B2 | 3/2008 | Strauss et al. |
| 7,345,413 B2 | 3/2008 | Braune et al. |
| 7,348,600 B2 | 3/2008 | Narukawa et al. |
| D565,516 S | 4/2008 | Kamada |
| 7,351,356 B2 | 4/2008 | Delsing et al. |
| 7,352,011 B2 | 4/2008 | Smits et al. |
| 7,355,209 B2 | 4/2008 | Tsai et al. |
| 7,355,210 B2 | 4/2008 | Ou et al. |
| 7,355,284 B2 | 4/2008 | Negley |
| 7,358,522 B2 | 4/2008 | Yanamoto |
| 7,358,540 B2 | 4/2008 | Hsieh et al. |
| 7,361,938 B2 | 4/2008 | Mueller et al. |
| 7,362,048 B2 | 4/2008 | Shimizu et al. |
| 7,365,369 B2 | 4/2008 | Nakamura et al. |
| 7,365,371 B2 | 4/2008 | Andrews |
| 7,368,329 B2 | 5/2008 | Waitl et al. |
| 7,372,198 B2 | 5/2008 | Negley |
| 7,375,377 B2 | 5/2008 | Baur et al. |
| D571,738 S | 6/2008 | Wall, Jr. |
| 7,382,033 B2 | 6/2008 | Roth et al. |
| 7,384,809 B2 | 6/2008 | Donofrio |
| 7,385,226 B2 | 6/2008 | Ou et al. |
| 7,387,677 B2 | 6/2008 | Dwilinski et al. |
| 7,388,232 B2 | 6/2008 | Suehiro et al. |
| 7,390,684 B2 | 6/2008 | Izuno et al. |
| D572,209 S | 7/2008 | Tokuda |
| 7,393,122 B2 | 7/2008 | Tsuzuki et al. |
| 7,393,213 B2 | 7/2008 | Yoo et al. |
| 7,402,837 B2 | 7/2008 | Slater, Jr. et al. |
| 7,402,840 B2 | 7/2008 | Krames et al. |
| 7,405,093 B2 | 7/2008 | Andrews |
| 7,414,269 B2 | 8/2008 | Grotsch et al. |
| 7,419,839 B2 | 9/2008 | Camras et al. |
| 7,429,750 B2 | 9/2008 | Suehiro et al. |
| 7,429,758 B2 | 9/2008 | Ruhnau et al. |
| D578,226 S | 10/2008 | West et al. |

(56) References Cited

U.S. PATENT DOCUMENTS

| | | |
|---|---|---|
| 7,432,534 B2 | 10/2008 | Yoo et al. |
| 7,432,536 B2 | 10/2008 | Slater, Jr. et al. |
| 7,432,589 B2 | 10/2008 | Yamamoto et al. |
| 7,432,642 B2 | 10/2008 | Murazaki |
| 7,432,647 B2 | 10/2008 | Nagatomi et al. |
| 7,436,002 B2 | 10/2008 | Brunner et al. |
| 7,436,066 B2 | 10/2008 | Sonobe et al. |
| 7,439,091 B2 | 10/2008 | Chen et al. |
| 7,439,609 B2 | 10/2008 | Negley |
| 7,442,254 B2 | 10/2008 | Kiyoku et al. |
| 7,442,644 B2 | 10/2008 | Nogami |
| 7,442,966 B2 | 10/2008 | Bader et al. |
| D580,380 S | 11/2008 | Tokuda |
| 7,445,354 B2 | 11/2008 | Aoki et al. |
| 7,446,343 B2 | 11/2008 | Mueller et al. |
| 7,446,344 B2 | 11/2008 | Fehrer et al. |
| 7,446,345 B2 | 11/2008 | Emerson et al. |
| 7,446,346 B2 | 11/2008 | Harle |
| 7,452,737 B2 | 11/2008 | Basin et al. |
| 7,456,499 B2 | 11/2008 | Loh et al. |
| D582,865 S | 12/2008 | Edmond et al. |
| D582,866 S | 12/2008 | Edmond et al. |
| 7,462,861 B2 | 12/2008 | Slater, Jr. et al. |
| 7,473,933 B2 | 1/2009 | Yan |
| 7,772,604 B2 | 8/2010 | Duong et al. |
| 7,789,531 B2 | 9/2010 | Duong et al. |
| 7,829,358 B2 | 11/2010 | Duong et al. |
| 7,968,896 B2 | 6/2011 | Duong et al. |
| 8,087,960 B2 | 1/2012 | Duong et al. |
| 8,263,993 B2 | 9/2012 | Duong et al. |
| 8,449,128 B2 | 5/2013 | Ko et al. |
| 8,585,253 B2 * | 11/2013 | Duong et al. ............ 362/311.02 |
| 2002/0012247 A1 | 1/2002 | Kamiya et al. |
| 2002/0017844 A1 | 2/2002 | Parkyn et al. |
| 2002/0030194 A1 | 3/2002 | Camras et al. |
| 2002/0080615 A1 | 6/2002 | Marshall et al. |
| 2002/0080622 A1 | 6/2002 | Pashley et al. |
| 2002/0123164 A1 | 9/2002 | Slater |
| 2002/0127864 A1 | 9/2002 | Smith et al. |
| 2002/0141006 A1 | 10/2002 | Pocius et al. |
| 2002/0163808 A1 | 11/2002 | West et al. |
| 2003/0002272 A1 | 1/2003 | Suehiro et al. |
| 2003/0089914 A1 | 5/2003 | Chen |
| 2003/0132447 A1 | 7/2003 | Yukimoto |
| 2003/0156416 A1 | 8/2003 | Stopa et al. |
| 2004/0016718 A1 | 1/2004 | Hwu et al. |
| 2004/0036080 A1 | 2/2004 | Bogner et al. |
| 2004/0046489 A1 | 3/2004 | Vetorino et al. |
| 2004/0079957 A1 | 4/2004 | Andrews et al. |
| 2004/0114393 A1 | 6/2004 | Galli |
| 2004/0120153 A1 | 6/2004 | Pate |
| 2004/0126913 A1 | 7/2004 | Loh |
| 2004/0155565 A1 | 8/2004 | Holder et al. |
| 2004/0201987 A1 | 10/2004 | Omata |
| 2004/0207774 A1 | 10/2004 | Gothard |
| 2004/0218390 A1 | 11/2004 | Holman et al. |
| 2004/0222426 A1 | 11/2004 | Hsiung |
| 2004/0232825 A1 | 11/2004 | Sorg |
| 2004/0233665 A1 | 11/2004 | West et al. |
| 2004/0264185 A1 | 12/2004 | Grotsch et al. |
| 2005/0001230 A1 | 1/2005 | Takekuma |
| 2005/0006651 A1 | 1/2005 | LeBoeuf et al. |
| 2005/0007777 A1 | 1/2005 | Klipstein et al. |
| 2005/0018248 A1 | 1/2005 | Silverbrook |
| 2005/0024887 A1 | 2/2005 | Boxler |
| 2005/0047729 A1 | 3/2005 | Vilgiate |
| 2005/0051782 A1 | 3/2005 | Negley et al. |
| 2005/0063181 A1 | 3/2005 | Chiba et al. |
| 2005/0073840 A1 | 4/2005 | Chou et al. |
| 2005/0073849 A1 | 4/2005 | Rhoads et al. |
| 2005/0077529 A1 | 4/2005 | Shen |
| 2005/0093430 A1 | 5/2005 | Ibbetson et al. |
| 2005/0173719 A1 | 8/2005 | Yonekubo |
| 2005/0195488 A1 | 9/2005 | McCabe et al. |
| 2005/0215000 A1 | 9/2005 | Negley |
| 2005/0218790 A1 | 10/2005 | Blumel |
| 2005/0285129 A1 | 12/2005 | Jackson et al. |
| 2006/0001037 A1 | 1/2006 | Schardt et al. |
| 2006/0044523 A1 | 3/2006 | Teijido et al. |
| 2006/0046622 A1 | 3/2006 | Prasad |
| 2006/0091414 A1 | 5/2006 | Ouderkirk et al. |
| 2006/0094340 A1 | 5/2006 | Ouderkirk et al. |
| 2006/0108590 A1 | 5/2006 | Kawaguchi |
| 2006/0192194 A1 | 8/2006 | Erchak |
| 2007/0063214 A1 | 3/2007 | Kim et al. |
| 2007/0120135 A1 | 5/2007 | Soules et al. |
| 2007/0152230 A1 | 7/2007 | Duong et al. |
| 2008/0030974 A1 | 2/2008 | Abu-Ageel |
| 2008/0030993 A1 | 2/2008 | Narendran et al. |
| 2008/0062672 A1 | 3/2008 | Peng et al. |
| 2008/0080166 A1 | 4/2008 | Duong et al. |
| 2008/0081531 A1 | 4/2008 | Duong et al. |
| 2008/0266893 A1 | 10/2008 | Speier |
| 2009/0085043 A1 | 4/2009 | Song et al. |
| 2009/0085052 A1 | 4/2009 | Ko et al. |
| 2009/0087937 A1 | 4/2009 | Kim |
| 2009/0087994 A1 | 4/2009 | Lee et al. |
| 2009/0189512 A1 | 7/2009 | Miyaguchi et al. |
| 2009/0275157 A1 | 11/2009 | Winberg et al. |
| 2009/0275266 A1 | 11/2009 | Winberg et al. |
| 2009/0309116 A1 | 12/2009 | Kato et al. |
| 2011/0044022 A1 | 2/2011 | Ko et al. |
| 2011/0273894 A1 | 11/2011 | Duong et al. |
| 2012/0068615 A1 | 3/2012 | Duong et al. |
| 2015/0036358 A1 | 2/2015 | Duong et al. |

FOREIGN PATENT DOCUMENTS

| | | |
|---|---|---|
| JP | 2000-180962 | 6/2000 |
| JP | 2003-53647 | 2/2003 |
| JP | 3900144 | 5/2004 |
| JP | 2005-109289 | 4/2005 |
| JP | 2005-197728 | 7/2005 |
| JP | 2005-217094 | 8/2005 |
| JP | 2005-327820 | 11/2005 |
| JP | 2005-537631 | 12/2005 |
| JP | 2007-035951 | 2/2007 |
| JP | 2007-281260 | 10/2007 |
| JP | 2008-041739 | 2/2008 |
| WO | WO 2004021461 A2 | 3/2004 |
| WO | WO 2007/061638 | 5/2007 |

OTHER PUBLICATIONS

Notice of Allowance for U.S. Appl. No. 13/113,803, mailed Jul. 16, 2014, 4 pgs.

International Search Report and Written Opinion for International Patent Application No. PCT/US07/00102 mailed Mar. 28, 2008, 10 pgs.

International Search Report and Written Opinion for International Patent Application No. PCT/US07/21117 mailed Mar. 25, 2008, 10 pgs.

International Preliminary Examination Report for International Application No. PCT/US2007/00102, mailed Jul. 17, 2008, 6 pgs.

Light-Emitting Diode, Wikipedia, Nov. 17, 2008, pp. 1-15, at http://en.wikipedia.org/wiki/Light-emitting_diode.

Cree XLamp LED Reliability, Cree LED Light, Sep. 2007, pp. 1-9, Cree, Inc., Durham, NC 27703, at www.cree.com/xlamp.

Golden DRAGON Engineering Kit, OSRAM Opto Semiconductors GmbH, Oct. 4, 2006, Regensburg, Germany, at www.osram-os.com, 6 pgs.

Power Light Source Luxeon Rebel, Technical Datasheet DS56, Philips, Jul. 2008, Philips Lumileds Lighting Company, US, at www.luxeon.com, 34 pgs.

Specification for NICHIA Chip Type White LED, Model NSSW108T, Cat. No. 070606, NICHIA Corporation, 13 pgs.

Haque, High-power LED Stud-bump Packaging, Advanced Packaging, Apr. 2006, 6 pgs., at http://ap.pennnet.com/Articles/Article_Display.cfm?Section+ARTCL&ARTCLEID=252779&VERSI.

Wong et al., Packaging of Power LEDS Using Thermosonic Bonding of Au—Au Interconnects, SMTA Int'l Conf., Sep. 24, 2006, pp. 1-2, SMTA, Edina, MN at www.smta.org.

(56) References Cited

OTHER PUBLICATIONS

Moreno, LED Intensity Distribution, International Optical Design Conf. 2006, Jun. 2006, Optical Society of America, ISBN: 1-55752-814-4, 3 pgs.

Moreno et al., Modeling the Radiation Pattern of LEDs, Optics Express, Feb. 4, 2008, vol. 16, No. 3, Optical Society of America #90469, 12 pgs.

Cho et al., Dry etching of GaN and related materials; Comparison of techniques, IEEE Journal of Selected Topics in Quantum Electronics, 1998, 4(3):557-563, 11 pgs.

Mishra, GaN Vacuum Microelectronic Electron Emitter with Integrated Extractor, Santa Barbara CA, Jan. 28, 2009 at my.ece.ucsb.edu/mishra/vacuummicroelec/finalrepnsf.pdf, 4 pgs.

He, et al., GaN layers re-grown on etched GaN templates by plasma assisted molecular beam epitaxy, Mat. Res. Soc. Symp. Proc., vol. 798, 2004, Materials Research Society, Richmond, VA, 4 pgs.

Gallium Nitride Film Growth, downloaded Feb. 6, 2009 at www.onr.navy.mil/sci_tech/31/312/ncsr/materials/gan/filmgrowth.asp?cssprinter&.

The Asymmetric Reflector, Elliptipar, West Haven, CT, 2 pgs., downloaded from http://www.elliptipar.com/reflector.asp on Mar. 30, 2009.

Sports Lighting Solutions, Light Control, Abacus Lighting Limited, Nottinghamshire, England, 3 pgs., downloaded from http://www.abacuslighting.com/sportslighting.asp?sport=sn03 on Mar. 27, 2009.

Samsung files patents ahead of LED spin-out, Apr. 2, 2009, downloaded Apr. 14, 2009 at http://compoundsemiconductor.net/cws/article/news/38551, 2 pgs.

International Search Report and Written Opinion for International Patent Application No. PCT/US2009/033429, dated Apr. 15, 2009, 9 pgs.

International Preliminary Report on Patentability for International Patent Application No. PCT/US2007/021117, dated Apr. 7, 2009, 8 pgs.

Office Action for U.S. Appl. No. 11/906,194, mailed on Jul. 24, 2009, 6 pgs.

International Search Report and Written Opinion for International Patent Application No. PCT/US09/48788, mailed Aug. 14, 2009, 6 pgs.

International Search Report and Written Opinion for International Patent Application No. PCT/US09/48787, mailed Aug. 14, 2009, 7 pgs.

Office Action for U.S. Appl. No. 11/649,018, mailed Sep. 4, 2009, 18 pgs.

Office Action for U.S. Appl. No. 11/906,219 mailed on May 13, 2010, 13 pgs.

Notice of Allowance for U.S. Appl. No. 11/906,219, mailed Oct. 12, 2010, 6 pgs.

International Search Report and Written Opinion for International Application No. PCT/US2010/046108, mailed Oct. 18, 2010, 7 pgs.

European Search Report and Written Opinion for Application No. EP 07716261, mailed Nov. 30, 2010, 8 pgs.

Office Action for U.S. Appl. No. 11/906,219 mailed Jan. 18, 2011, 11 pgs.

International Preliminary Report on Patentability for International Application No. PCT/US2009/048787 mailed Jan. 13, 2011, Patent Cooperation Treaty, 7 pgs.

International Preliminary Report on Patentability for International Application No. PCT/US2009/048788 mailed Jan. 13, 2011, Patent Cooperation Treaty, 6 pgs.

Notice of Allowance for U.S. Appl. No. 12/788,094, mailed May 3, 2011, 11 pgs.

Office Action for U.S. Appl. No. 11/906,219, mailed May 24, 2011, 13 pgs.

Notice of Allowance for U.S. Appl. No. 11/906,219, mailed Sep. 1, 2011, 8 pgs.

Office Action for U.S. Appl. No. 12/795,484, mailed Jan. 5, 2012, 39 pgs.

Office Action for U.S. Appl. No. 12/492,472, mailed Jan. 17, 2012, 54 pgs.

International Preliminary Report on Patentability for PCT Patent Application No. PCT/US2010/046108, mailed Mar. 1, 2012, 7 pgs.

Office Action for U.S. Appl. No. 12/646,570, mailed Mar. 14, 2012, 11 pgs.

Office Action for Japanese Patent Application No. 2009-531411 with English translation, Japanese Patent Office, mailed Jul. 23, 2012, 10 pgs.

Notice of Allowance for U.S. Appl. No. 12/646,570, mailed Oct. 17, 2012, 4 pgs.

Office Action (with English translation) for Japanese Patent Application No. 2008-549548, mailed Oct. 4, 2012, 13 pgs.

Butsurigaku Jiten (Dictionary of Physics), Third Edition, Baifukan Corp., Sep. 30, 2005, pp. 717, 447-448.

Notice of Allowance for U.S. Appl. No. 12/646,570, mailed Jan. 17, 2013, 2 pgs.

Notice of Allowance for U.S. Appl. No. 13/077,594, mailed Apr. 10, 2013, 5 pgs.

Office Action for Japanese Patent Application No. 2008-549548, mailed Mar. 5, 2013, 1 pg.

Office Action for U.S. Appl. No. 13/113,803, mailed Nov. 25, 2013, 18 pgs.

Office Action (with English translation) for Japanese Patent Application No. 2012-525714, mailed Feb. 27, 2014, 15 pgs.

Notice of Allowance for U.S. Appl. No. 13/113,803, mailed Mar. 27, 2014, 4 pgs.

\* cited by examiner

FIG. 23C

SYSTEM AND METHOD FOR COLOR MIXING LENS ARRAY

RELATED APPLICATIONS

This application is a continuation of, and claims a benefit of priority under 35 U.S.C. 120 of the filing date of U.S. patent application Ser. No. 13/077,594, entitled "System and Method for a Phosphor Coated Lens" by Duong et al., filed Mar. 31, 2011, which claims the benefit of priority under 35 U.S.C. 119(e) to U.S. Provisional Patent Application No. 61/319,739, entitled "System and Method for Phosphor Coated Lens," by Ko et al., filed Mar. 31, 2010, and claims the benefit of priority under 35 U.S.C. 120 as a continuation-in-part of U.S. patent application Ser. No. 12/646,570, entitled "System and Method for a Phosphor Coated Lens" by Ko et al., filed Dec. 23, 2009, issued as U.S. Pat. No. 8,449,128 on May 28, 2013, which claims the benefit of priority to U.S. Provisional Patent No. 61/235,491, entitled "Phosphor Coated Lens for Phosphor Converting Type White Light Engine" by Ko et al., filed Aug. 20, 2009. Each of the applications referenced above in this paragraph is hereby fully incorporated by reference herein.

TECHNICAL FIELD OF THE DISCLOSURE

The present disclosure relates generally to optical systems. More particularly, the present disclosure relates to using arrays of optical units to create highly uniform light distributions with selected color and/or color temperature.

BACKGROUND OF THE DISCLOSURE

Phosphors are isotropic emitters, emitting light in all directions. In traditional LED implementations, phosphor is applied on the LED chip, in a silicone matrix in proximity to the LED or to the outside of an LED dome or other LED packaging. A dome or lens may be applied to an LED chip coated with phosphor to control the light beam angle (shape) from lambertian to a very narrow spot. Such devices range from hemispherical lenses to T-5 mm (T 1¾) aspheres. One conventional system for producing white light LEDs, for example, is constructed with pump blue/UV LED chips and a proximate mixture of phosphor in a binding matrix such as silicone. The term "goop in a cup" is used to describe LEDs with flat or very nearly flat phosphor and silicone mixture over a blue pump within a reflective cup. In remote phosphor systems, phosphor is applied away from the chip on the outside of a dome or inside of a hemispherical shell to increase converting efficiency. However, an additional lens may be needed to control light beam shape. The GE Vio™ employs the remote phosphor solution.

Current systems suffer efficiency losses due to heating of the LED chip and the phosphor particles. Additionally, many current systems require secondary optics or additional lenses to shape the light emitted from a dome or phosphor coated LED into a desired beam angle. The coupling of a lens to a dome causes efficiency losses of approximately 10% or greater. Furthermore, current systems suffer conversion losses when multiple color phosphors are used due to cross-excitation. For instance, a red-emitting phosphor may absorb down-converted light from a green-emitting phosphor instead of the pump wavelength, thereby introducing further losses.

SUMMARY

Embodiments described herein provide optical systems that provide illumination patterns having a large area with uniform color. One embodiment of an optical system can include a set of optical units that each produces an illumination pattern with uniform color and intensity. The optical units are spaced so that the individual illumination patterns overlap to create an overall illumination pattern with an overlap area. The color in the overlap area results from blending of the colors emitted by the individual optical units.

The various optical units can be selected to have a high percent of light in beam. By way of example, but not limitation, optical units can be selected to achieve a high percent of light in beam (e.g., greater than 50%, greater than 60%, greater than 70% to greater than 90% and approaching 100%) in a range of beam angles (for example, but not limited to full beam (full width half maximum) angles of 10-120 degrees. Consequently, the overall array can also have a high percent of light in beam.

One embodiment of an optical system comprises an LED array with a set of lenses optically coupled to the LED array. Each lens can be configured to emit a high percent of light in a selected beam angle and the lenses can be spaced so that illumination patterns from adjacent lenses overlap to produce an overall illumination pattern. The overall illumination pattern can have an overlap area having a uniform color profile. The overall illumination pattern may have a non-uniform border area corresponding to the width of a row of lenses.

One embodiment of an optical unit can include an LED, a lens and phosphor disposed on the lens. The phosphors are disposed on the lens between the entrance face to the lens body and the LED so that light emitted from the LED will be incident on the phosphor and at least partially down converted before entering the lens body through the entrance face.

Optical units can be arranged in a packaged array. One embodiment of a packaged array comprises a submount, an array of LEDs mounted to the submount, a housing and a set of lenses. The LED is positioned in an LED cavity and the lens is positioned in a lens cavity so that the lens' entrance face is positioned proximate to an opening between the corresponding lens and LED cavities. A layer of phosphors can be disposed on each site between the entrance face and the corresponding LED so that light is down converted before entering the lens body. In one embodiment, the entrance face of each lens is positioned a distance from the corresponding LED so that there is a gap between the LED and the phosphors.

One advantage provided by embodiments described herein is that phosphor is removed from the LED chip. Heating of the LED chip is therefore reduced or prevented.

As another advantage, phosphor conversion efficiency can be increased due to the separation of phosphor from the LED active layer. Self-heating of phosphor due to the Stokes shift can be suppressed by heat dissipation through the system submount/heatsink.

As yet another advantage, higher phosphor conversion efficiency can be achieved due to the lowered flux density at the entrance of the lens, as compared to the flux density at the LED chip.

As another advantage of various embodiments, positioning phosphor at the entrance surface of a brightness conserving separate optical device can provide an optimal balance between thermal consideration and effective phosphor package efficiencies.

As yet another advantage, light beam pattern control, color mixing and color conversion can be achieved at the same optical device.

Embodiments can provide another advantage by providing a uniform spatial distribution at far field using a brightness conserving lens, making it possible for the underlying optical system to conserve the etendue of the source. Embodiments of described herein provide another advantage by allowing for near and/or far field color and spatial uniformity or for near and/or far field tailored color distribution and spatial distribution.

BRIEF DESCRIPTION OF THE DRAWINGS

A more complete understanding of the embodiments and the advantages thereof may be acquired by referring to the following description, taken in conjunction with the accompanying drawings in which like reference numbers indicate like features and wherein:

FIG. 23C is a diagrammatic representation illustrating that the facets for a sidewall can be defined using a computer program;

DETAILED DESCRIPTION

Figure 1A:
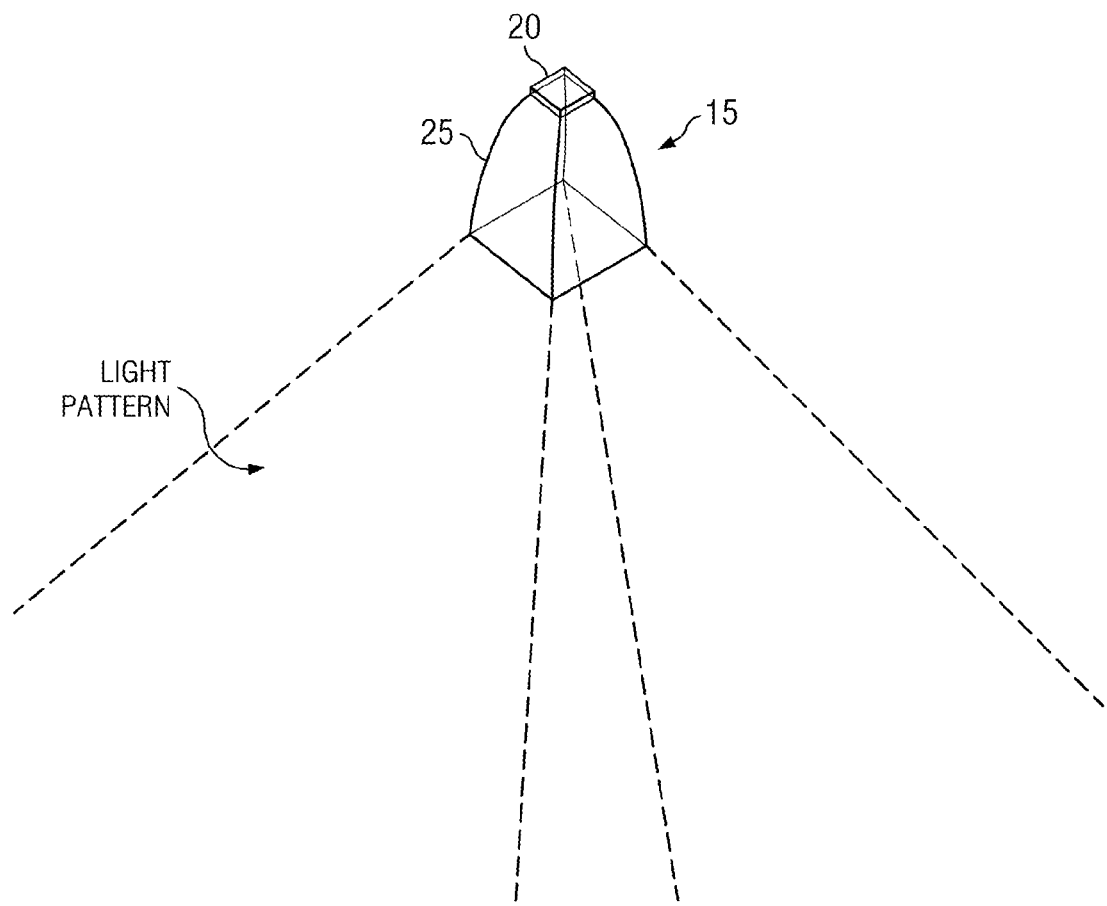
FIGS. 1A and 1B are diagrammatic representations showing an optical unit with a 30 degree half-angle.

Embodiments and various features and advantageous details thereof are explained more fully with reference to the exemplary, and therefore non-limiting, examples illustrated in the accompanying drawings and detailed in the following description. Descriptions of known starting materials and processes may be omitted so as not to unnecessarily obscure the disclosure in detail. It should be understood, however, that the detailed description and the specific examples, while indicating the preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, product, article, or apparatus that comprises a list of elements is not necessarily limited only those elements but may include other elements not expressly listed or inherent to such process, product, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, any examples or illustrations given herein are not to be regarded in any way as restrictions on, limits to, or express definitions of, any term or terms with which they are utilized. Instead these examples or illustrations are to be regarded as being described with respect to one particular embodiment and as illustrative only. Those of ordinary skill in the art will appreciate that any term or terms with which these examples or illustrations are utilized encompass other embodiments as well as implementations and adaptations thereof which may or may not be given therewith or elsewhere in the specification and all such embodiments are intended to be included within the scope of that term or terms. Language designating such non-limiting examples and illustrations includes, but is not limited to: "for example," "for instance," "e.g.," "in one embodiment," and the like.

Reference is now made in detail to the exemplary embodiments of the disclosure, examples of which are illustrated in the accompanying drawings. Wherever possible, like numerals will be used throughout the drawings to refer to like and corresponding parts (elements) of the various drawings.

Embodiments described herein provide an optical system that creates highly uniform light distributions with selected color and/or color temperatures. Optical systems can be created using LEDs with lenses, shaped substrate LEDs, or shaped emitter layer LEDs with overlapping illumination patterns. Preferably each lens, shaped substrate or shaped emitter layer in the optical system is configured to conserve radiance and emit light with a high percentage of light in beam. Furthermore, each lens, shaped substrate or shaped emitter layer in an optical system is preferably shaped to create a uniform light distribution pattern.

FIG. 1A is a diagrammatic representation of an embodiment of an optical unit 15. Optical unit 15 can be a shaped substrate LED (as described in U.S. Pat. No. 7,789,531), an LED with shaped emitter layers as described in U.S. Pat. No. 7,829,358 or an LED and separate optical device combination as described in U.S. Pat. No. 7,772,604, each of which is fully incorporated by reference herein. Optical units can use lenses, shaped substrates or shaped emitter layers that conserve radiance or some percentage of radiance (e.g., greater than 50%, greater than 60%, greater than 70% to greater than 90% and approaching 100%). Additionally, optical units can be selected to achieve a high percent of light in beam (e.g., greater than 50%, greater than 60%, greater than 70% to greeter than 90% and approaching 100%) in a range of beam angles (for example, but not limited to full beam angles of 10-120 degrees (full width half maximum)). Because the individual optical devices provide a high percent of light in beam, an array of such optical units can also provide a high percentage of light in beam (e.g., greater than 50%, greater than 60%, greater than 70% to greater than 90% and approaching 100%). In addition, the optical units can be selected so that the optical units provide a uniform illumination pattern.

For purposes of discussion, optical unit 15 can include LED 20 (or an array of LEDs) and lens 25. Light from LED 20 optionally can be down converted by phosphor. If phosphor is used, the phosphor coating may be disposed on lens 25, LED 20 or otherwise disposed between LED 20 and the entrance to the body of lens 25. Lens 25 can be constructed to emit light in a uniform distribution pattern with either a sharp or soft cut off angle, as discussed below, with a high extraction efficiency and percentage of light in beam.

Figure 1B:
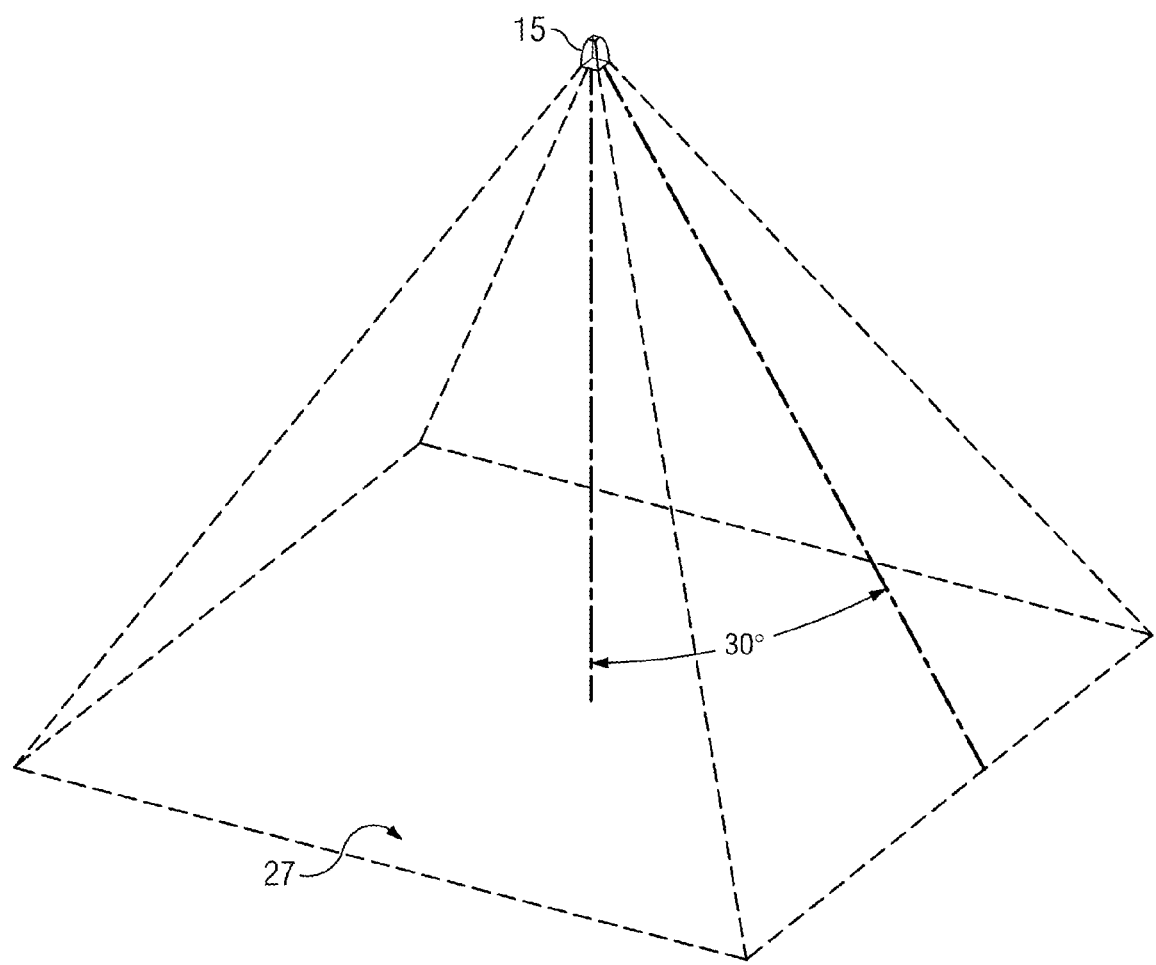

FIG. 1B is a diagrammatic representation of the illumination pattern of the unit 15 with a target surface 27 being a substantial distance away compared to the size of the unit 15 (in this example approximately 20:1). At a distance that is 20 times the size of the lens exit face the lighted field dimension will be 20*2*tan(30)=23 times as wide as the exit face. At this distance the pattern is uniform with well-defined edges.

Figure 2:
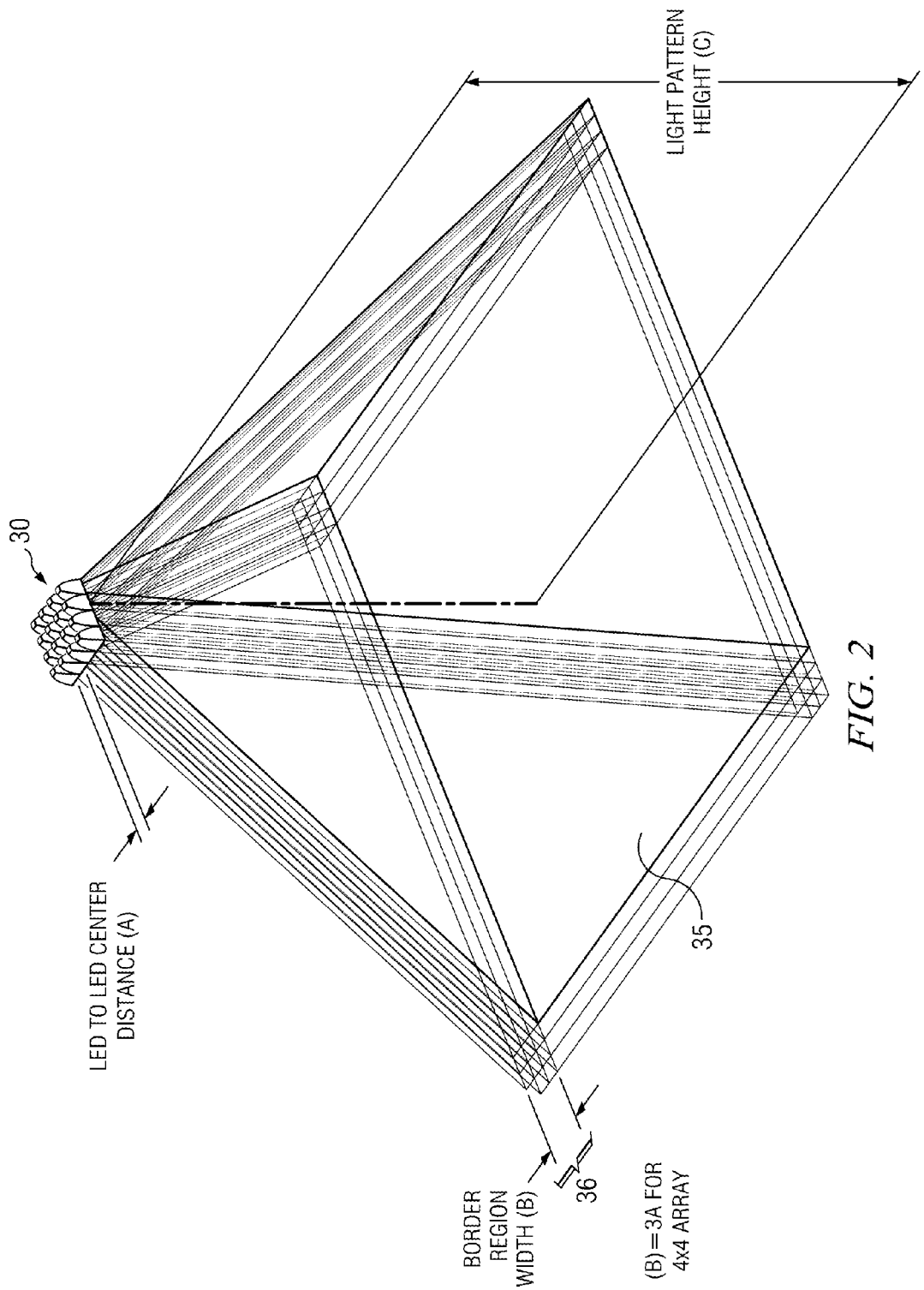
FIG. 2 is a diagrammatic representation of an array of optical units and a resulting light pattern.

FIG. 2 illustrates an array 30 of optical units 15. When one unit is placed next to another, it will have the same field size as the first unit (assuming similar geometries), but the field will be displaced only by the width of the lens exit face (assuming the lenses are closely packed so that there is little or no distance between adjacent lenses). The effect of this is that the optical units 15 emit an overall light profile having an i) overlapping illuminated area 35 illuminated with a mix of chromaticities providing an area of very uniform color and ii) a less uniform border area 36.

As the distance between the illuminated surface and array 30 grows, the illuminated area grows while the width of the border area 36 stays the same size. At far field, border area 36 becomes unnoticeable. Multiple arrays can be arranged such the border areas overlap to create more uniformity in the border areas, leading to a larger illuminated area having a uniform profile. Due to the square or rectangular shape of the illuminated area created by the array 30, multiple arrays can be spaced at desired distances to provide targeted uniform lighting over large areas.

The color of the overlap area 35 can depend on the color emitted by each lens which, in turn, can depend on the LED and phosphor selected. According to one embodiment, each LED can be a blue or ultraviolet LED used in conjunction with a pure phosphor or blend of phosphors so that the corresponding lens emits a desired color light. In other embodiments, some or all of the LEDs selected may emit a desired color light without using a phosphor coating. Thus, for example, some of the LEDs in the array can be blue or ultraviolet (or other color) LEDs used in conjunction with phosphors while other LEDs can be red (or other color) LEDs used without phosphors. Examples of phosphors that can be used include, but are not limited to: garnets doped with $Ce^{3+}$ (such as $Y_3Al_5O_{12}$: Ce, or YAG), silicates doped with $Eu^{2+}$ (such as $(MgSrBa)_2SiO_4$: Eu, or BOS), nitrides doped with $Eu^{2+}$ (such as $(MgCaSr)AlSiN_3$: Eu), and other suitable materials known in the art. These phosphors can be used alone (e.g. YAG or BOS), or in blends as necessary to achieve desired color coordinates and/or color rendering index (CRI) values.

One advantage of using an array of units having blue or ultraviolet chips used in conjunction with a pure phosphor or a phosphor blend is that averaging of chromaticity variation between individual units (due to random differences in phosphor loading or chip wavelength) takes place, and the lamp to lamp color variation is thereby reduced versus that for individual LED components. The yield to the ANSI color bins is consequentially increased.

A further advantage of using an array of units having blue or ultraviolet chips used in conjunction with pure phosphors of different colors (in addition to averaging to color coordinates) is the removal of interactions between phosphors. Such interactions are caused by significant overlapping between the emission spectrum of one phosphor and the excitation spectrum of another, and can lead to reduction in CRI value, efficiency, or both. For example, an array consisting of 8 elements coated with YAG and another 8 elements coated with a red nitride phosphor in a checkerboard pattern has a substantially higher CRI value than a similar array using a blend of the same two phosphors on each lens.

Yet another advantage of using an array of units is the ability to provide "hybrid" solutions with narrow beam angles in which some lenses are coated with phosphor and others are not. For example, one embodiment of an array can use blue or ultraviolet LEDs in conjunction with green-yellow phosphor (such as YAG or BOS) on one set of units, and red LEDs, without phosphor, in another set of units. It has been shown that such a hybrid solution can produce a highly efficient warm white light source with a high CRI (e.g., 90 at 3000K).

According to one embodiment, the phosphors can be selected and LEDs controlled so that the combined output in overlap area 35 has a desired spectral power distribution and color coordinates to achieve desired x and y values in the 1931 CIE chromaticity diagram. In particular, the color coordinates of an array can lie on or near the Planckian locus, thereby producing various shades of white light (e.g. "cool" white, "neutral" white, or "warm" white). Desirable regions around the Planckian locus in the chromaticity diagram are defined by the ANSI C78.377-2008 chromaticity standard, over a range of correlated color temperature (CCT) values. However, embodiments described herein may be used to achieve any color coordinates.

By using units emitting various colors (with or without phosphor added), one can achieve dynamic color control of the light (e.g. by using an RGB approach), or a dynamic white light changing from warm to neutral to cool (and back if necessary) over the course of the day, as a few examples. The use of optical units constructed to emit uniform light in a controlled beam angle allows for excellent color mixing (with no diffuser-associated losses) and superior beam angle control at the same time.

Arrays that provide color mixing can be used for industrial, commercial/office, residential, governmental, health care, hospitality or other applications. By way of example, but not limitation, arrays of optical units can be used for the following applications: aquaponic lighting, horticulture lighting, aquaculture lighting, aquarium lighting, food processing lighting, poultry/livestock lighting, automotive lighting, avionics lighting, railway lighting, runway lighting, parking lot lighting, parking garage lighting, street lighting, ship lighting, dock and pier lighting, correctional facility lighting, hazardous location lighting, sports lighting, site lighting, theme park/amusement park lighting, casino lighting, stage/theatrical lighting, museum lighting, emergency lighting, security lighting, vandal proof lighting, landscape lighting, accent lighting, downlights, tail lighting, backlighting, under cabinet lighting, area lighting, billboard lighting, signage lighting, medical/dental lighting, cold storage lighting, architectural façade lighting, fountain lighting, in-grade lighting, retail lighting and other lighting applications. Arrays of optical units can be used in a number of lighting devices including, but not limited to light bulbs, replacement lamps, channel lights, reading lights, flashlights, spot lights, instrumentation lighting, microscope lights, machine vision lights, electronic display lights and other devices.

Figure 3A:
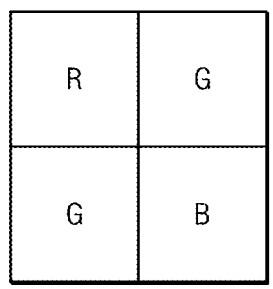
FIGS. 3A-3C are diagrammatic representations of arrangements of color light sources.
Figure 3B:
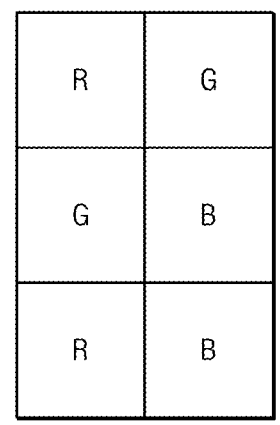
Figure 3C:
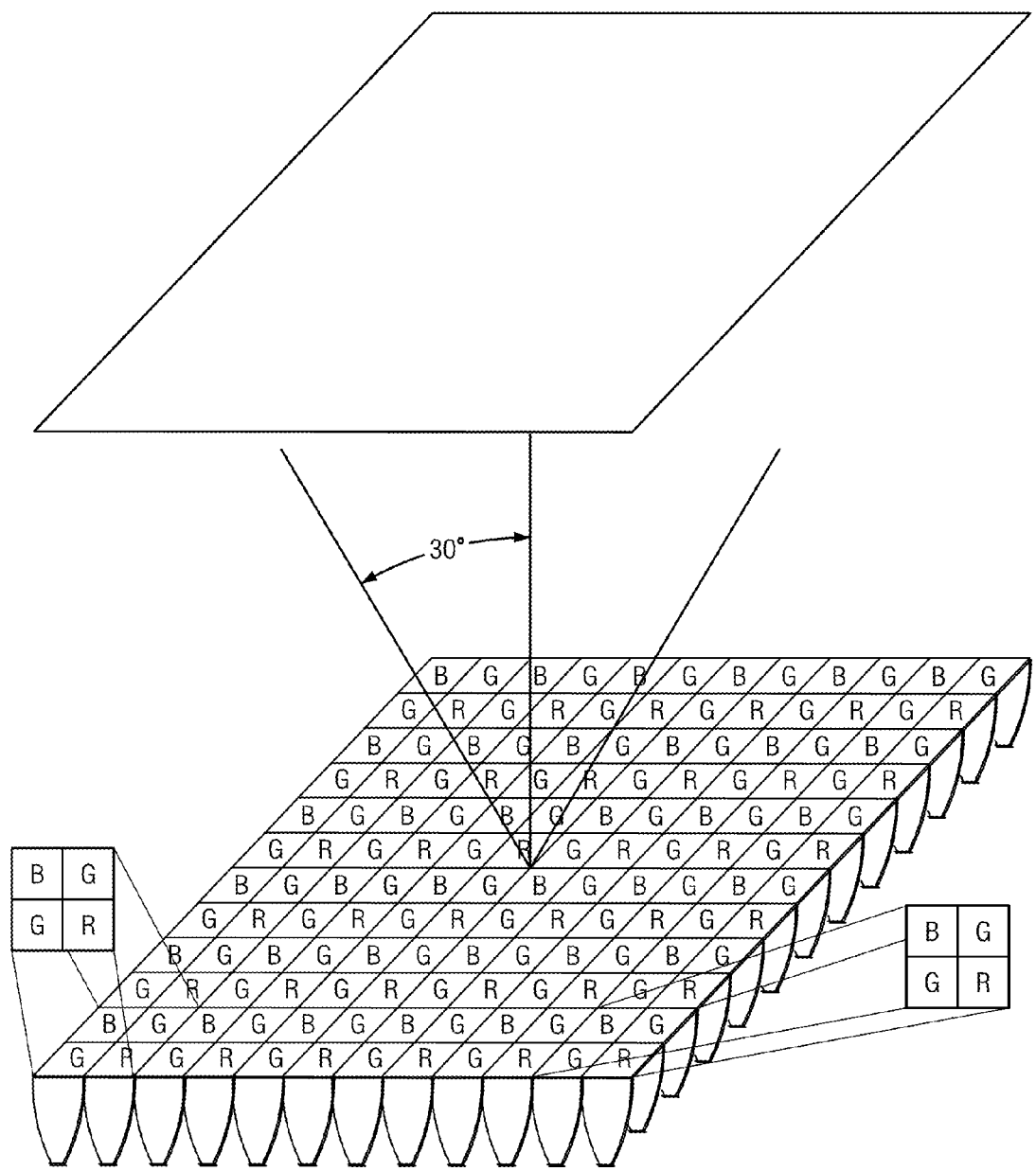

FIGS. 3A-C illustrate arrangements of color optical systems to produce white light units. Each white light unit contains color light sources that emit light of a selected color so that the blended light produces white light. In FIGS. 3A-C, for example, the white light units include 2 green sources, one red source and one blue source. White light units may share overlapping color sources (e.g., in FIG. 3C, one green source and the blue source are shared between white light units). Each color source of FIGS. 3A-C may be a single optical unit emitting a selected color or may be an array acting together to produce a desired color light. In the latter case, arrays can be constructed that emit a selected color of light and arrays emitting different colors can be combined to form a white light unit. While the example of a white light unit is used, arrays can used to produce other colors of light.

Figure 4:
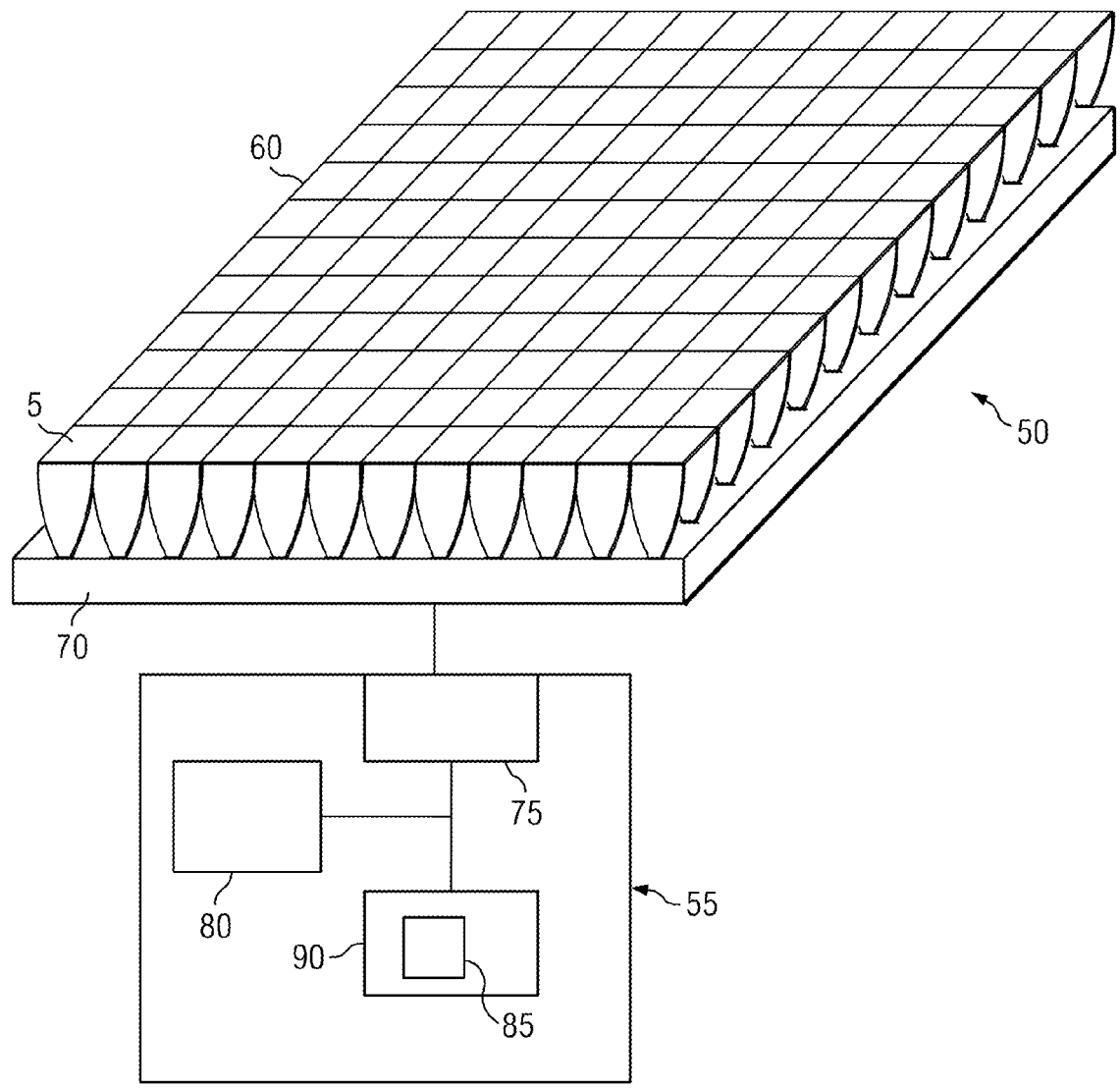
FIG. 4 is a diagrammatic representation of an embodiment of an array of optical units and a controller.

FIG. 4 is a diagrammatic representation of one embodiment of a system 50 comprising a display controller 55 and an array 60 of units 15. System 50 can comprise a circuit board 70 to which the LEDs of units 15 are electrically connected. According to one embodiment, the units 15 can be arranged to form white light units. Controller 55 can include an interface 75 that is electrically connected to the LEDs to send control signals to the LEDs. A processor 80 can execute a set of instructions 85 stored in a computer readable memory 90 to generate control signals to the LEDs. The intensity of the LEDs can be individually controlled to alter the color produced by white light units. In another embodiment, arrays of units may be controlled. Thus for example, controller 55 may control an array of multiple units to adjust the intensity of the array as a whole, rather than controlling individual units in the array. Controller 55 can be implemented as a separate control module, a microprocessor and related hardware, an ASIC and related hardware, or other hardware and/or software suitable to control LEDs. The instructions can be implemented as firmware, software or hardware or according to any other suitable architecture.

Figure 5:
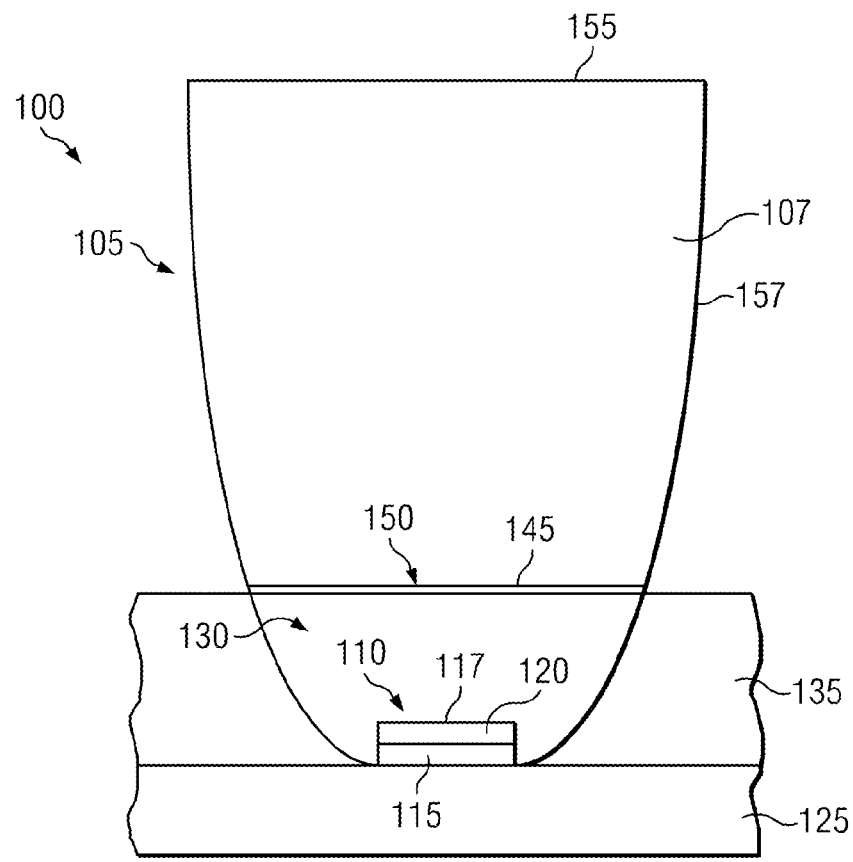
FIGS. 5-8 are diagrammatic representations of embodiments of optical systems.
Figure 6:
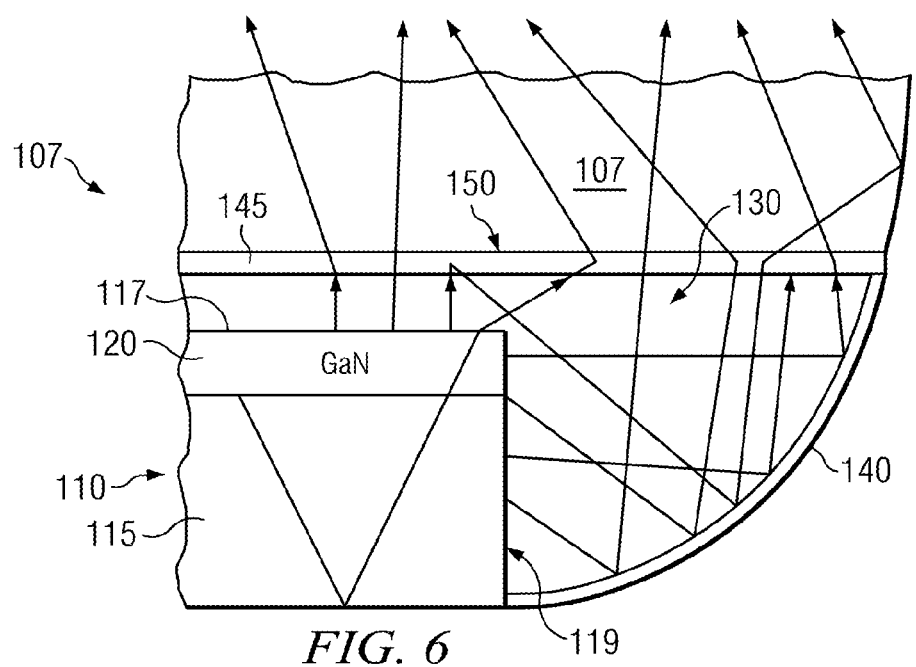
Figure 8:
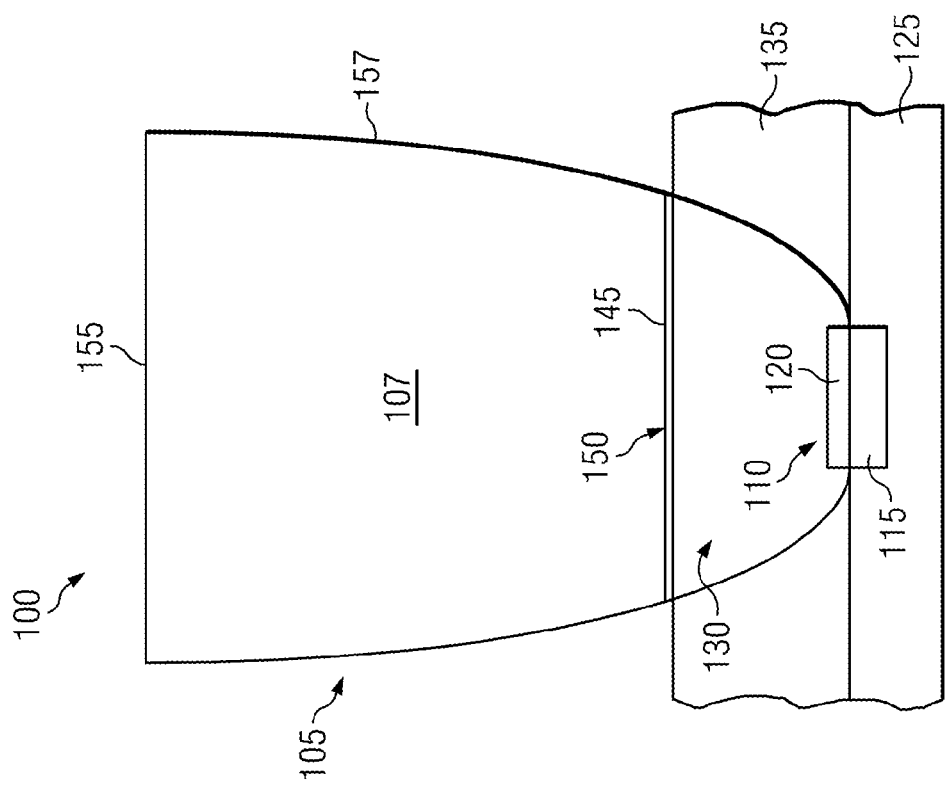
Figure 7:
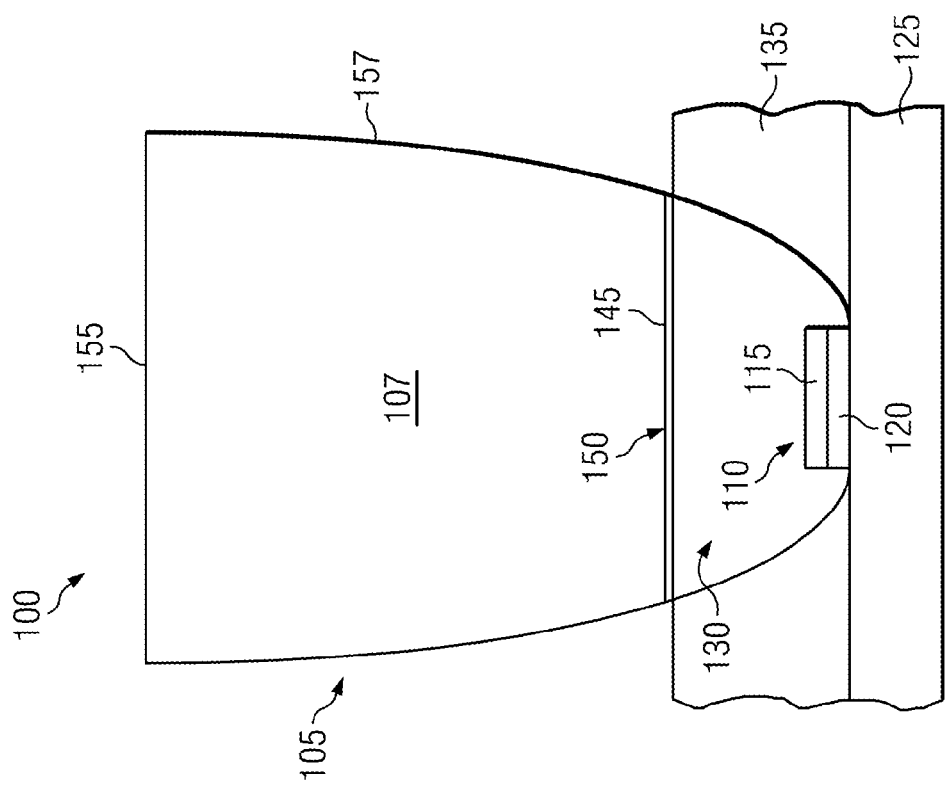

The following discussion provides various examples of embodiments of optical systems that can be used to provide color mixing. However, other optical systems may also be used. FIGS. 5-8 are diagrammatic representations of optical units comprising a lens 105 separated by a gap from an LED 110. The LED can be a lateral LED as shown in FIGS. 5 and 6, a flip-chip LED as illustrated in FIG. 7, a vertical LED as illustrated in FIG. 8 or any other suitable type of LED or light source. LED 110 can include a substrate 115 of any suitable LED substrate material including sapphire, silicon carbide, diamond, molded glass or other substrate material. Additionally, LED 110 can have non-substrate layers 120 that can include one or more layers or regions of doping, buffer layers or other layers. Non-substrate layers 120 can include a light emitting region (or active region), typically a compound semiconductor such as InGaN or AlInGaP or AlGaN. LED 110 can be rectangular (including square), hexagonal, circular or have another geometric or irregular shape.

LED 110 is mounted to a submount 125. Submount 125 can include the electrical substrate and/or any other electrical, thermal or support layers to which the LED is bonded. According to one embodiment, submount 125 that can be made of a material with high thermal conductivity to spread and conduct the heat produced by LED 110. Any suitable submount known or developed in the art can be used. LED 110 is disposed in an LED cavity 130 defined by housing 135. Housing 135 can be a portion of a larger housing, a layer(s) of material mounted on submount 125 or other material positioned around LED 110 that forms a cavity in cooperation with submount 125 or other layer. For example, according to one embodiment, material 135 can be a layer of molded plastic mounted to submount 125.

LED cavity 130, according to one embodiment, can have straight sidewalls that are parallel to the sides of the LED (i.e., vertical from the perspective of FIG. 5). In other embodiments, the walls of LED cavity 130 can be curved (e.g., parabolic, multi-parabolic or other curved shape), tapered or otherwise shaped to better direct light upwards. LED cavity 130 can be filled with air, molded silicone, silicone mixed with phosphor particles, molded plastic, or other encapsulant. Using a material having a higher index of refraction than LED 110 can prevent light from being trapped in LED 110 due to total internal reflection ("TIR") in LED 110, thereby allowing more light to escape into LED cavity 130.

A reflector 140 (see FIG. 6) disposed around LED 110 can reflect light toward lens 105. In some embodiments, reflector 140 can be a discrete component. By way of example, but not limitation, the reflector can be Teflon, Teflon paper, diffuse reflective plastic, silver coated plastic, white paper, TiO2 coated material or other reflective material. In another embodiment, reflector 140 can be formed through selection of material 135 or the encapsulant. For example, material 135 can be a white plastic material such that the walls inherently form a diffuse white reflector. In another embodiment, reflector 140 can be formed by the surface tension of an encapsulant disposed in LED cavity 130.

In some cases, an LED may only leak light out the sides of some portions of the LED. In the embodiment of FIG. 8, for example, the substrate 115 may include non-transparent sides such that LED 110 does not emit light from the sides of its substrate 115. Consequently, the optical system can be constructed so reflector 140 only surrounds the side portions of LED 110 through which light is emitted.

Lens 105 can include an entrance face 150 to receive light into the lens body 107 of lens 105. According to one embodiment, entrance face 150 can be parallel to the primary emitting plane of LED 110 (e.g., a plane parallel to face 117 in FIG. 6). In other embodiments, the entrance face can have another orientation (e.g. perpendicular) relative to the primary emitting plane of the LED. It should be noted, however, lens 105 can include additional layers, such as buffer or protective layers, that light may traverse prior to entering entrance face 150 of lens body 107.

A phosphor layer 145 can be disposed on lens 105 between the entrance face of lens body 107 and LED 110. The phosphor layer can be disposed directly on the entrance face 150 or on a buffer layer between phosphor layer 145 and entrance face 150. The phosphor in phosphor layer 145 absorbs the higher energy, short wavelength light waves, and re-emits lower energy, longer wavelength light. Light emitted by phosphor layer 145 can enter the lens body 107 through entrance face 150.

According to one embodiment, phosphor layer 145 can include a layer of phosphor particles in a binding material, such as silicone, coated on the entrance face 150 of lens body 107. The phosphor particles can include any suitably sized phosphor particles including, but not limited to, nano-phosphor particles, quantum dots, or smaller or larger particles and can include a single color or multiple colors of phosphor particles. In other embodiments, the phosphor layer 145 can be separated from the entrance face 150 of lens body 107 by one or more buffer layers. There may also be additional layers of material such that, for example, phosphor layer 145 is sandwiched between entrance face 150 and one or more additional layers of material. Materials and adhesives can be selected with indexes of refraction such that losses do not occur or are minimized at layer boundaries. The phosphor can be disposed using any technique known or developed in the art including, but not limited to, silk screening, stencil printing pad printing, syringe dispense or jetting.

The color of light emitted by a unit 100 can be selected based on LED 110 and the phosphor particles in phosphor layer 145. For example, LED 110 can be a UV LED and phosphor layer 145 can include phosphors that down convert UV light to red, green, blue, yellow or other color light. In another example, LED 110 can be a blue LED and phosphor layer 145 can down convert the blue light into a desired color. Reflector 140 can be selected to reflect both the color light emitted by the LED 110 and the down converted light from phosphor layer 145.

Lens 105 is positioned so that phosphor layer 145 is maintained a distance from LED 110. The position of lens 105 can be maintained by using a housing, coupling lens 105 to encapsulant in LED cavity 130 or otherwise positioning lens 105 relative LED 110. If lens 105 is adhered to an encapsulant, an adhesive with an index of refraction equal to or greater than that of the encapsulant can be used to prevent TIR at the encapsulant/adhesive boundary.

Lens 105 can act as a light guide to guide light from entrance face 150 to exit face 155. Examples of a lens 105 that can utilize TIR at shaped sidewalls 157 to guide light to exit face 155 are described below and in U.S. Pat. No. 7,772,604 which is hereby fully incorporated by reference herein. Lens 105 can be a separate optical device designed so that all the light can be extracted out exit face 155 (not accounting for Fresnel losses) in the smallest package design possible through selection of exit face area 155, distance between the exit face 155 and entrance face 150 and the design of sidewalls 157. Other embodiments can be shaped to have different sizes or achieve different extraction efficiencies. For example, according to one embodiment, lens 105 can be configured such that at least 70% of the light entering lens body 107 at entrance 150 exits exit face 155. Additionally, the lens 105 can be selected to provide a uniform light distribution and to emit light in a desired half-angle.

In operation, LED 110 produces light that can exit LED 110 from surface 117 (see FIG. 6) and sides 119 (see FIG. 6). Reflector 140 acts as a redirecting lens to redirect light escaping sides 119 to entrance surface 150 of lens body 107. When the light is incident on phosphor layer 145, phosphor layer 145 down converts the light and emits light into lens body 107 and back into LED cavity 130. Reflector 140 can again direct the light in LED cavity 130 to entrance face 150. Lens body 107 guides light entering entrance face 150 from phosphor layer 145 to exit face 155. If lens body 107 provides light in a uniform distribution in a desired half-angle, lenses are not required to shape the beam. Consequently, color conversion and beam shaping can be achieved with a single lens.

One consideration is that phosphor can heat up to a temperature of approximately 150 degrees Celsius during use. Consequently, lens body 107 can be constructed of a material that can withstand continuous use at this temperature. In another embodiment, a buffer layer of silicon or other material capable of withstanding high temperatures can be introduced between the phosphor layer 145 and entrance face 150 of lens 105. While thicker or thinner buffers can be used, one embodiment can include a layer of silicon that is 100 to 200 microns thick. This can allow, for example, a broader range of polycarbonates to be used for lens body 107.

Figure 9:
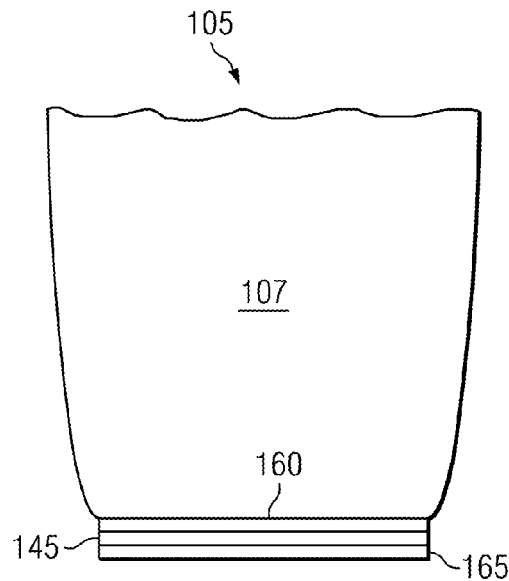
FIGS. 9-10 are diagrammatic representations of embodiments of phosphor coated lenses.
Figure 10:
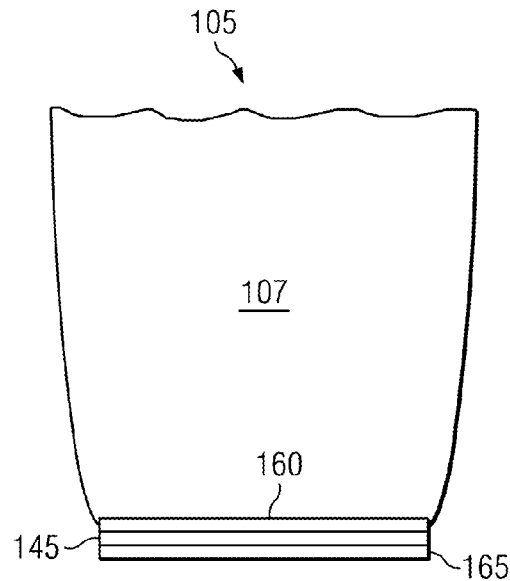

FIGS. 9 and 10 are diagrammatic representations of embodiments of lens 105 having body 107, a buffer 160 layer and phosphor layer 145. The buffer layer can be a suitable, high temperature material such as silicon or other material that can withstand the operating temperatures of the selected phosphor layer 145. In one embodiment, buffer 160 can be adhered to or otherwise coupled to the bottom of lens body 107 or, as shown in FIG. 9, all or a portion of buffer 160 can rest in a pocket formed at the entrance face of lens 105. The phosphor layer can be disposed on lens 105 as a coating on buffer layer 160. FIGS. 9 and 10 also illustrate an adhesive layer 165 to adhere lens 105 to an encapsulant in LED cavity 130 (FIGS. 5-8).

Embodiments described herein provide an advantage over traditional systems of using phosphors with LEDs because the phosphor is removed a distance from the LED. Because the phosphor is located at the entrance of the lens, there is high coupling efficiency. Additionally, self-heating of the phosphor due to Stokes shift can be reduced because heat can be dissipated through the material of lens 140, housing 135 and/or submount 125. Higher phosphor conversion efficiency can also be achieved due to low flux density at the entrance face 150 of lens 105.

The distance between phosphor 145 and LED 110 can be optimized to provide an optimal balance between thermal considerations and effective phosphor package efficiencies. While any suitable gap size can be used as needed or desired, one embodiment of an optical system has a gap of 100-200 microns between surface 117 (see FIG. 6) and phosphor layer 145.

Additionally, embodiments described herein provide for flexible optical system architectures. Because the phosphor coated lens can be separate from the LED chip, it can be used in conjunction with various types of optical devices, including conventional light emitting devices. Furthermore, LEDs 110 can be used with a variety of different lens types depending on need.

According to one embodiment, an array of lenses 105 can be formed where each lens 105 is selected to emit light in a desired half-angle having a uniform distribution in near and far fields. The lenses 105 can be tightly packed, that is spaced so that there are no perceivable gaps between emitted light for adjacent lenses 105. Because the emitted light from each lens 105 is uniform and in a desired half-angle, the light output of the array will be in the desired half-angle with uniform near and far field distributions, but covering a larger area than the light emitted by a single lens with no dark spots or ghosting. This provides a very practical benefit for display or lighting manufacturers because additional optics are no longer required to get light from an LED array using phosphors into a desired angle.

Figure 11:
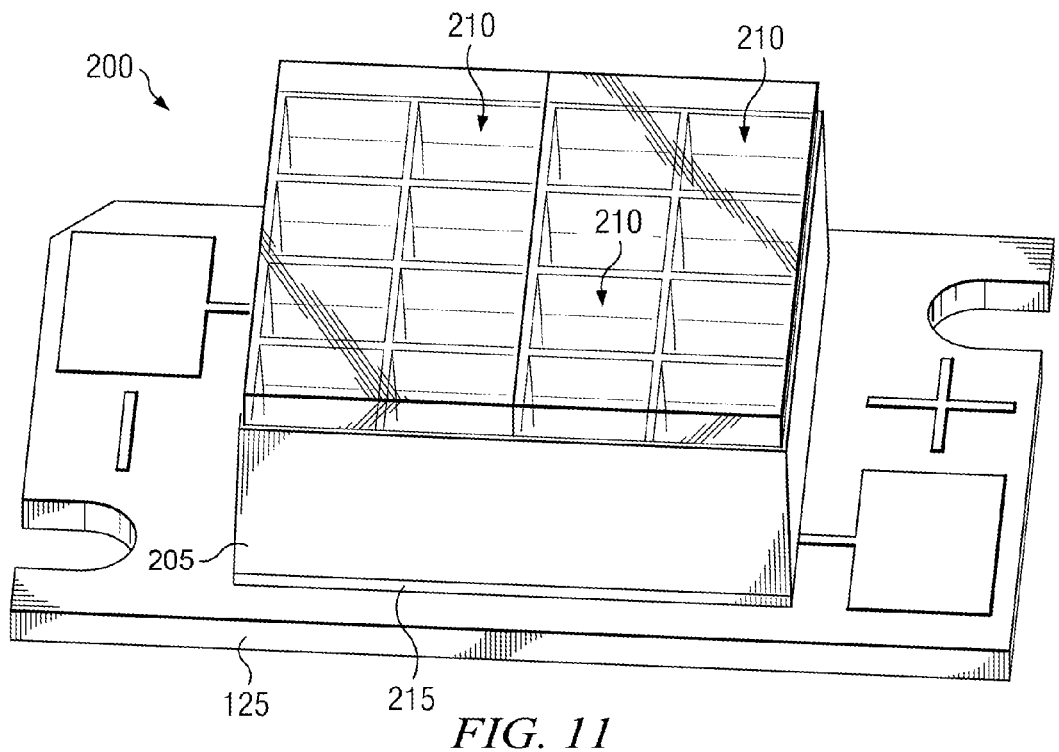
FIG. 11 is a diagrammatic representation of one embodiment of a packaged array.

FIG. 11 is a diagrammatic representation of one embodiment of a packaged array 200. In the embodiment of FIG. 11, packaged array 200 comprises submount 125, main housing 205 and cover 210. Submount 125 provides mechanical support and electrical connections for LEDs. Embodiments of submount materials include, but are not limited to: Low Temperature Cofire Ceramic (LTCC) with thermal vias, High Temperature Cofire Ceramic (HTCC) with thermal vias, Beryllium Oxide (BeO) ceramic, Alumina ceramic, Silicon, Aluminum Nitride (AlN), Metal (Cu, Al, etc.), and Flex circuit.

Main housing 205 can be formed of suitable materials including, but not limited to, plastic, thermoplastic, and other types of polymeric materials. Composite materials or other engineered materials may also be used. In some embodiments, main housing 205 may be made by a plastic injection molding manufacturing process. Various molding processes and other types of manufacturing processes may also be used. In some embodiments, main housing 205 may be opaque. In some embodiments, main housing 205 may be transparent or semi-transparent. Main housing 205 can be bonded or otherwise coupled to a layer of material 215 to complete the housing about the LEDs and lenses. In other embodiments, the housing can be formed of any number of layers or pieces of suitable material that will not unacceptably deform during operation due to heating and can protect the LEDs and lens for expected contact or shock during use, transportation or manufacture.

In the embodiment of FIG. 11, packaged array 200 is a 4×4 array and each group of 4 lenses shares a cover 210. In other embodiments a single cover 210 can be used for all lenses or each lens can have its own cover 210. Cover 210, according to one embodiment, can have a sufficient thickness to prevent the lenses from becoming damaged during handling of packaged array 200.

Figure 12:
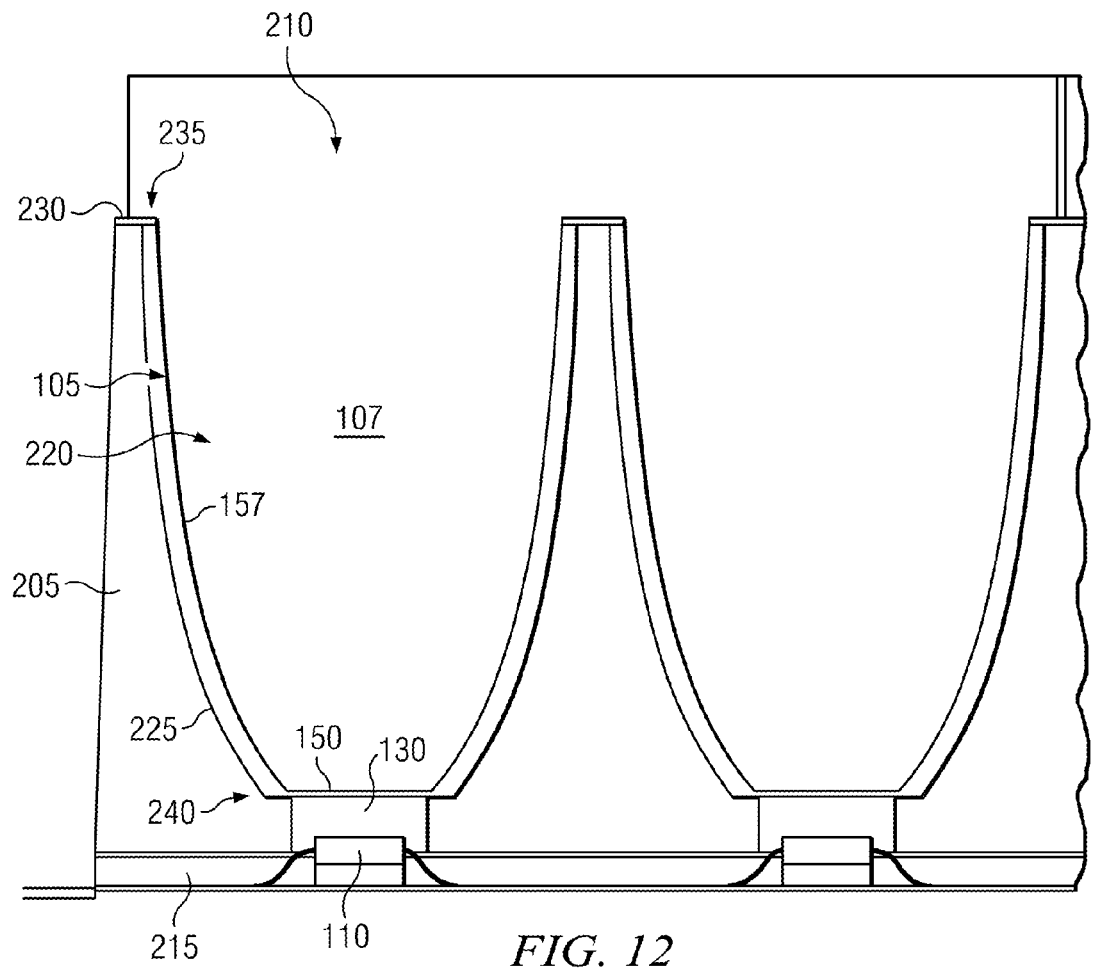
FIG. 12 is a diagrammatic representation of a cross-section of an embodiment of a packaged array.

FIG. 12 is a diagrammatic representation of a cross-sectional view of one embodiment of packaged array 200 illustrating main housing 205, lens 105, cover 210, LED 110, LED cavity 130, housing layer 215 and submount 125 (only one instance of each is indicated for clarity). In the embodiment of FIG. 12, cover 210 is integrated with lens 105 such that they form a single lens assembly. Cover 210 can be integrated with other lenses 105 so that a single lens assembly will have a cover portion and multiple lens portions. The body 107 of lens 105 and cover 210 can be made of a single piece of molded plastic, polycarbonate, PMMI or other material. In other embodiments, cover 210 can be coupled to lens 105 using an adhesive. Cover 210 also may simply be in contact with lens 105 or may be separated from lens 105 by a gap. In other embodiments, shape of lens body 107 can be selected to account for the transition into cover 210.

Cover 210 can be an optically transparent material, such as a plastic, glass, composite material, or other material and may include one or more layers. Additionally, cover 210 may include layers of material to perform photon conversion (e.g., an additional phosphor layer), filtering or other functions with respect to light exiting lens 105.

Main housing 205 forms a lens cavity 220 sized to fit lens 105. The sidewalls 225 of lens cavity 220 can be curved to match or approximate the sidewall shapes of lens 105 so that the size of lens cavity 220 is smaller proximate to the corresponding LED cavity 130 and larger distal from LED cavity 130. In other embodiments, the sidewalls 225 can be vertically straight (from the perspective of FIG. 12) or can be tapered. Sidewalls 225 can include reflective coatings or other coatings to reflect any light leaking from the sides of lens 105 to the exit of cover 205. In another embodiment, main housing 205 can be formed of white plastic or other color material so that sidewalls 225 form reflectors.

According to one embodiment, lens cavity 220 can be sized so that there is a gap between the sidewalls of lens body 107 and sidewalls 225 of lens cavity 220 to preserve TIR in lens body 107. The size of the gap can be constant or can increase or decrease further from the base of lens cavity 220. The gap can be filled with air or other material. Preferably, the material has the same or lower index of refraction than body 107 of lens 105. In other embodiments, sidewalls 225 can contact sidewalls of lens body 107 and act as a reflector for light in lens body 107.

Main housing 205 can include a shoulder 230 on which ledge 235 of cover 210 rests. An adhesive, mechanical fasteners or other suitable fastening mechanism can be used to couple cover 210 to main housing 205. In other embodiments a secondary structure, such as a clamping structure, can maintain cover 210 against main housing 205.

According to one embodiment, by coupling cover 210 to main housing 205, lens 105 is held in a desired position in lens cavity 220. In this case, lens 105 may not require additional attachment to housing 205. In other embodiments, a portion of lens 105 can be adhered to or otherwise coupled to a shoulder 240 at the base of lens cavity 220 or other portion(s) of lens 105 can be coupled to main housing 205.

Main housing 205 defines a portion or all of LED cavity 130 in cooperation with submount 125 and housing layer 215. Although LED cavity 130 is shown with vertical sidewalls, LED cavity 130 can have tapered, curved or otherwise shaped sidewalls to act as a redirector lens. The opening to LED cavity 130 can have the same shape as and be rotationally aligned with LED 110 or can have another shape or alignment.

A phosphor layer can be disposed proximate to entrance face 150 such that light exiting LED cavity 130 will be incident on the phosphor layer. The phosphor layer down converts light before the light enters lens body 107. The down converted light is guided through lens 105 and exits cover 210. Entrance face 150 of lens body 107 can be the same shape as and be rotationally aligned with the opening to LED cavity 130 or have another shape or alignment.

Figure 13:
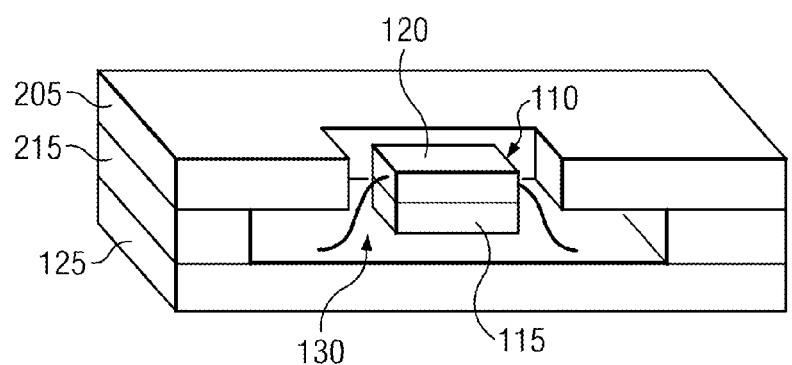
FIG. 13 is a diagrammatic representation of an LED in a cavity.

FIG. 13 is a diagrammatic representation of a cutaway view of one embodiment of an LED cavity 130. Submount 125 forms the base of the cavity, while the sidewalls are formed by main housing 205 and layer 215. According to one embodiment, a portion of LED 110 can extend into the portion of LED cavity 130 defined by main housing 205. For example, the non-substrate layers 120 including the active region of the LED may extend into this opening or, in a flip chip design, the substrate 115 may extend into this portion. LED cavity 130 can become larger closer to submount 125 to accommodate electrical connections or otherwise provide space around LED 110. While portions of submount 125, layer 215 and main housing 205 are shown, the packaged array 200 can include additional layers that define cavity 130.

Figure 14:
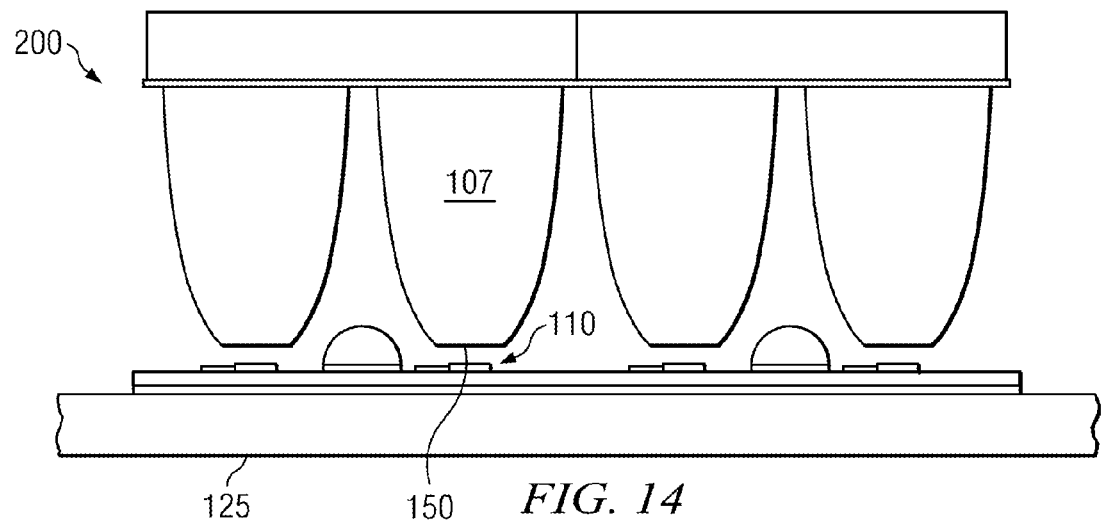
FIG. 14 is a diagrammatic representation of a portion of an embodiment of a packaged array.

FIG. 14 is a diagrammatic representation of packaged array 200 with main housing 205 removed. It can be noted in FIG. 14 that the entrance face 150 to lens body 107 is maintained a distance away from the corresponding LED 110. Consequently, any phosphors disposed on or near the entrance face will also be separated from LED 110.

Figure 15:
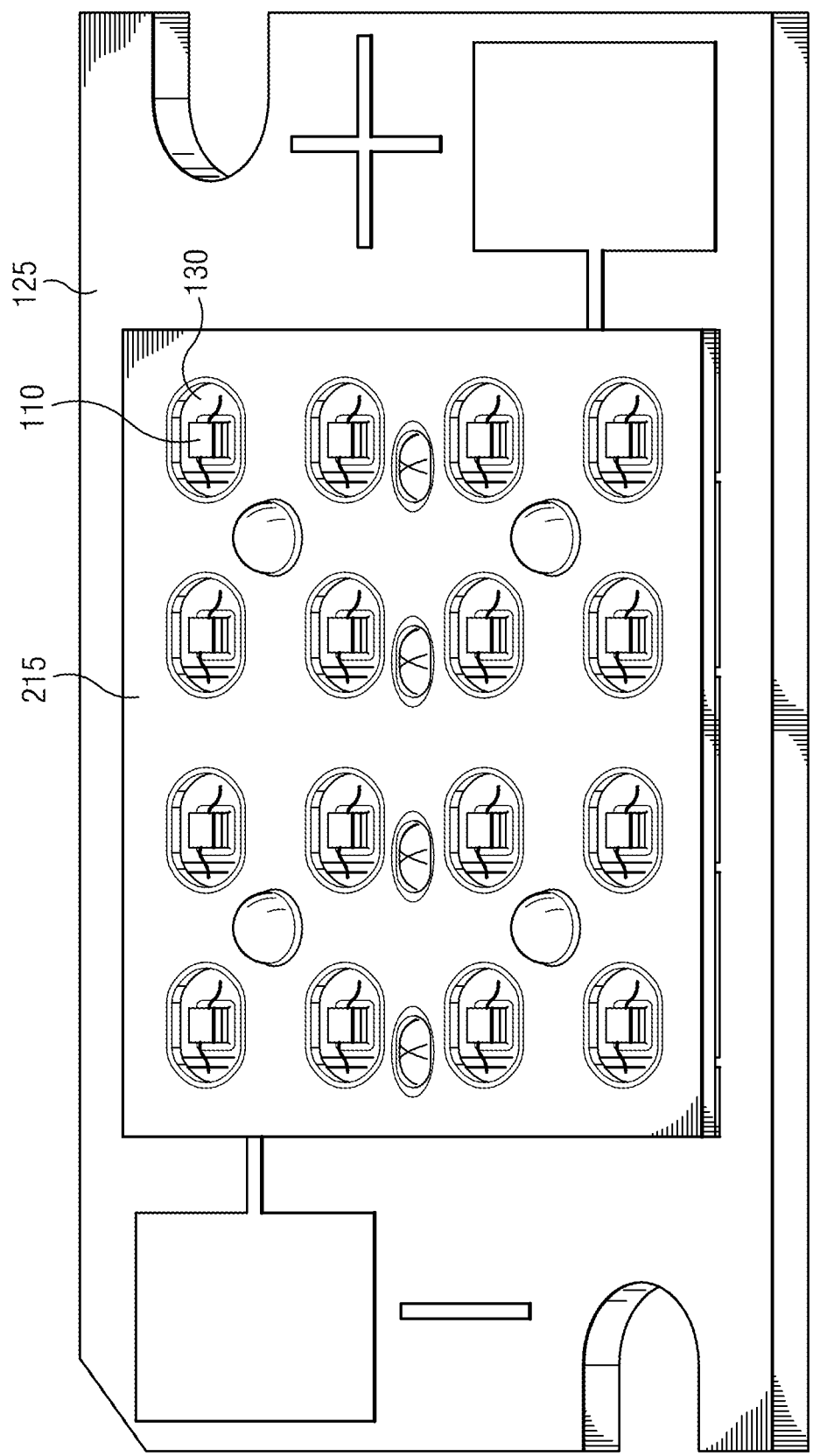
FIG. 15 is a diagrammatic representation of another portion of an embodiment of a packaged array.

FIG. 15 is a diagrammatic representation of one embodiment of a portion of packaged array 200 having layer 215 and submount 125 forming separate LED cavities 130 for each LED 110. While, in the embodiment of FIG. 15, LED cavity 130 has straight vertical sidewalls, LED cavity 130 can have curved, tapered or otherwise shaped sidewalls and can act as a reflector. The area of LED cavity 130 defined by layer 215 can be larger than that defined by main housing 205 to accommodate electrical connections or to otherwise provide space around LED 110. In other embodiments, the cavity can have a uniform size or become wider as it approaches lens 105. Cavity 130 can be entirely or partially filled with an encapsulant, air, silicone or other filler material. Layer 215 can be adhered or otherwise coupled to submount 125.

Figure 16:
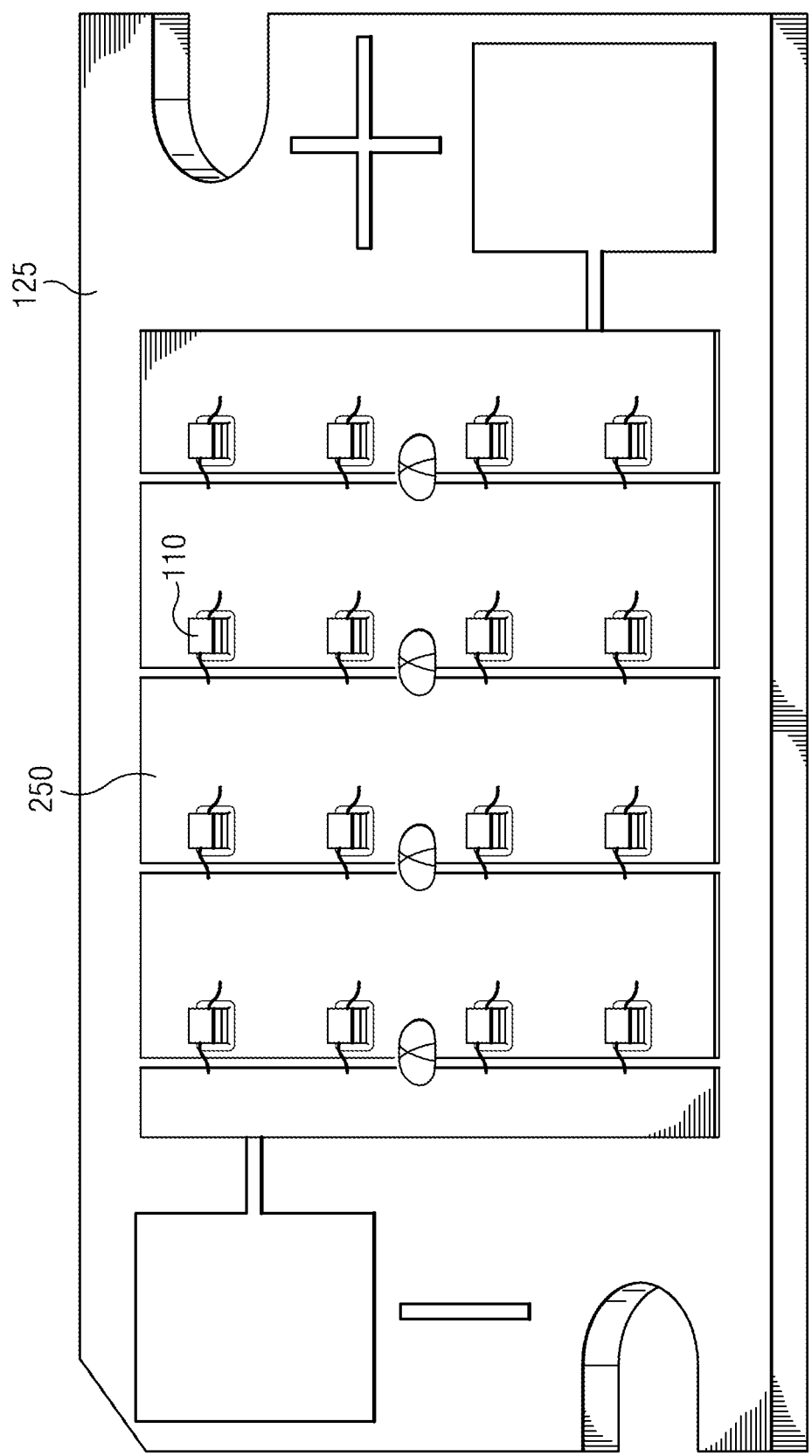
FIG. 16 is a diagrammatic representation of an array of LEDs mounted on a submount.

FIG. 16 is a diagrammatic representation of one embodiment of LEDs 110 mounted on submount 125. Submount 125, as illustrated in FIG. 16, can provide support for LEDs 110 and provide electrical connections 250. Electrical connections can be provided using suitable metals or other conductors. While a particular pattern and type of electrical connection are illustrated, any suitable electrical connections to LED 110 and submount 125 can be provided.

Figure 17:
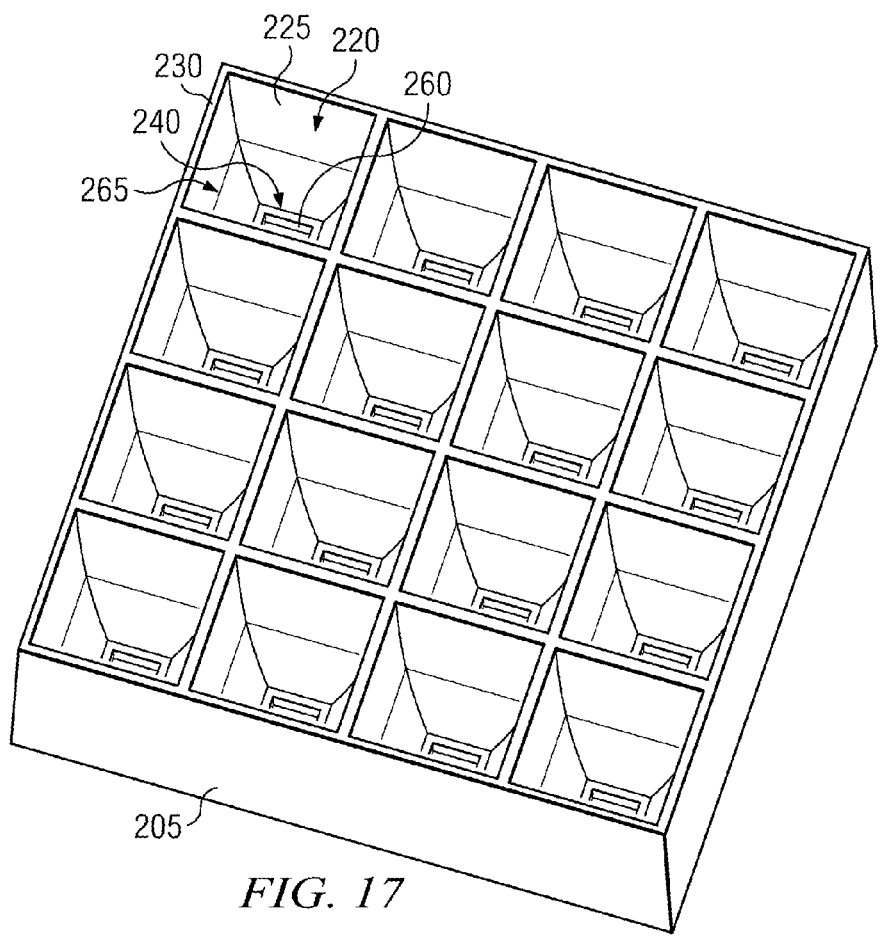
FIG. 17 is a diagrammatic representation of an embodiment of a portion of a housing of a packaged array.

FIG. 17 is a diagrammatic representation of one embodiment of main housing 205 defining lens cavities 220 sized to fit lenses 105. Lens cavity 220 extends from an opening 260 to LED cavity 130 to a second opening 265. The sizes of the openings can have, according to one embodiment, a ratio that is the same as the size ratio of the exit face to entrance face of the lens. In another embodiment, opening 260 may be approximately the same size as the entrance face to the lens 105 while opening 265 is larger than the exit face. Sidewalls 225 can be curved, tapered, vertical or have another selected shape. A shoulder 230 provides a surface to which cover 210 can be coupled.

In the embodiment of FIG. 17, main housing 205 forms a 4×4 array. However, main housing 205 can accommodate larger or smaller arrays or a single optical system. Additionally, main housing 205 can be shaped to accommodate circular, hexagonal or other shaped lenses 105 in a tightly packed array. Although only one array is shown, multiple arrays can be arranged on the same substrate.

Figure 18:
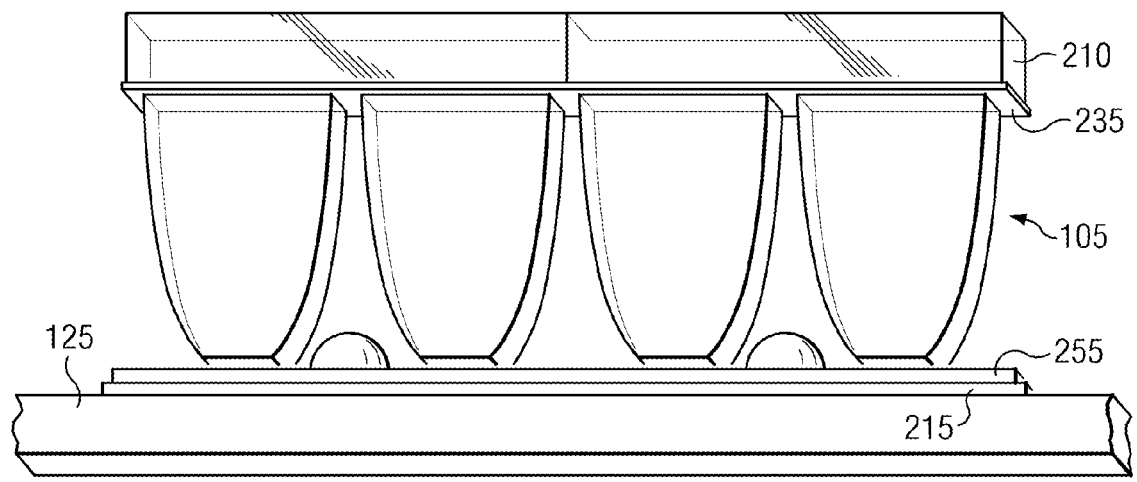
FIG. 18 is a diagrammatic representation of a portion of another embodiment of a packaged array.
Figure 19:
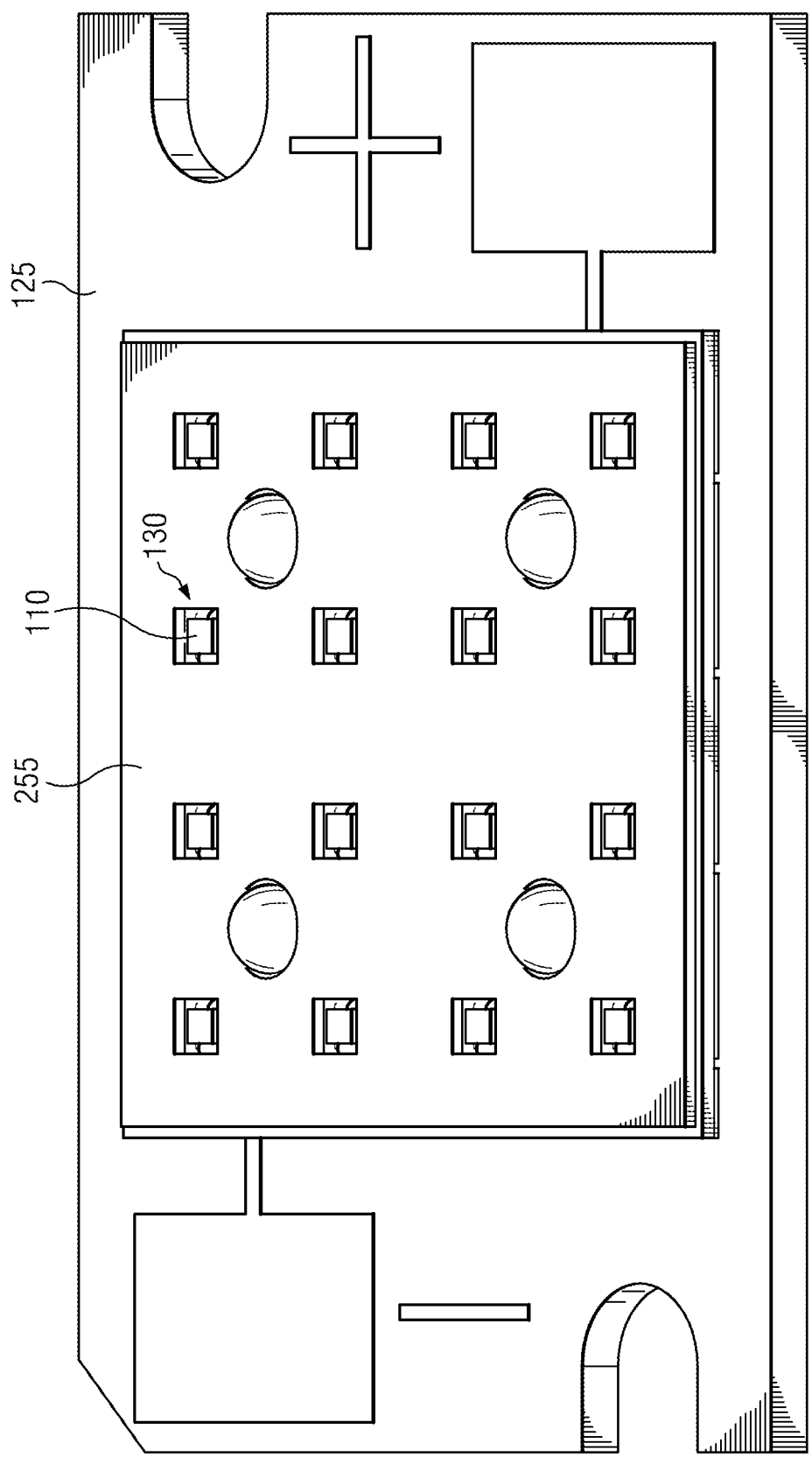
FIG. 19 is a diagrammatic representation of another portion of the embodiment of the packaged array.

FIG. 18 is a diagrammatic representation of another embodiment of a packaged array with the housing removed similar to that of FIG. 14, but including layer 255. FIG. 19 is a diagrammatic representation of one embodiment of a portion of a packaged array 200 with lenses 105 and cover 210 removed illustrating that layer 255 can define a portion of and provide an opening to LED cavity 130.

A portion of the cavity that houses LED 110 can be formed by layer 255 rather than the main housing 205. In this case, housing layers 255 and 215 can define the lens cavities 130, while layers 215 and 255 define the LED cavities. Layers 215 and 255 can include any suitable materials including plastics or other materials. Layer 255 can be inset from layer 215 to form a ledge to which main housing 205 can be bonded. The use of layers 215 and 255 can ease manufacturability by providing a mechanism by which to align main housing 205.

Figure 20:
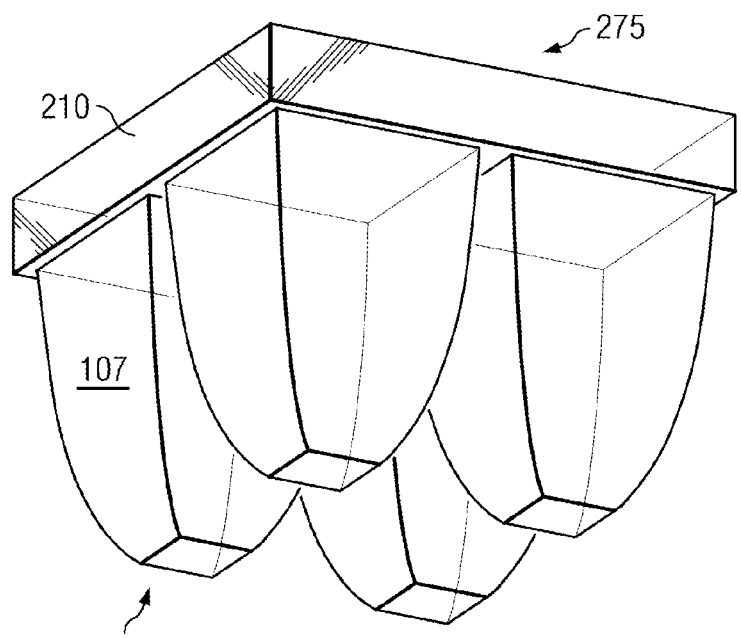
FIG. 20 is a diagrammatic representation of an embodiment of a lens assembly.

FIG. 20 is a diagrammatic representation of a lens assembly 275 comprising a set of lenses 105 and a lens cover 210. According to one embodiment, the lens bodies 107 and cover can be a unitary piece of material.

Each lens 105 can be a phosphor coated lens selected to emit a desired color light. If more than one phosphor lens is used in a system, multiple types of phosphors may be used to achieve the desired color temperature and CRI. For instance, three yellow phosphor lenses and one red phosphor lens may be used in conjunction with a blue pump to attain warm white light. As another example, in the 2×2 array of lenses shown, each lens can emit red, green or blue light. The light from lenses 105 can be combined to form white light. Since each of the four phosphor lens can emit to the same far field distribution, the colors will undergo superposition and will not bleed or create ring-like effects.

In yet another embodiment, each assembly 275 can emit a different color of light. In a 4×4 array as shown in FIG. 17, for example, four lens assemblies 275 can be used. One lens assembly 275 can emit blue light, one assembly 275 can emit red light and two assemblies 275 can emit green light such that the array as whole acts as a white light source.

Figure 21:
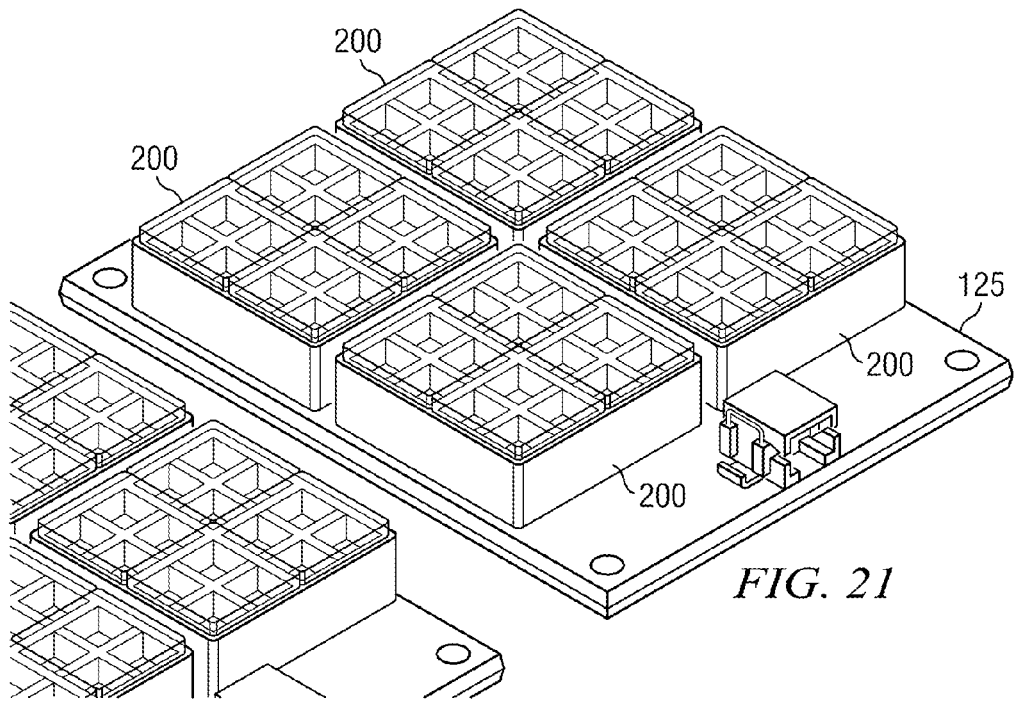
FIG. 21 is a diagrammatic representation of one embodiment of a multiple packaged arrays.
Figure 22:
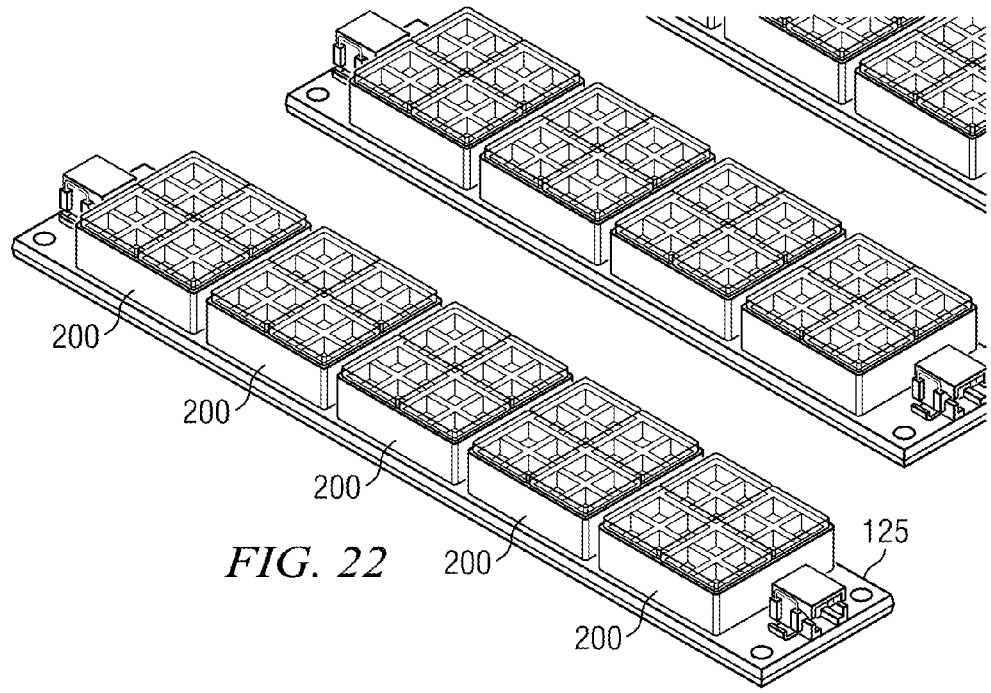
FIG. 22 is a diagrammatic representation of another embodiment of multiple packaged arrays.

According to one embodiment, lighting systems can be created with multiple packaged arrays. FIGS. 21 and 22 for example, illustrate multiple packaged arrays 200 mounted to a common submount 125. The number and layout of the packaged arrays 200 can be selected as needed or desired. The packaged arrays can be spaced so that the illumination patterns of the packaged arrays 200 overlap.

In the various embodiments described above, lens 105 can have a lens body 107 with an entrance face 150, an exit face 155 and sidewalls 157 (see FIG. 5). According to one embodiment, lens 105 can be constructed with the assumption that the LED or phosphor layer 145 will emit uniformly into entrance face 150. To conserve radiance so that all the light entering lens body 107 through entrance face 150 can be extracted through exit face 155, the area of exit face 155 is selected according to the etendue equation such that:

$$\frac{n_1^2 A_1 \Omega_1}{n_2^2 \Omega_2} = A_2 \qquad [\text{EQN. 1}]$$

Where $\Omega_1$=effective solid angle whereby light enters through entrance face 150; $\Omega_2$=effective solid angle whereby light leaves exit face 155; $A_1$=area of entrance face 150; $A_2$=area of exit face 155; $n_1$=refractive index of material of lens body 107; and $n_2$=refractive index of substance external to the exit face 155 of lens body 107 (e.g. air or other medium). In another embodiment, it can be assumed that $A_1$ is the size of the phosphor layer and that the phosphor layer acts as a uniform emitter over that area.

There are various models for determining effective solid angle including those described in U.S. patent application Ser. No. 11/906,194 entitled "LED System and Method" to Duong, et al. filed Oct. 1, 2007, issued as U.S. Pat. No. 7,789,531 on Sep. 7, 2010, U.S. patent application Ser. No. 11/906,219 entitled "LED System and Method" to Duong, et al., filed Oct. 1, 2007, issued as U.S. Pat. No. 8,087,960 on Jan. 31, 2012, and U.S. patent application Ser. No. 11/649,018 entitled "Separate Optical Device for Directing Light from an LED," filed Jan. 3, 2007, issued as U.S. Pat. No. 7,772,604 on Aug. 10, 2010, each of which is hereby fully incorporated by reference herein. Preferably, the area of exit face 155 is within 30% (plus or minus) of the minimum area necessary to conserve radiance.

The distance between exit face 155 and entrance face 150 can be selected so that all rays having a straight transmission path from entrance face 150 to exit face 155 are incident on exit face 155 at less than or equal to the critical angle at exit face 155 to prevent TIR at exit face 155. According to one embodiment, the minimum distance can be selected based on a limiting ray. The limiting ray is a ray that travels the longest straight line distance from entrance face 150 to exit face 155. For square or rectangular faces 150 and 155, the limiting ray will be a ray that travels from a corner of entrance face 150 to the opposite corner of exit face 155. Preferably, the distance between the entrance face 155 and exit face 155 is within 30% (plus or minus) of this minimum distance, though smaller distances can be used.

In addition, the sidewalls 157 can be shaped. Broadly speaking, the sidewall shapes are determined so that any ray incident on a sidewall is reflected to exit face 155 and is incident on exit face 155 at the critical angle or less (i.e., so that there is no loss due to internal reflection at exit face 155). While, in one embodiment, the sidewalls are shaped so that all rays that encounter the inner surface of the sidewalls experience total internal reflection to exit face 155 and are incident on exit face 155 at the critical angle or less, other sidewall shapes that allow some loss can be used.

Figure 23A:
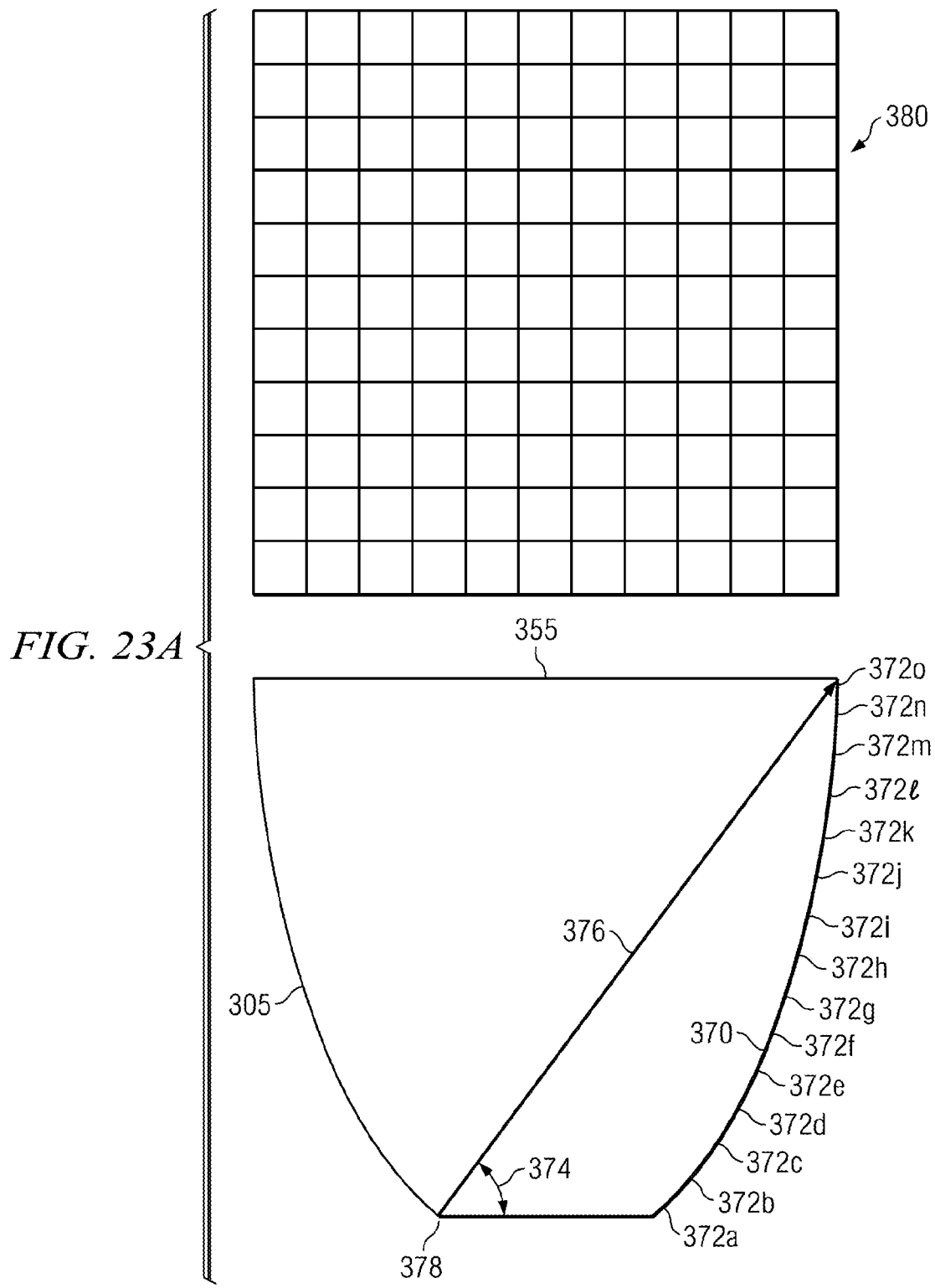
FIG. 23A is a diagrammatic representation of a cross-section of a model of a lens for determining sidewall shapes.

FIG. 23A is a diagrammatic representation of a cross-section of a model of lens 305 for determining sidewall shapes. Sidewall shapes can be determined using computer-aided design. A model of the sidewall can be created in a computer-aided design package and simulations run to determine an appropriate sidewall shape.

According to one embodiment, each sidewall can be divided into n facets with each facet being a planar section. For example, model sidewall 370 is made of fifteen planar facets 372a-372o rather than a continuous curve. The variables of each facet can be iteratively adjusted and the resulting distribution profiles analyzed until a satisfactory profile is achieved as described below. While the example of fifteen facets is used, each sidewall can be divided into any number of facets, including twenty or more facets.

Each facet can be analyzed with respect to reflecting a certain subset of rays within a lens. This area of interest can be defined as an "angular subtense." The angular subtense for a facet may be defined in terms of the angles of rays emanating from a predefined point. Preferably, the point selected is one that will give rays with the highest angles of incidence on the facet because such rays are the least likely to experience TIR at the facet. In a lens with a square shaped entrance area, for example, this will be a point on the opposite edge of the entrance.

According to one embodiment, for a selected $A_1$, $A_2$, and height, the maximum of angle 374 of any ray that will be incident on a given sidewall (e.g., sidewall 370) without being previously reflected by another sidewall can be determined. In this example, ray 376 emanating from point 378 establishes the maximum angle 374 for sidewall 370. If the maximum of angle 374 is 48 degrees and there are 15 facets for sidewall 370, each facet (assuming an even distribution of angular subtenses) will correspond to a 3.2 degree band of angle 374 (e.g., a first facet will be the area on which rays emanating from point 378 with an angle 17 of 0-3.2 degrees are incident, the second facet will be the area on which rays emanating 374 from point 378 with an angle 95 of 3.2-6.4 degrees are incident, and so on).

For each facet, the exit angle, facet size, tilt angle, or other parameter of the facet can be set so that all rays incident on the facet experience TIR and are reflected to exit surface 355 such that they are incident on exit surface 355 with an angle of incidence of less than or equal to the critical angle. Preferably, the sidewalls are also shaped so that a ray viewed in a cross-sectional view only hits a side wall once. However, there may be additional reflection from a sidewall out of plane of the section. For a full 3D analysis, a ray that strikes a first sidewall near a corner, may then bounce over to a second side wall, adjacent to the first, and from there to the exit face. A curve fit or other numerical analysis may be performed to create a curved sidewall shape that best fits the desired facets.

To optimize the variables for each facet, a simulated detector plane 380 can be established. Detector plane 380 can include x number of detectors to independently record incident power. A simulation of light passing through the lens 305 may be performed and the intensity and irradiance distributions as received by detector plane 380 analyzed. If the intensity and irradiance distributions are not satisfactory for a particular application, the angles and angular subtenses of the facets can be adjusted, a new curved surface generated and the simulation re-performed until a satisfactory intensity profile, exitance profile or other light output profile is reached. Additional detector planes can be analyzed to ensure that both near field and far field patterns are satisfactory. Alternatively, the simulation(s) can be performed using the facets rather than curved surfaces and the surface curves determined after a desired light output profile is reached. In yet another embodiment, the sidewalls can remain faceted and no curve be generated.

Figure 23B:
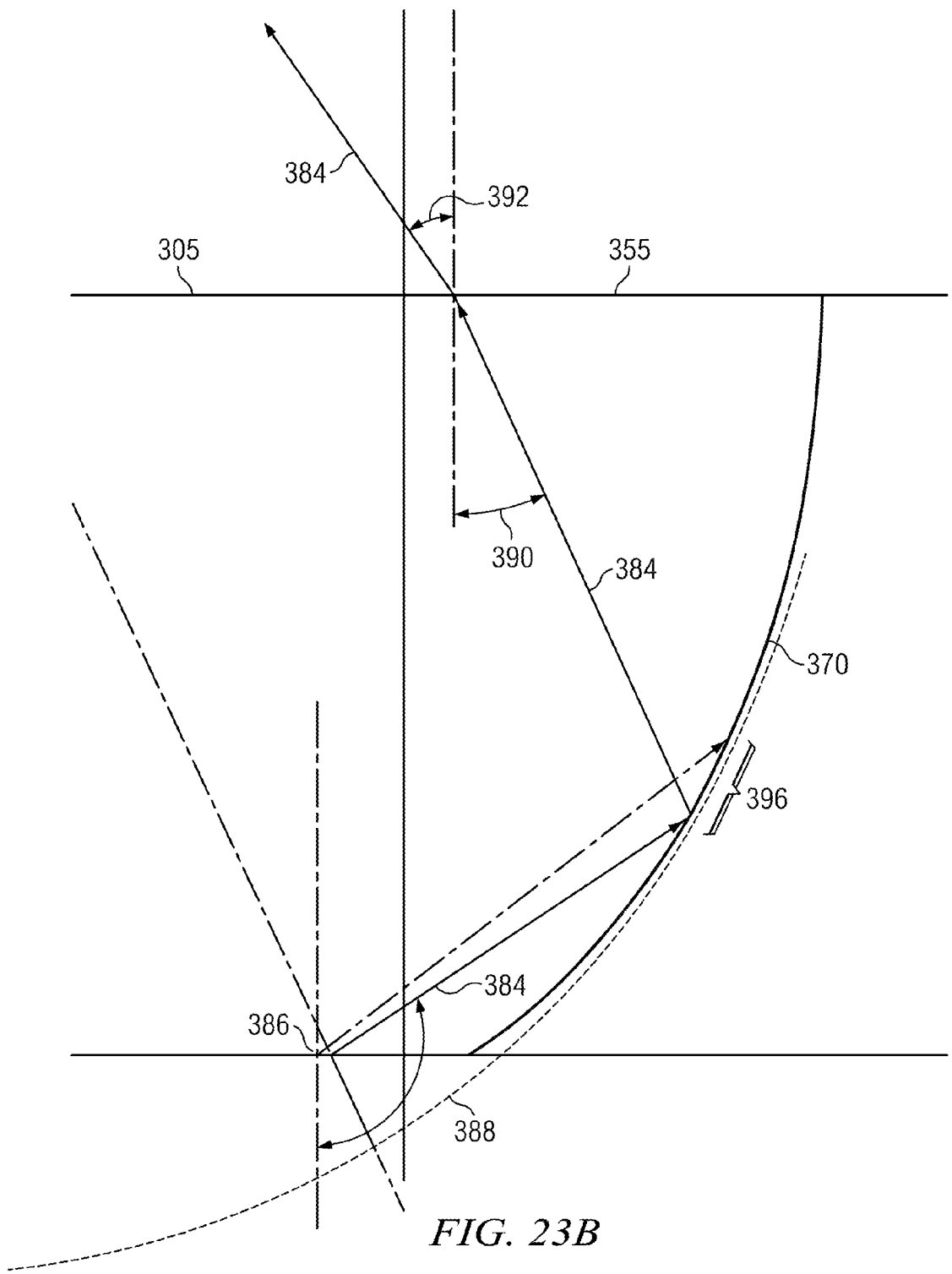
FIG. 23B is a diagrammatic representation of an embodiment of a portion of a sidewall of a lens.

According to another embodiment, the sidewall shape can be selected based on multiple parabolas with each planer facet representing a linear approximation of a portion of a parabola. For example, FIG. 23B is a diagrammatic representation of a portion of a modeled lens 305. In FIG. 23B, a hypothetical ray 384 is depicted that emanates from the focus 386 of a parabola 388 and intersects sidewall 370 such that it is reflected off sidewall 370 due to TIR and traverses the lens 305 to intersect exit plane 355 at an exit angle 390 that is less than the critical angle and exits lens 305 into air or other medium. As can be seen from FIG. 23B, at the transition from the lens 305 to air, ray 384 bends as described by Snell's law. Since the tangent point of the sidewall is determined from a parabola and because the ray incident and reflected off the sidewall is in the same medium, the ray will be parallel to the optical axis of the parabola. Thus, light is projected with a half-angle 392. Angular subtenses 396 defining the shape of sidewall 370 may be adjusted so that hypothetical ray 384 reflects off sidewall 370 such that ray 384 traverses exit face 355 with a desired exit angle 390 or projects light with a desired half angle 392.

In one embodiment, when fabricating a sidewall or calculating the angular subtense of a sidewall, finer subtenses may be used towards the base of the sidewall (i.e. nearer the phosphor layer) because the effects of the subtense are greater or more acute upon reflection near the base, and thus finer subtenses allow for a sidewall with better TIR properties, whereas further from the base, where the effects of the sub-tenses are less, the subtenses may be coarser. Thus, facets of a sidewall may be numerically greater towards the base of a lens body 107. In one embodiment, a sidewall may have 110 or more facets, with finer facets at the base of the sidewall, wherein the facets approximate one or more subtenses.

A facet can be a linear approximation of a portion of a parabola 388. The parameters of parabola 388 can be adjusted until the portion achieves the desired goal of all rays incident on the portion reflecting to exit face 355 such that the rays have an exit angle 390 of less than the critical angle. Each facet can be formed from a parabola having different parameters. Thus, a facet for one angular subtense may be based on a parabola while another facet is based on another parabola. A 110-facet sidewall, for example, may be based on 110 different parabolas.

Figure 23C:
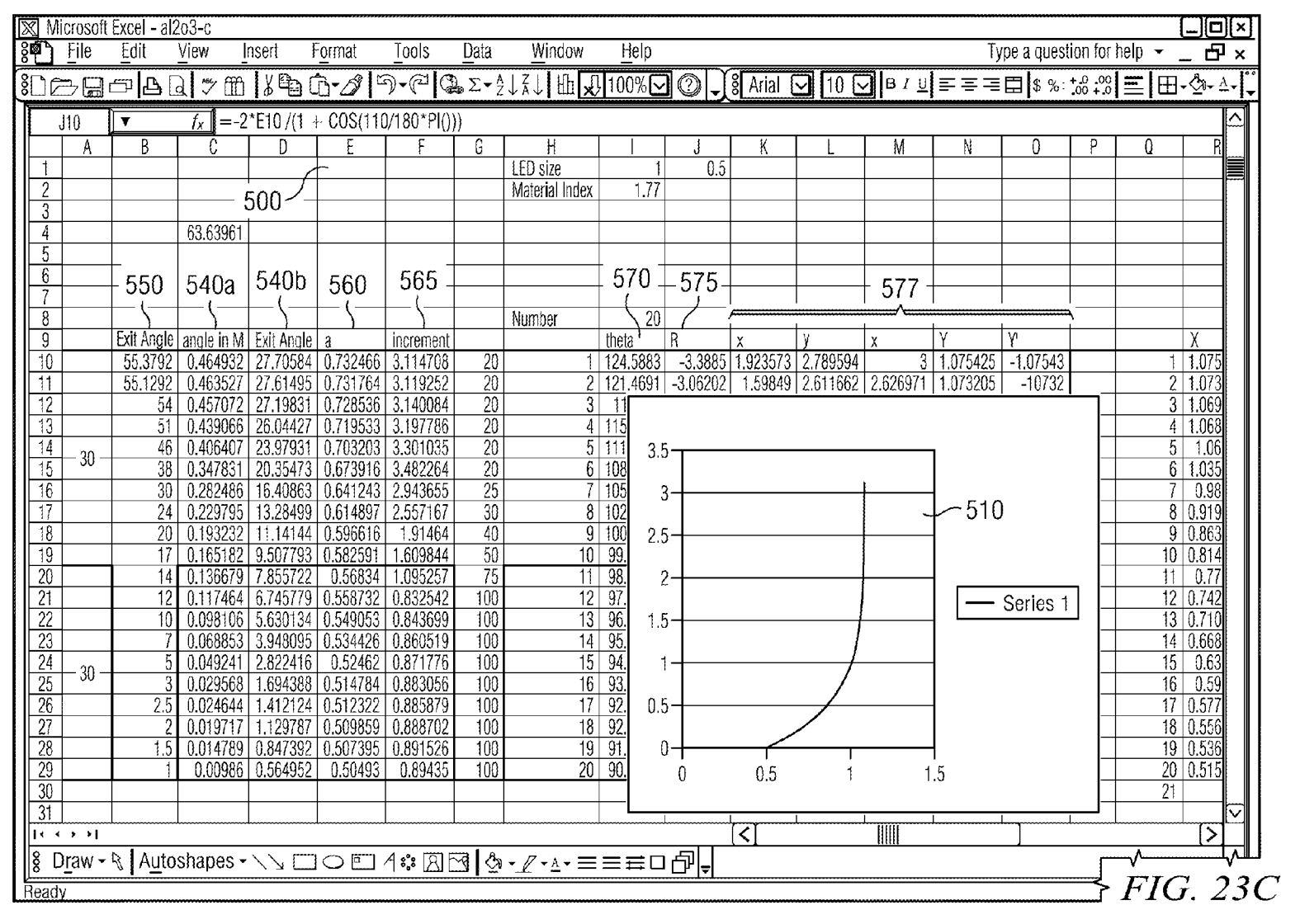

FIG. 23C depicts a spreadsheet 500 that can be utilized to design a sidewall shape as shown in graph 510 through the specification of angular subtenses. Projected half angle column 550 contains a plurality of angles that correspond to projected half angle 450 of FIG. 23B. Exit angle columns 540a (in radians) and 540b (in degrees) contain a plurality of exit angles corresponding to exit angle 392 of FIG. 23B. More particularly, all or a subset of the angles in column 540a may be angles that are less than the critical angle such that light rays intersecting the exit face at those angles traverse the exit face, exiting the shaped device. Columns 540*a* and 540*b* may be utilized to develop parabola focus column 560, containing a plurality of foci defining different parabolas. Angular subtense column 565 contains a plurality of angles (in radians) that define the limits of an angular subtense that can be used in conjunction with parabola focus column 560 to define the shape of a sidewall such that a ray reflects off the sidewall to exit the exit face at less than the critical angle. Using the values contained in parabola focus column 560 and angular subtense column 565, theta column 570 and radius column 575 can be developed wherein corresponding values in columns 570 and 575 correspond to points on a desired parabola for the angular subtense. In turn, theta column 570 and radius column 575 can be utilized to develop Cartesian coordinates for points on a sidewall (e.g. coordinate transformation columns 577) that approximate the parabola for the angular subtense.

For example, a user can specify the size of the entrance face of the shaped device (in this case marked LED size) and material index. The size can correspond to the size of the entrance face or emitting size of the phosphor layer. Using a hypothetical example of a size of 1, and an index of refraction of 1.77, a row in screen 500 can be completed as follows. The user can specify an exit angle in air (assuming air is the medium in which the lens will operate) in column 550. In the example of the first row, the user has selected 55.3792 degrees. The exit angle in the lens can be calculated as sin (55.3792/180*$\pi$)1.77 or 0.4649323 radians, column 540*a*. Column 540*b* can be calculated as a sin(0.4649323)/$\pi$*180=27.2058407. The focus of the parabola can be calculated as ½*(1+cos($\pi$/2−27.2058407/180*$\pi$)=0.732466. Angular subtense column 565 can be calculated based on the number in the next column (representing the relative size of a particular facet) as (90−27.7058047)/110=3.114708. Theta column 570 can be calculated using a selected number of facets (in this example 110). For example, in the first row theta is calculated as (90−27.7058407)+3.114708*110=124.5883. The radius of the parabola (column 575) for the first facet can be calculated as 2*0.732466/(1+cos(124.5883/180*$\pi$)). The contents of coordinate transformation columns 577 can be calculated as follows for the first row: x=−3.3885*cos(124.5883/180*$\pi$)= 1.923573; y=−3.3885*sin(124.5883/180*$\pi$)=2.789594; X=1.923573*cos(27.7058407/180*$\pi$)+2.789594*sin (27.7058407/180*$\pi$); Y=2.789594*cos(27.7058407/ 180*$\pi$)−1.923573*sin(27.7058407/180*$\pi$)−1(size)/ 2=1.075452 and Y'=−Y. The X, Y coordinates can then be used as data point inputs for a shape fitting chart in Excel. For example graph 510 is based on the data points in the X and Y columns (with the Y column values used as x-axis coordinates and the X column values used as y-axis coordinates in graph 510). In addition to the X and Y values a starting value can be set (e.g., 0.5 and 0). The shape from graph 510 can be entered into an optical design package and simulations run. If a simulation is unsatisfactory, the user can adjust the values until a satisfactory profile is achieved.

Figure 23D:
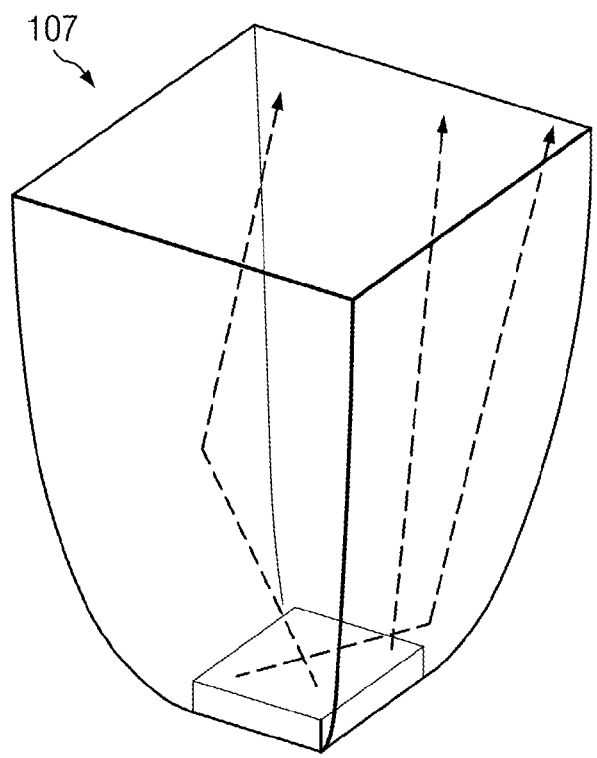
FIG. 23D is a diagrammatic representation of one embodiment of a lens with sidewalls shaped to cause TIR so that rays are reflected from the sidewalls to the exit surface.

When a satisfactory efficiency and intensity profile are achieved, a separate optical device can be formed having the specified parameters. An example of such a lens body 107 is shown in FIG. 23D which provides a diagrammatic representation of one embodiment of lens body 107 with sidewalls shaped to cause TIR so that rays are reflected from the sidewalls to the exit surface. The shape of each sidewall, in this embodiment, is a superposition of multiple contoured surfaces as defined by the various facets. While a curve fit is performed for ease of manufacturability, other embodiments can retain faceted sidewalls.

Figure 24:
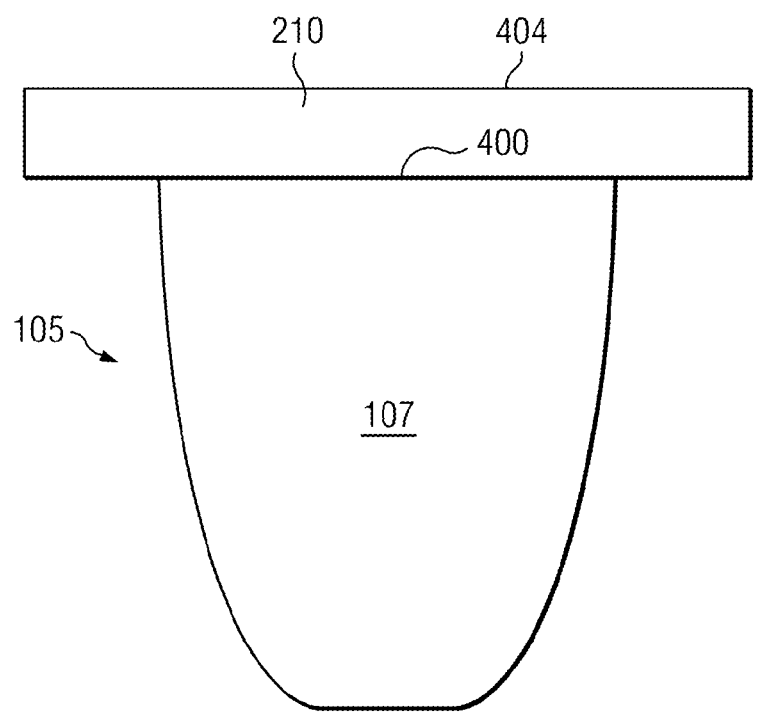
FIG. 24 is a diagrammatic representation illustrating one embodiment of an exit plane.

In the above example, it is assumed that the exit plane of light for purposes of shaping a lens is the exit face of the lens. However, as shown in the embodiment of FIG. 24, the exit plane of the shaped lens 105 may be the transition from shaped portion into another portion such as cover 210. While light will exit the lens assembly through the cover 210, the transition 400 between shaped lens body 107 and cover 210 can serve as the "exit face" for determining the shape of lens 105 as described above. If cover 210 has the same index of refraction as lens body 107, then the critical angle at the used in shaping lens 105 will be the same as if transition 400 were exposed to the outside medium because if light traverses transition 400 at less than or equal to the critical angle, it will also be incident on surface 404 at less than or equal to the critical angle. If the index of refraction of cover 210 is lower (or any adhesives or other layers between cover 210 and lens body 107), the critical angle at the exit face will be the critical angle based on the lower index of refraction.

The various boundary conditions, particularly the area of exit surface 155, can be determined for the separate optical device so that brightness can be conserved. The minimum area of exit surface 155 can be determined from EQN. 1 above, which relies on various effective solid angles. Typically, the effective solid angle of light is determined based on equations derived from sources that radiate as Lambertian emitters, but that are treated as points because the distances of interest are much greater than the size of the source. The observed Radiant Intensity (flux/steradian) of a Lambertian source varies with the angle to the normal of the source by the cosine of that angle. This occurs because although the radiance (flux/steradian/m2) remains the same in all directions, the effective area of the source decreases to zero as the observed angle increases to 90 degrees. Integration of this effect over a full hemisphere results in a projected solid angle value equal to $\pi$ steradians.

Figure 25:
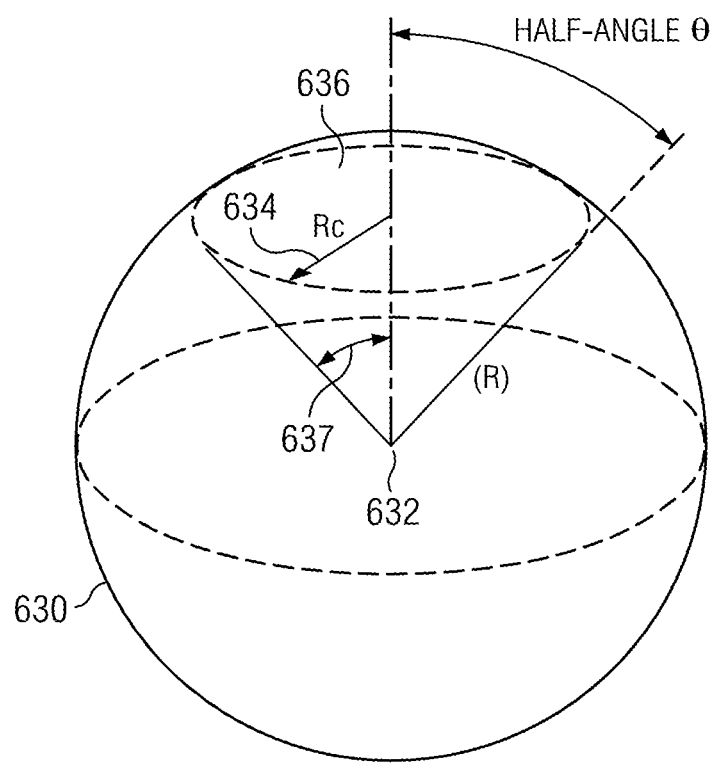
FIG. 25 is a diagrammatic representation of one embodiment for estimating effective solid angle.

Turning to FIG. 25, assume a sphere 630 of given radius (R) surrounds point source 632 (in this example, point source 632 approximates a Lambertian source at a significant distance). The projected area of a hemisphere of the sphere is $\pi R^2$ and the projected area of the full sphere is $2\pi R^2$. This model can be used to design lenses because the phosphors can be modeled as a Lambertian emitter such that from any point on a hypothetical hemisphere centered over the interface, a given point on the interface will have the same radiance. The area $A_3$ can be calculated as the flat, circular surface (e.g., surface 636) that is subtended by the beam solid angle of interest using a radius of the circle 634 ($R_c$) that is the distance from the normal ray to the intersection of the spherical surface. For a given half angle 637 of $\theta$ of the beam, $R_c$ is the product of R (the radius of the sphere) and the sine of the angle $\theta$, such that $$R_c = R*\operatorname{Sin}(\theta) \qquad \text{[EQN. 2]}$$

The area equals:

$$A_3 = \pi R_c^2 = \pi (R*\operatorname{Sin}(\theta))^2 \qquad \text{[EQN. 3A]}$$

The area $A_3$ is the projected area of the solid angle as it intersects the sphere. The area $A_3$ is divided by the projected area of the hemisphere ($A_h = \pi R^2$) and the quotient is multiplied by the projected solid angle of the full hemisphere (equal to $\pi$) to obtain the projected solid angle $\Omega$, such that:

$$\Omega = \pi\{\text{projected area of solid angle}\} / \quad\quad [\text{EQN. 3B}]$$
$$(\text{projected are of hemisphere})$$

$$\Omega = (\pi) * [\{\pi(R*\text{Sin}(\theta))^2\}/(\pi R^2)] \quad\quad [\text{EQN. 3C}]$$
$$= \pi * \text{Sin}^2(\theta) \quad\quad [\text{EQN. 4}]$$

For entrance face 150 of FIG. 5, for example, θ is 90 degrees, leading to a projected solid angle of $\pi*\text{Sin}^2(90)$, and for the desired half angle of 30 degrees, the projected solid angle is $\pi*\text{Sin}^2(30)$. Using these values for $\Omega_1$ and $\Omega_2$ for EQN. 1, $A_2$ can be determined for any half angle.

In the above example, the solid angle is determined using equations derived from a Lambertian source modeled as a point source. These equations do not consider the fact that light may enter a lens body 107 through an interface that may be square, rectangular, circular, oval or otherwise shaped. While the above-described method can give a good estimate of the solid angle, which can be later adjusted if necessary based on empirical or computer simulation testing, other methods of determining the effective solid angle can be used.

Figure 26A:
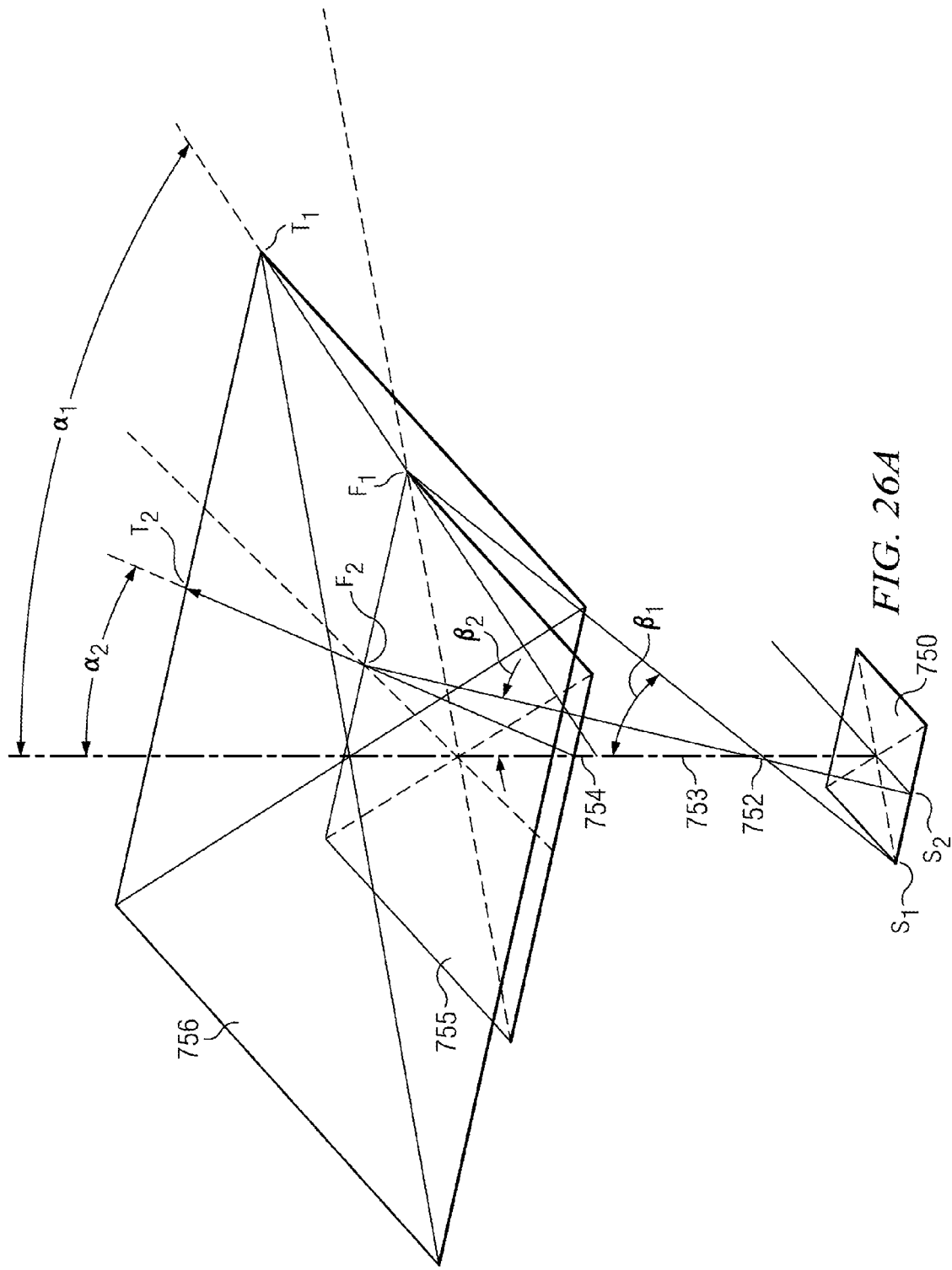
FIGS. 26A-26E are diagrammatic representations describing another embodiment for estimating effective solid angle.

FIGS. 26A-26E describe another method for determining the effective solid angle for a lens. FIG. 26A is a diagrammatic representation of one embodiment of an entrance face 750 and an exit face 755 of a lens 760 and a hypothetical target plane 756 onto which light is projected. FIG. 26A illustrates examples for a position of an effective source origin 752, central normal 753 and effective output origin 754. For purposes of further discussion, it is assumed that the center of interface 750 is at 0,0,0 in a Cartesian coordinate system. Target plane 756 represents the parameters of the resulting pattern (e.g., size and half angle used by other optics). According to one embodiment, the half angle at the diagonal (shown as $\alpha_1$ in FIG. 26B) is the starting point. For example, if the desired light at target plane 756 has a maximum half angle of 30 degrees, $\alpha_1$ for a square- or rectangular-faced separate optical device is 30 degrees. The half-angle within the separate optical device (labeled $\beta_1$ and also shown in FIG. 26C) can then be determined according to:

$$n_2 \text{Sin}(\alpha_1) = n_1 \text{Sin}(\beta_1) \quad\quad [\text{EQN. 5}]$$

where $n_1$ is the IOR of the lens 760;

$n_2$ is the IOR of the material (typically air) into which the light is projected from the lens 760;

$\alpha_1$ is the half angle at the exit face in the medium external to the lens 760;

$\beta_1$ is the desired half angle of lens 760.

Figure 26B:
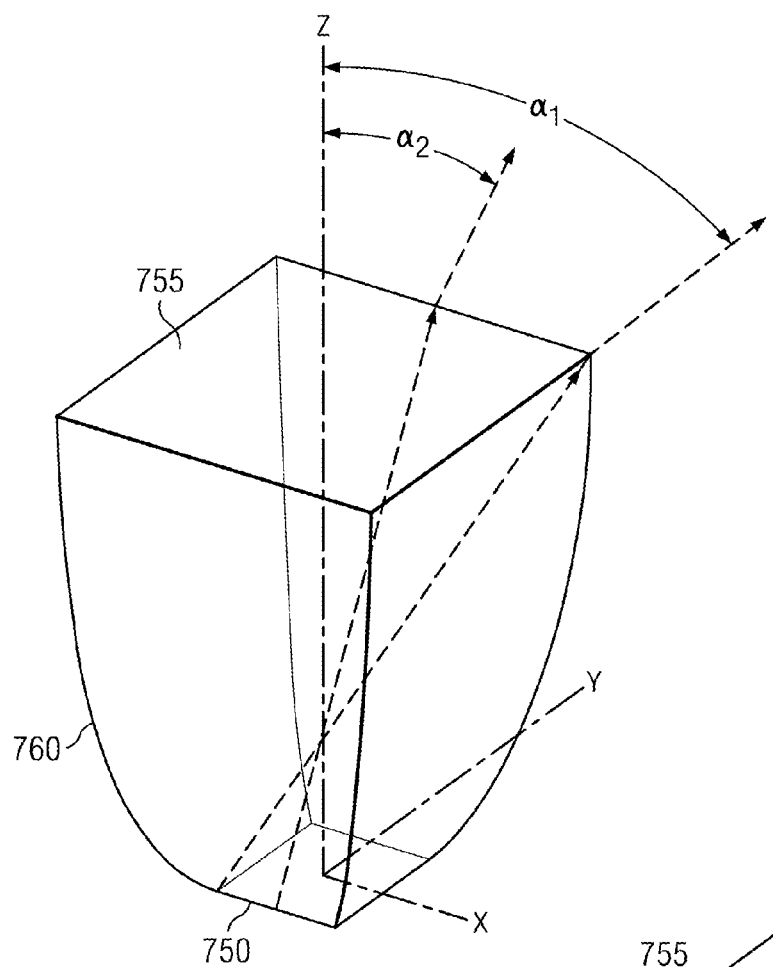

For example, if the desired half-angle α1 is 30 degrees, and a lens having an IOR of 1.5 is projecting into air having an IOR of 1, then $\beta_1=19.47$ degrees. A similar calculation can be performed for a ray projecting from a point on the long and short sides of entrance surface 150. For example, as shown in FIGS. 26B and 24C, $\alpha_2$ and $\beta_2$ can be determined for a ray traveling from the center of one edge on entrance surface 450 to the center of the opposite edge of exit surface 755. (The critical angle is the same at 19.47, but β1 is not the same as $\beta_2$. $\beta_2$ is determined by the geometry of the sides and the height to the optical device.)

Using the angles calculated, the location of an effective point source 757 can be determined. For a square entrance face 450, of length $l_1$, the effective point source will be located X=0, Y=0 and $$Z_{eps} = \frac{l_1}{\sqrt{2}*\tan(\beta_1)} \quad\quad [\text{EQN. 6}]$$

Where $Z_{eps}$ is the distance the effective point source is displaced from the emitting surface of the LED.

Figure 26C:
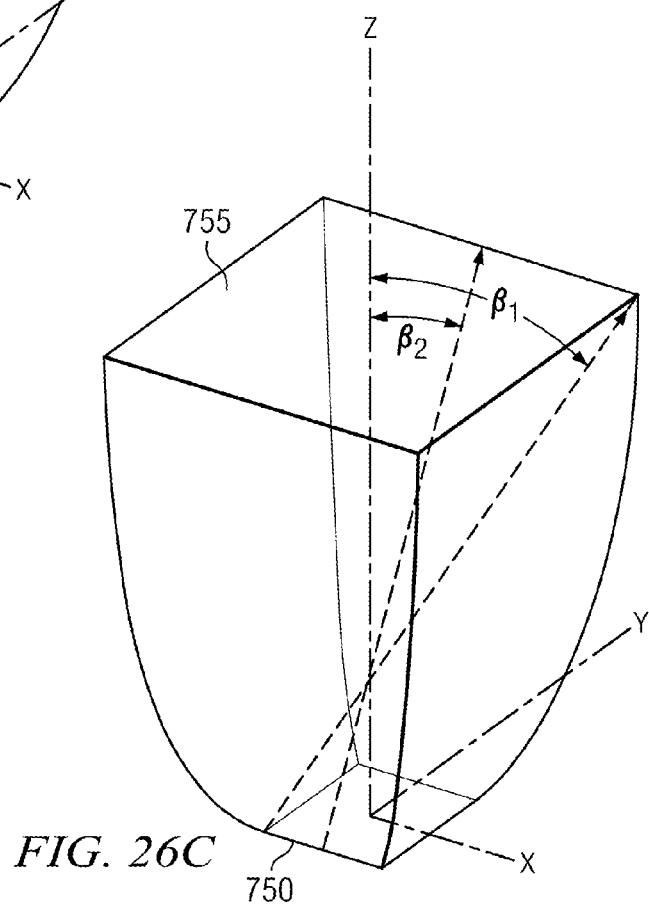

The X, Y and Z distances from the effective point source 757 to points $F_1$ and $F_2$ can be calculated assuming $F_1$ intersects a sphere of unity radius according to:

$$X_{F1}=\cos(\psi_1)\sin(\beta_1) \quad\quad [\text{EQN. 7}]$$
$$Y_{F1}=\sin(\psi_1)\sin(\beta_1) \quad\quad [\text{EQN. 8}]$$
$$Z_{F1}=\cos(\beta_1) \quad\quad [\text{EQN. 9}]$$
$$X_{F2}=\cos(\psi_2) \quad\quad [\text{EQN. 10}]$$
$$Y_{F2}=\sin(\beta_2) \quad\quad [\text{EQN. 11}]$$
$$Z_{F2}=\cos(\beta_2) \quad\quad [\text{EQN. 12}]$$

where $\psi_1$ is the angle of the diagonal ray in the X-Y plane (45 degrees for a square) and where $\psi_2=90$ degrees for a ray projecting from the middle of a side parallel to the X axis as shown in FIG. 26C. A similar methodology based on the geometries previously calculated can be used to determine other points (e.g., for example, the location of points $T_1$ and $T_2$ can be determined based on the location of points $F_1$ and $F_2$ and the desired half angle of light at target plane 756.)

Figure 26D:
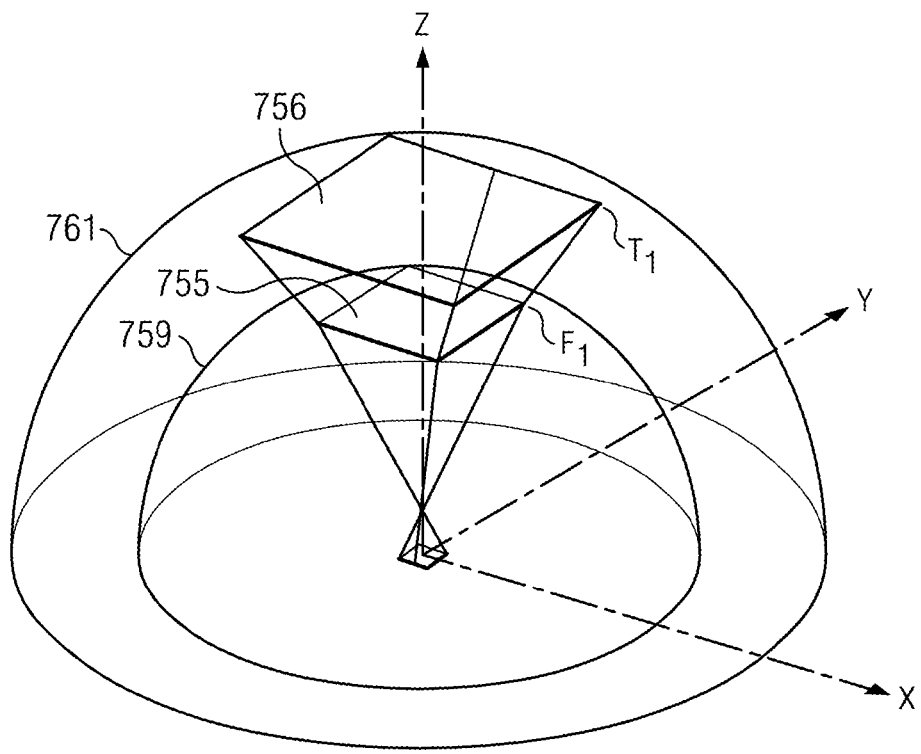
Figure 26E:
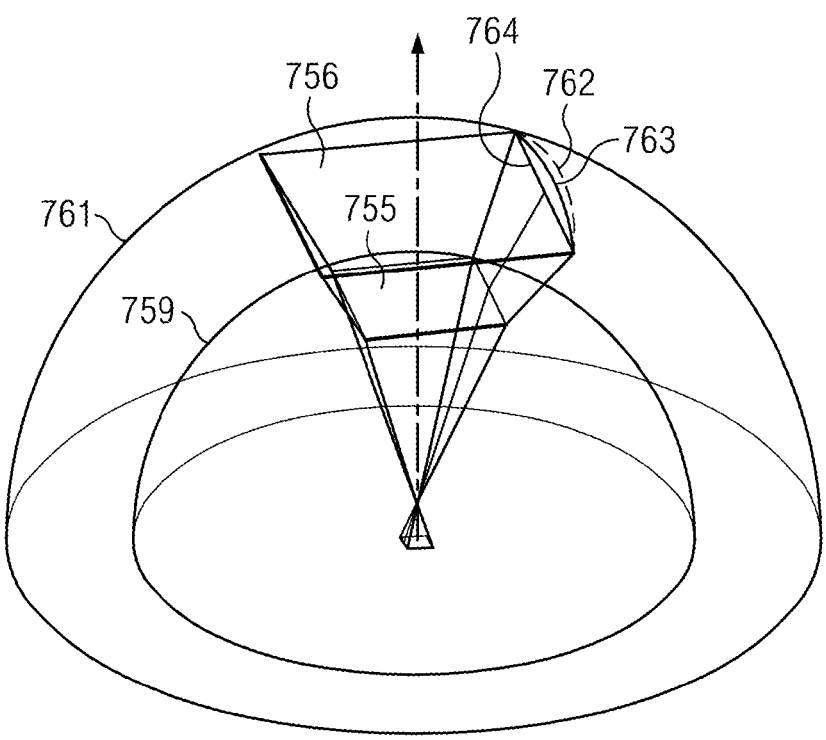

FIG. 26D illustrates the diagonal rays and one ray from the short side projected onto a sphere 759 for exit face 755 and sphere 761 for target plane 756. For exit face 755, the projection of the intersection of the edge rays at the sphere 759 onto the plane of the exit face 755, forms elliptical segments. Likewise, the projection of the diffracted exit rays at the edge of the target face intersect the sphere 761. FIG. 26E, for example, points out the circular intersection 763 of the rays lying in the plane formed by the edge 764 of target face 756 intersecting sphere 761, and the projection 762 of that intersection onto the target plane 756. By calculating the area of each of the elliptical segments surrounding the square of the target face, and adding that to the area of the target face we find the total projected area of the target face, the effective solid angle can be determined for the target plane using EQN. 3B. Similarly, by using sphere 159 and the elliptical segments formed thereon by rays, the effective solid angle for the optical device can be determined. For example, the total projected area is determined as described above and inserted as "projected area of desired solid angle" in equation 3B.

As one illustrative example, using the above method for a half-angle of 30 degrees with a square LED and output face yields an effective solid angle of 0.552 steradians to the target in air. By contrast, the use of the traditional circular projected area with a 30 degree half angle would yield an effective solid angle of 0.785 steradians. When these values are then used in EQUATION 1, for given IORs and flux, the traditional (circular) calculation yields a required exit area that is undersized by about 30%. If one were to design a system using this approach, the applicable physics (conservation of radiance) would reduce the light output by 30% over the optimum design. Conversely, using the corrected effective solid angle described above calculates an exit face area that will produce 42% more light output than is achievable with the circular calculation.

Although particular methods of determining the effective solid angle for a separate optical device are described above, any method known or developed in the art can be used. Alternatively, the minimum surface area to conserve brightness can be determined empirically. Moreover, while the minimum surface area calculations above assume 100% of the emitting entrance face of the separate optical device is receiving light, the phosphor layer may be disposed over only a part of the entrance surface such that a smaller entrance surface area is used. The calculations of the minimum area of the exit plane can be adjusted to account of the actual area receiving light. That is, the actual area of the phosphor layer can used as $A_1$.

The lens body 107 can be optimized for use with a phosphor layer 145 as a uniform emitter at the entrance face using modeling as described above. Lenses according to embodiments described herein can project light into a desired cone angle of 10-60 degrees with a theoretical efficiency of up to 96% in the lens body (meaning that 96% of the light received from the phosphors is emitted in the desired half-angles with 4% Fresnel loss). The efficiency can be 100% without Fresnel losses.

Embodiments of lenses can be shaped to achieve optimal efficiency in a small package size. In other embodiments, lenses can be shaped to achieve lower efficiencies, while still offering advantages over traditional systems. For example, in one embodiment, a lens can be shaped with an exit face that is at least 70% of the size necessary to conserve radiance for light entering the entrance face for a selected half angle of light emitted from the exit plane. The sidewalls can have a shape so that at least a majority of the light having a straight transmission path from the entrance face to the exit plane are incident on the exit plane at less than or equal to the critical angle. Even at only 60% or 70% efficiency, such an embodiment provides greater efficiency than many other technologies, while also producing uniform or near uniform intensity distributions (or other controlled distribution) at both near and far fields.

Lenses 105 can be constructed to emit light in a uniform distribution pattern with either a sharp or soft cut off (i.e., transition). Using an example of a lens emitting light with a 30 degree half angle, in one embodiment the lens can be shaped so that the uniform light profile extends through the entire 30 degrees and cuts off sharply. In another embodiment, lens can be shaped to produce a profile that is uniform in the 105 degree half angle but tapers off between 105 and 30 degrees. In one such embodiment, the size of the exit face can be selected to conserve radiance for the 30 degree half angle and the sidewalls shaped to create a uniform distribution profile in the 105 degree half angle. In some cases the height of lens 105 can be made shorter to allow some light to escape the sidewalls into the 30 degree half angle. By way of example, but not limitation, the lens geometries can be selected to emit 90% of the light in a uniform profile in the 30 degree half angle and emit the other 10% in the remaining area. Lenses that produce a light profile having softer edges rather than a sharp cut off can be manufactured with a height that is 30% of the minimum height discussed above and still achieve greater than 70% extraction efficiencies.

Lenses 105 can also be shaped to project a percentage of light into a selected beam angle while allowing other light to escape the sidewalls or fall outside of the selected angle. For example, lenses can be constructed such that greater than 50%, greater than 60%, greater than 70% to greater than 90% and approaching 100% of the light emitted by the lens falls within the full beam angle.

Figure 27:
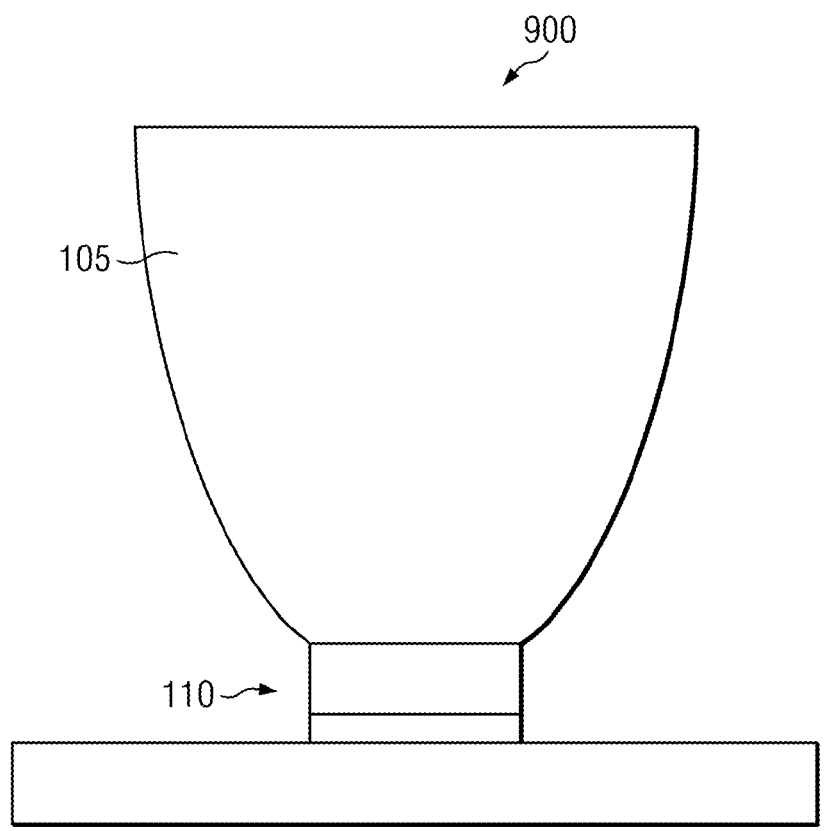
FIG. 27 is a diagrammatic representation of an embodiment of an optical system.

While the above embodiments discuss lenses that are separated from the LED by a gap, lenses can also be coupled to the LED without a gap. FIG. 27 is a diagrammatic representation of one embodiment of an optical system 900 including a lens 105 and an LED 110. While a single LED 110 is illustrated, multiple LEDs can be used with a single lens 105. Lens 105 can be a separate optical device shaped to emit a uniform distribution of light in a desired half angle with a desired percentage of light in beam.

Lens 105 can be coupled to LED 110 using a friction fit, optical cement or other coupling mechanism, whether mechanical, chemical, or other. Preferably, in the embodiment of FIG. 27, lens 105 is formed of a single, molded piece of dielectric, optically transmitting material with a single Index of Refraction ("IOR") "n", such as optically transparent silicone or acrylic, though other materials can be used. Furthermore, the IOR of lens 105 is preferably within 110% of the IOR of the substrate of LED 110 (and ideally, the IOR of separate lens 105 is equal to or greater than IOR of the substrate).

Figure 28:
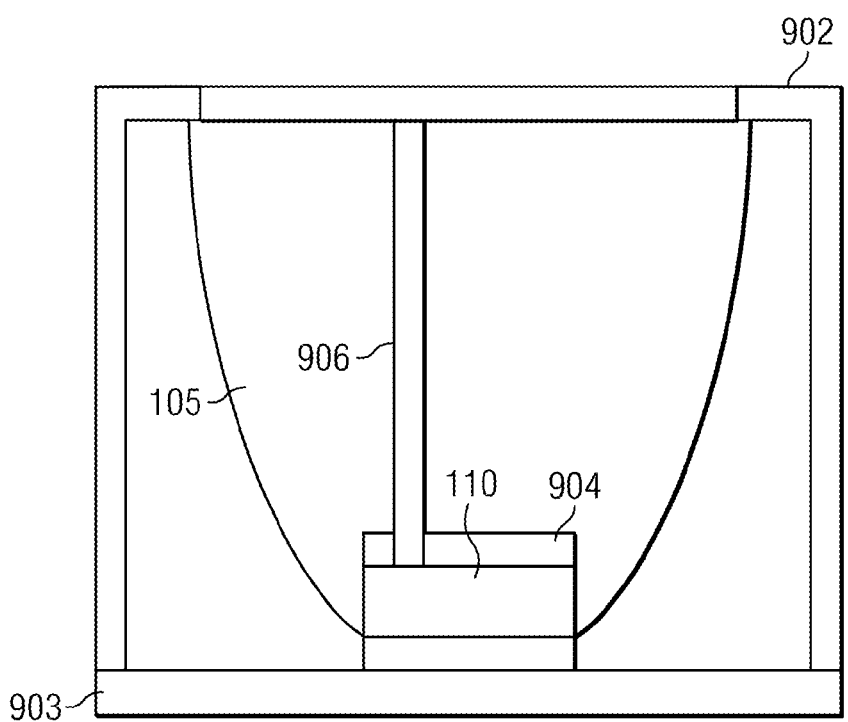
FIG. 28 is a diagrammatic representation of another embodiment of an optical system.

FIG. 28 is a diagrammatic representation of one embodiment of adding phosphor to an optical system. According to one embodiment, as illustrated in FIG. 28, an attachment device 902 or packaging can be used to secure lens 105 to submount 903, a circuit board or other structure. LED 110 or the entrance face of lens 105 can be coated with phosphor particles 904 between LED 110 and lens 105. A passage 906 can be used to introduce phosphor layer 904 and optical adhesive between lens 105 and LED 110. In another embodiment, lens 105 does not have passage 906 and phosphor layer 904 can be applied prior to coupling separate lens 105 to LED 110. According to one embodiment, phosphor layer 904 can include an optical bonding material loaded with phosphor particles. FIG. 28 also illustrates that lens 105 can surround LED 110 on the sides.

Figure 29:
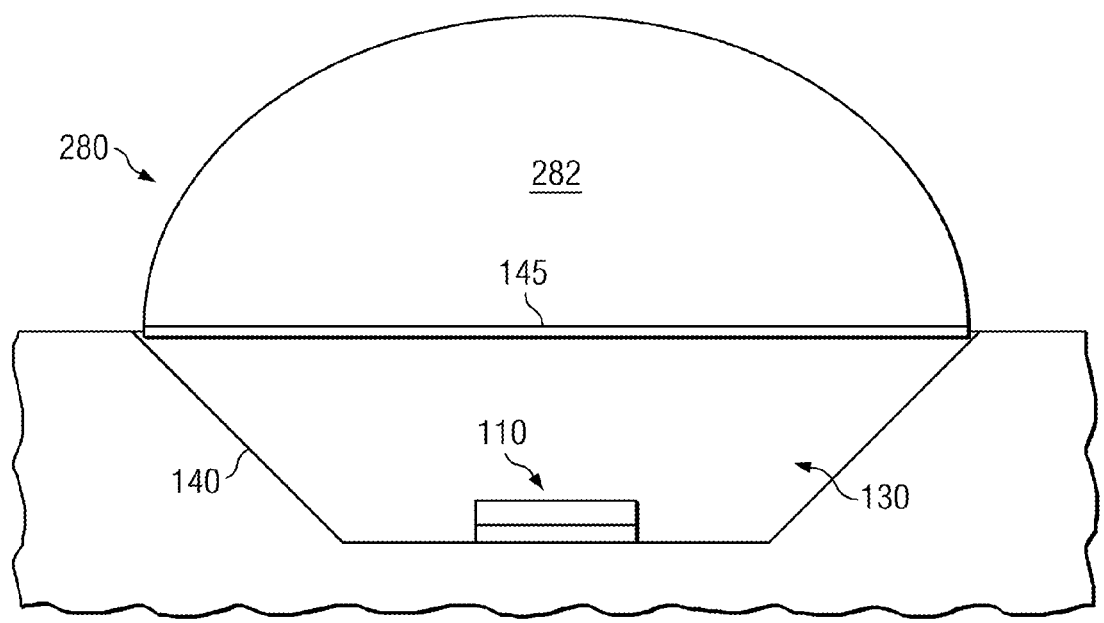
FIG. 29 is a diagrammatic representation of another embodiment of a lens with phosphor.

While a lens 105 that emits light in a uniform distribution in a desired half angle provides advantages for light blending, other embodiments of lenses can be used with phosphors. FIG. 29, for example, is a diagrammatic representation of one embodiment of a system in which a solid dome lens 280 is used. In the embodiment of FIG. 29, LED 110 is disposed in an LED cavity 130 having tapered sidewalls that act as a reflector 140. A layer of phosphor 145 covers the entrance face of the body 282 of dome lens 280. In an array, each LED can be provided with a separate cavity and dome lens 280. In another embodiment an array of LEDs may be placed in each cavity under a lens. Various embodiments of dome lenses can be used including dome lenses that greater in size than the cavity.

Figure 30:
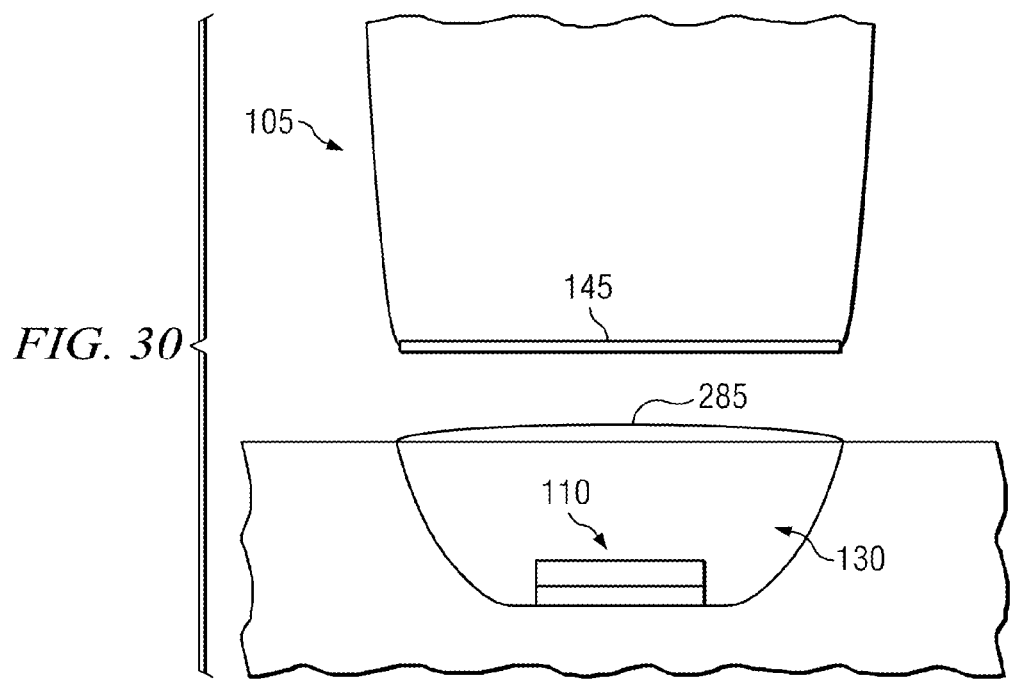
FIG. 30 is a diagrammatic representation of yet another embodiment of a lens with phosphor.

FIG. 30 is a diagrammatic representation of another embodiment of an optical system. In the embodiment of FIG. 30, encapsulant in the LED cavity 130 around LED 110 forms a convex portion 285. A lens 105 having a phosphor coating 145 can be adhered to convex portion 285 or to a housing or another structure. The optical system can be assembled such that there is no gap between lens 105 and convex portion 285. By way of example, but not limitation, lens 105 can include a concave entrance face. In another embodiment, an intermediate layer with a concave entrance face can be used. In an array, each LED can be provided with a separate cavity and dome lens 280.

Figure 31:
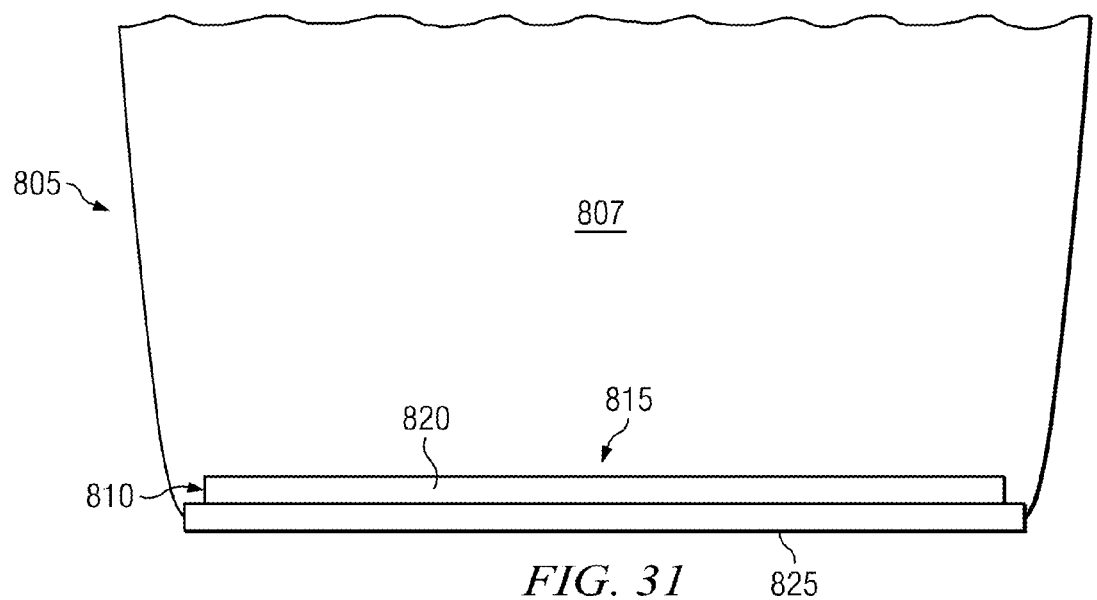
FIG. 31 is a diagrammatic representation of one embodiment of a lens with phosphor.
Figure 32:
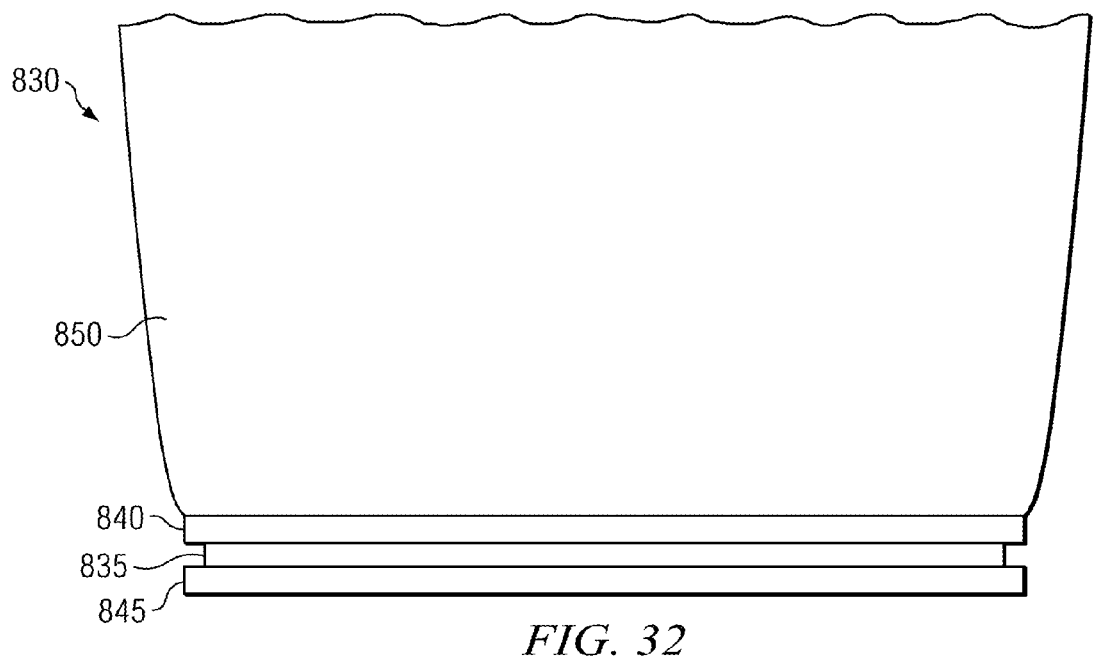
FIG. 32 is a diagrammatic representation of another embodiment of a lens with phosphor.

One of ordinary skill in the art would understand that phosphor can be disposed on a lens in a variety of manners. As discussed in conjunction with several embodiments above, phosphor can be applied as a coating to an entrance face or buffer layer. FIG. 31 is a diagrammatic representation of another embodiment. In the embodiment of FIG. 31, lens 805 includes a pocket 810 at the entrance face 815 to lens body 807. Phosphor particles 820 can be packed in the pocket and held in place with a binding material or with another layer 825 of material. Material 825 is preferably an optically transparent material that can withstand the temperatures of phosphor 820. FIG. 32 illustrates yet another embodiment of a lens 830 in which a layer of phosphor 835 is sandwiched between a buffer layer 840 and another layer of suitable material 845. The stack of layers can be coupled to a lens body 850. The layers of material can include glass, polycarbonate, silicone or other layers.

While this disclosure describes particular embodiments, it should be understood that the embodiments are illustrative and that the scope of the invention is not limited to these embodiments. Many variations, modifications, additions and improvements to the embodiments described above are possible. For example, the various ranges and dimensions provided are provided by way of example and LEDs and lenses may be operable within other ranges using other dimensions. It is contemplated that these variations, modifications, additions and improvements fall within the scope of the claims.

What is claimed is:

1. An optical system comprising:
   a base;
   a housing coupled to the base, the housing having a set of outer sidewalls;
   an array of LEDs disposed in the housing;
   a lens array optically coupled to the array of LEDs, the lens array further comprising a set of lenses disposed in the housing, wherein:
      each lens in the set of lenses is positioned to receive light from a corresponding LED and is separated from the corresponding LED by a gap;
      each lens in the set of lenses is configured to project a majority of light entering the lens in a selected half angle in a rectangular illumination pattern; and
      the lenses in the set of lenses are spaced so that illumination patterns from the lenses overlap to produce a rectangular overall illumination pattern in the selected half angle, the illumination pattern with an overlap area;
   a lens cover coupled to the housing; and
   an encapsulant disposed between each LED and corresponding lens.

2. The optical system of claim 1, wherein the housing comprises a set of lens cavity sidewalls and defines a set of lens cavities.

3. The optical system of claim 2, wherein the lens cavity sidewalls and outer sidewalls are transparent.

4. The optical system of claim 2, wherein the set of lens cavity sidewalls form a diffuse white reflector.

5. The optical system of claim 1, further comprising:
   a first phosphor disposed between a first LED and a corresponding first lens that down converts light from the first LED to red light;
   a second phosphor disposed between a second LED and a corresponding second lens that down converts light from the second LED to green light.

6. The optical system of claim 5, further comprising a third phosphor disposed between a third LED and a corresponding third lens that down converts light from the third LED to blue light.

7. The optical system of claim 1, wherein the overlap area has a substantially uniform color profile.

8. The optical system of claim 7, wherein the overall illumination pattern comprises a non-uniform border area corresponding to a width of one or more rows of lenses.

9. The optical system of claim 8, wherein:
   the overlap area size is dependent on a lens to target surface distance; and
   the border area width is independent of the lens to target surface distance.

10. The optical system of claim 9, wherein a percentage of the overall illumination pattern having the uniform color profile approaches 100% as the lens to target surface distance increases.

11. The optical system of claim 1, wherein each lens in the set of lenses is configured such that at least 50%-95% of light emitted by the lens is emitted in the selected half angle.

12. The optical system of claim 11, wherein the selected half angle is 10-60 degrees.

13. The optical system of claim 1, wherein the housing defines a set of LED cavities and each LED in the array of LEDs is disposed in a separate cavity.

14. The optical system of claim 1, wherein the set of lenses and array of LEDs are packaged so that each lens only receives light from the corresponding LED and does not receive light from any other LED in the array of LEDs.

15. The optical system of claim 1, wherein the lens cover is integrated with the set of lenses.

16. The optical system of claim 1, wherein the rectangular overall illumination pattern is square.

17. The optical system of claim 1, wherein the optical system comprises a white light unit.

* * * * *